(12) United States Patent
Kim et al.

(10) Patent No.: US 10,784,266 B2
(45) Date of Patent: Sep. 22, 2020

(54) INTEGRATED CIRCUIT DEVICE

(71) Applicant: Samsung Electronics Co., Ltd., Suwon-si (KR)

(72) Inventors: Dong-oh Kim, Daegu (KR); Ki-seok Lee, Hwaseong-si (KR); Chan-sic Yoon, Anyang-si (KR); Je-min Park, Suwon-si (KR); Woo-song Ahn, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/181,510

(22) Filed: Nov. 6, 2018

(65) Prior Publication Data
US 2019/0355728 A1    Nov. 21, 2019

(30) Foreign Application Priority Data
May 15, 2018 (KR) .................. 10-2018-0055654

(51) Int. Cl.
*H01L 27/108* (2006.01)
*H01L 23/538* (2006.01)
*H01L 29/49* (2006.01)
*H01L 21/265* (2006.01)
*H01L 21/28* (2006.01)
(Continued)

(52) U.S. Cl.
CPC ...... *H01L 27/10897* (2013.01); *H01L 23/538* (2013.01); *H01L 27/10814* (2013.01); *H01L 27/10823* (2013.01); *H01L 27/10852* (2013.01); *H01L 27/10876* (2013.01); *H01L 27/10894* (2013.01); *H01L 29/4958* (2013.01); *H01L 29/4966* (2013.01); *H01L 21/26513* (2013.01); *H01L 21/28079* (2013.01);
(Continued)

(58) Field of Classification Search
CPC ................................. H01L 27/10897
See application file for complete search history.

(56) References Cited
U.S. PATENT DOCUMENTS 7,928,504 B2    4/2011   Choi
8,604,558 B2   12/2013   Back et al.
(Continued)

FOREIGN PATENT DOCUMENTS
KR    10-2015-0073605 A    7/2015

OTHER PUBLICATIONS

First Office Action from Singapore Patent Office for application SG 10201810759X, dated Jun. 11, 2019.
(Continued)

*Primary Examiner* — Grant S Withers
(74) *Attorney, Agent, or Firm* — Muir Patent Law, PLLC

(57) ABSTRACT

An integrated circuit device includes: a substrate having a cell array area, which includes a first active region, and a peripheral circuit area, which includes a second active region; a direct contact connected to the first active region in the cell array area; a bit line structure connected to the direct contact in the cell array area; and a peripheral circuit gate structure on the second active region in the peripheral circuit area, wherein the peripheral circuit gate structure includes two doped semiconductor layers each being doped with a charge carrier impurity having different doping concentrations from each other.

20 Claims, 42 Drawing Sheets

(51) Int. Cl.
    *H01L 21/285*  (2006.01)
    *H01L 21/308*  (2006.01)
    *H01L 29/66*   (2006.01)
(52) U.S. Cl.
    CPC .. *H01L 21/28088* (2013.01); *H01L 21/28556* (2013.01); *H01L 21/3081* (2013.01); *H01L 29/6656* (2013.01)

(56) References Cited

U.S. PATENT DOCUMENTS

| | | | |
|---|---|---|---|
| 8,648,423 | B2 | 2/2014 | Han et al. |
| 8,906,763 | B2 | 12/2014 | Park et al. |
| 9,583,440 | B2 | 2/2017 | Kim et al. |
| 9,761,593 | B2 | 9/2017 | Shin |
| 9,786,600 | B2 | 10/2017 | Cho et al. |
| 2005/0260862 | A1 | 11/2005 | Komatsu et al. |
| 2008/0315319 | A1 | 12/2008 | Asano et al. |
| 2011/0156119 | A1 | 6/2011 | Chung et al. |
| 2011/0263089 | A1 | 10/2011 | Park |
| 2012/0012911 | A1 | 1/2012 | Jeong |
| 2012/0086084 | A1 | 4/2012 | Kikuchi |
| 2015/0179658 | A1 | 6/2015 | Lee et al. |
| 2015/0294934 | A1 | 10/2015 | Kadoya |
| 2015/0372137 | A1 | 12/2015 | Sakogawa |
| 2016/0118331 | A1 | 4/2016 | Kim et al. |
| 2016/0163637 | A1 | 6/2016 | Jung et al. |
| 2016/0372359 | A1 | 12/2016 | Kong et al. |
| 2019/0386010 | A1* | 12/2019 | Tomoyama ....... H01L 27/10855 |

OTHER PUBLICATIONS

Partial Search Report from the European Patent Office for application EP 18213107.8, dated Jun. 25, 2019.
European Search Report dated Nov. 25, 2019 for Application No. EP 18213107.8.

* cited by examiner

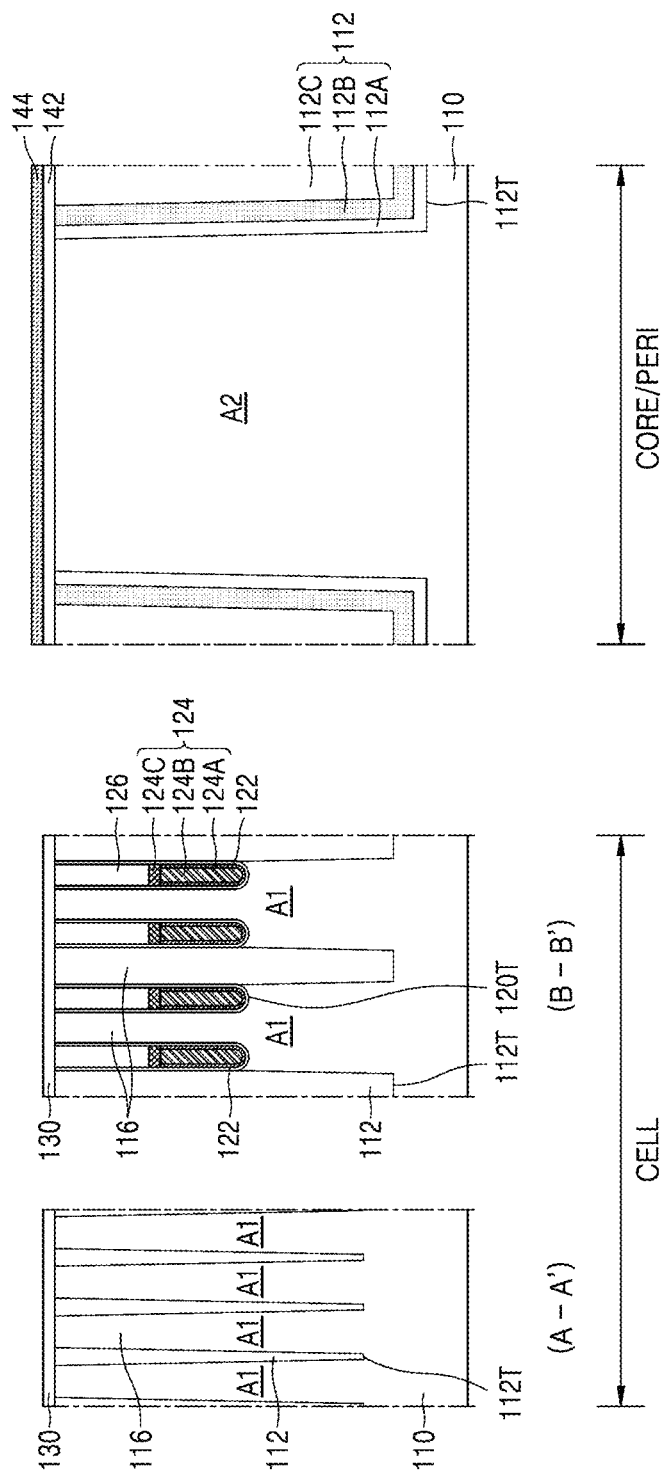

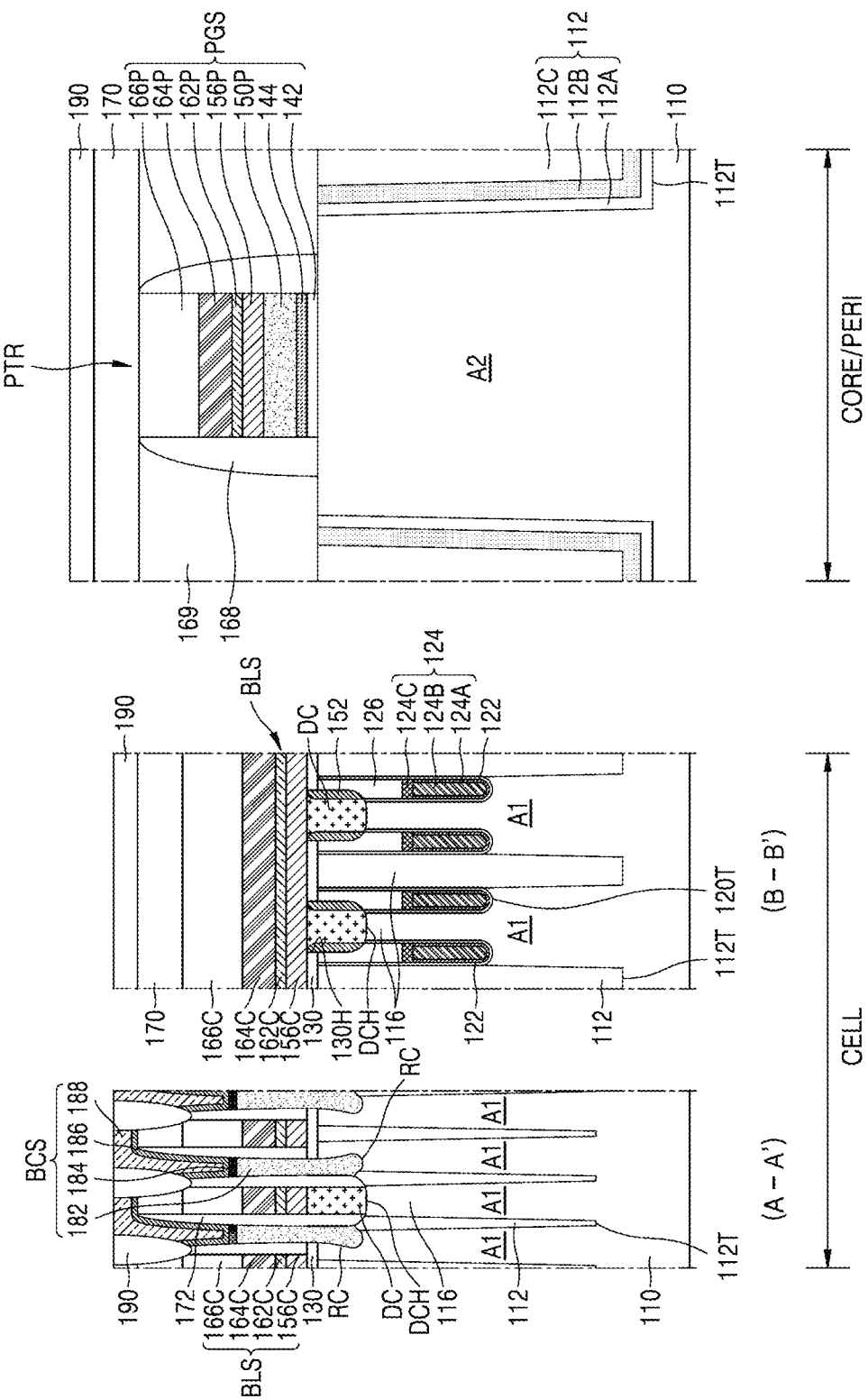

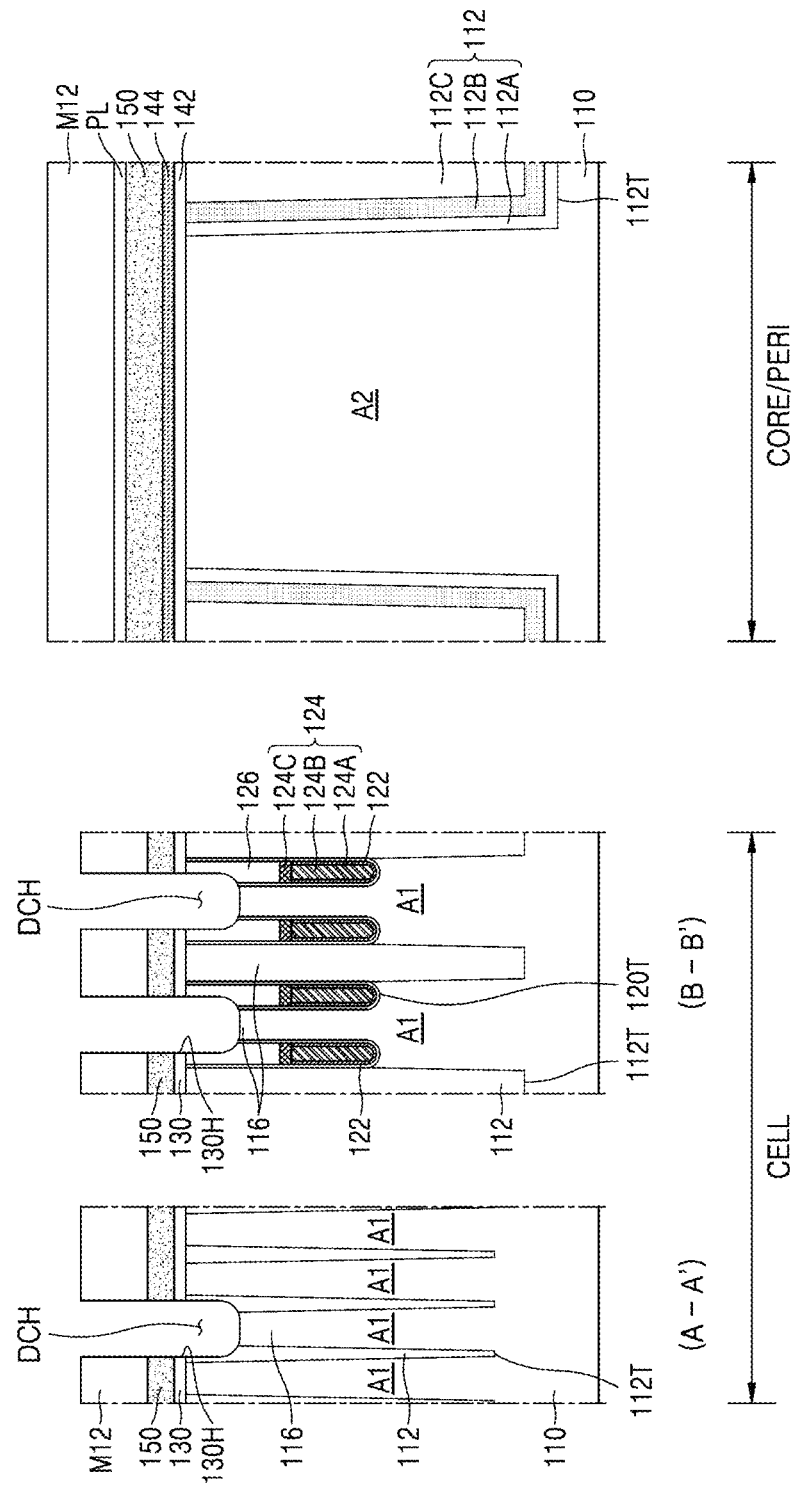

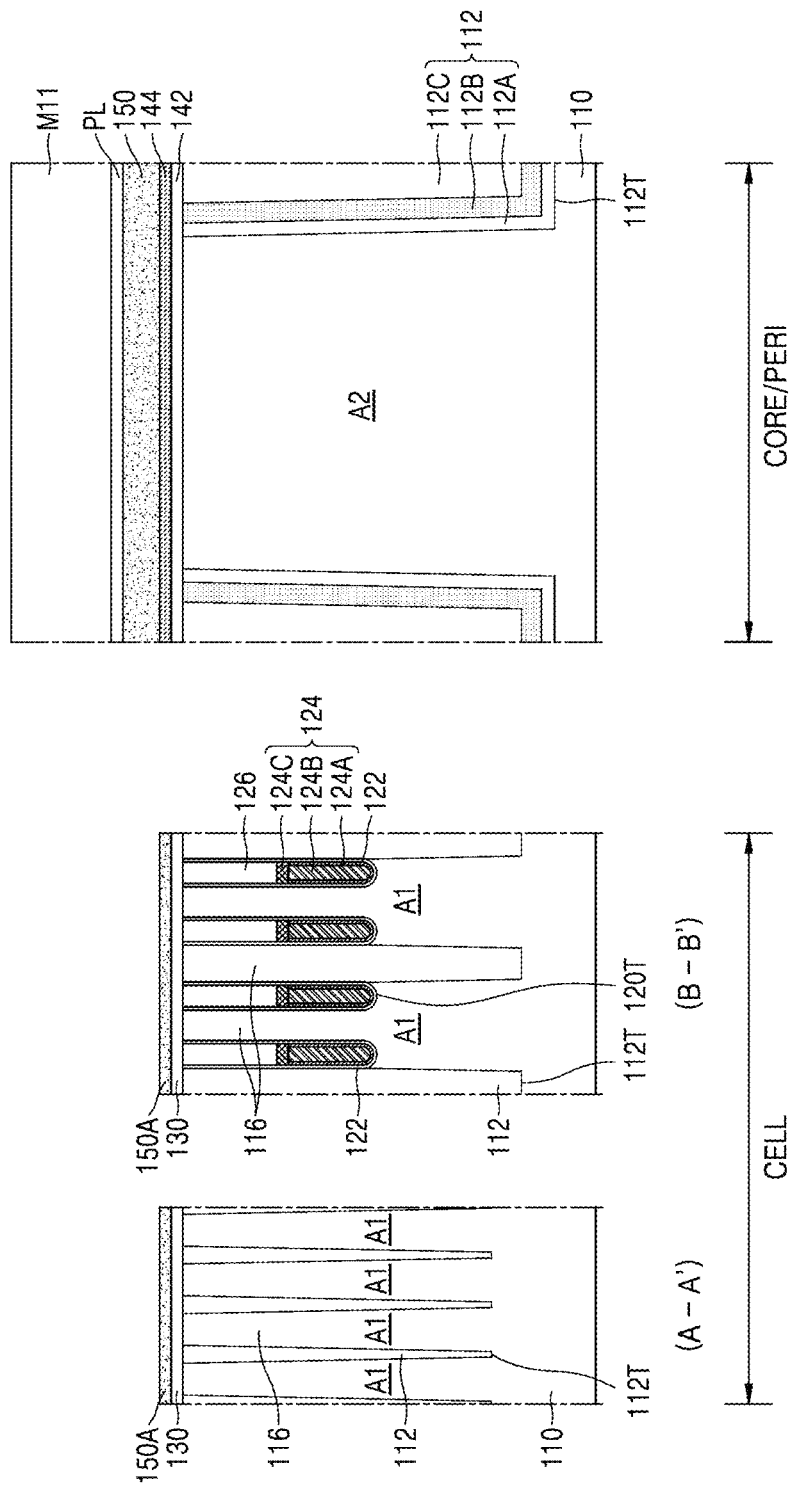

INTEGRATED CIRCUIT DEVICE

CROSS-REFERENCE TO RELATED APPLICATIONS

This application claims the benefit of priority under 35 U.S.C. § 119 to Korean Patent Application No. 10-2018-0055654, filed on May 15, 2018, in the Korean Intellectual Property Office, the disclosure of which is incorporated herein in its entirety by reference.

BACKGROUND

The inventive concept according to exemplary embodiments relates to an integrated circuit device, and more particularly, to an integrated circuit device including a conductive contact plug and a conductive line, which are connected to each other.

As integrated circuit devices have been rapidly down-scaled recently, since gaps between conductive lines are narrowed and areas occupied by contact plugs connected to the conductive lines are gradually reduced, it may be difficult to secure sufficient contact areas. Therefore, there is a need to develop a technique for implementing an integrated circuit device in which contact plugs arranged in narrow spaces having relatively high aspect ratios and conductive lines formed thereon having stable and reliable structures.

SUMMARY

The inventive concept according to exemplary embodiments provides an integrated circuit device in which contact plugs and conductive lines have stable and reliable structures even though the area of device regions is reduced due to down-scaling of semiconductor devices.

According to an aspect of the inventive concept, there is provided an integrated circuit device including: a substrate having a cell array area and a peripheral circuit area, the cell array area including a first active region, and the peripheral circuit area including a second active region; a direct contact connected to the first active region in the cell array area; a bit line structure connected to the direct contact in the cell array area; and a peripheral circuit gate structure on the second active region in the peripheral circuit area, wherein the peripheral circuit gate structure includes two doped semiconductor layers each being doped with a charge carrier impurity having different doping concentrations from each other.

According to another aspect of the inventive concept, there is provided an integrated circuit device including: a substrate having a cell array area and a peripheral circuit area, the cell array area including a plurality of first active regions spaced apart from each other, and the peripheral circuit area including a second active region; a plurality of direct contacts each connected to a corresponding one of the plurality of first active regions in the cell array area; a plurality of bit line structures extending parallel to each other in a first direction in the cell array area, each of the plurality of bit line structures is connected to a corresponding one of the plurality of direct contacts; and a peripheral circuit gate structure on the second active region in the peripheral circuit area, wherein the peripheral circuit gate structure includes two doped semiconductor layers each being doped with a charge carrier impurity and having different doping concentrations from each other, and wherein each of the plurality of direct contacts includes a contact semiconductor layer having a doping concentration that is lower than a doping concentration of at least one of the two doped semiconductor layers.

According to yet another aspect of the inventive concept, there is provided an integrated circuit device including: a substrate having a cell array area and a peripheral circuit area, the cell array area including a first active region, and the peripheral circuit area including a second active region; a direct contact connected to the first active region in the cell array area and including a doped contact semiconductor layer doped with a charge carrier impurity that has a first doping concentration; a bit line structure over the substrate in the cell array area, the bit line structure including a bit line semiconductor layer that contacts a top surface of the direct contact and has a doping concentration higher than the first doping concentration; a direct contact spacer contacting a first sidewall portion of a sidewall of the direct contact and including an undoped semiconductor having no charge carrier impurity doped thereon, the first sidewall portion being between the substrate and the bit line structure; an insulating spacer contacting a second sidewall portion of the sidewall of the direct contact and covering a sidewall of the bit line structure; and a peripheral circuit gate structure on the second active region in the peripheral circuit area, wherein the peripheral circuit gate structure includes a first gate semiconductor layer and a second gate semiconductor layer, the first gate semiconductor layer having a doping concentration that is equal to or higher than the first doping concentration, and the second gate semiconductor layer having a doping concentration that is higher than the first doping concentration.

BRIEF DESCRIPTION OF THE DRAWINGS

Embodiments of the inventive concept will be more clearly understood from the following detailed description taken in conjunction with the accompanying drawings in which:

FIGS. 9A to 9E are cross-sectional views illustrating sequential processes of a method of fabricating an integrated circuit device, according to other embodiments of the inventive concept;

FIGS. 10A to 10C are cross-sectional views illustrating sequential processes of a method of fabricating an integrated circuit device, according to yet other embodiments of the inventive concept;

DETAILED DESCRIPTION OF THE EMBODIMENTS

Figure 1:
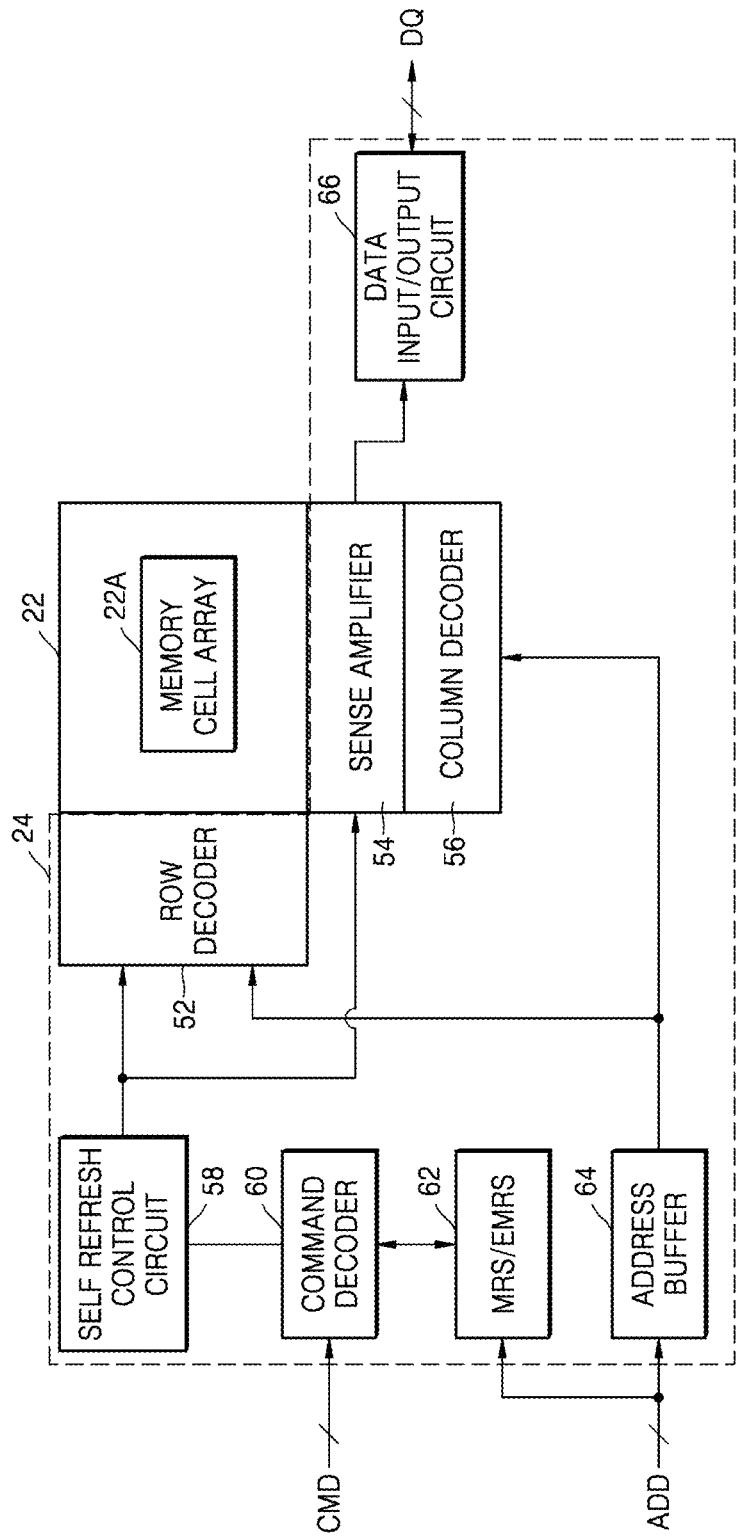
FIG. 1 is a block diagram illustrating an example of a configuration of an integrated circuit device including a DRAM device.

Hereinafter, embodiments of the inventive concept will be described in detail with reference to the accompanying drawings. Like components will be denoted by like reference numerals throughout the specification, and repeated descriptions thereof will be omitted.

FIG. 1 is a block diagram illustrating an example of a configuration of an integrated circuit device 10 including a DRAM device.

Referring to FIG. 1, in the integrated circuit device 10, a first area 22 may be a memory cell area of the DRAM device, and a second area 24 may be a peripheral circuit area of the DRAM device. The first area 22 may include a memory cell array 22A. In the memory cell array 22A, a plurality of memory cells for storing data may be arranged in a row direction and in a column direction.

The second area 24 may include a row decoder 52, a sense amplifier 54, a column decoder 56, a self refresh control circuit 58, a command decoder 60, a mode register set/extended mode register set (MRS/EMRS) circuit 62, an address buffer 64, and a data input/output circuit 66.

The sense amplifier 54 may sense and amplify data of a memory cell and may store data in the memory cell. The sense amplifier 54 may be implemented as a cross-coupled amplifier connected between a bit line and a complementary bit line, which are included in the memory cell array 22A.

Data DQ input through the data input/output circuit 66 may be written to the memory cell array 22A based on an address signal ADD, and the data DQ read from the memory cell array 22A based on the address signal ADD may be output to a device (not shown) external to the integrated circuit device 10 through the data input/output circuit 66. To designate a memory cell which data is to be written to or read from, the address signal ADD may be input to the address buffer 64. The address buffer 64 may temporarily store the address signal ADD input from a device (not shown) external to the integrated circuit device 10.

The row decoder 52 may decode a row address out of the address signal ADD output from the address buffer 64 in order to designate a word line connected to a memory cell which data is to be input to or output from. For example, in a data write or read mode, the row decoder 52 may decode a row address output from the address buffer 64, thereby enabling a corresponding word line. In addition, in a self refresh mode, the row decoder 52 may decode a row address generated from an address counter, thereby enabling a corresponding word line.

The column decoder 56 may decode a column address out of the address signal ADD output from the address buffer 64 in order to designate a bit line connected to a memory cell which data is to be input to or output from. The memory cell array 22A may output data from the memory cell designated by the row and column addresses or write data to the memory cell.

The command decoder 60 may receive command signals CMD applied from a device (not shown) external to the integrated circuit device 10, and may decode these signals to internally generate decoded command signals, for example, a self refresh entry command or self refresh exit command.

The MRS/EMRS circuit 62 may set an internal mode register in response to the address signal ADD and an MRS/EMRS command for designating an operation mode of the integrated circuit device 10.

The integrated circuit device 10 may further include a clock circuit for generating clock signals, a power supply circuit receiving a power supply voltage applied from a device (not shown) external to the integrated circuit device 10 and generating or distributing internal voltages, or the like.

The self refresh control circuit 58 may control a self refresh operation of the integrated circuit device 10 in response to a command output from the command decoder 60. The command decoder 60 may include an address counter, a timer, and a core voltage generator. The address counter may generate a row address for designating a row address, which is a target of self refresh, and apply the row address to the row decoder 52, in response to a self refresh entry command output from the command decoder 60. The address counter may stop a counting operation in response to a self refresh exit command output from the command decoder 60.

Figure 2:
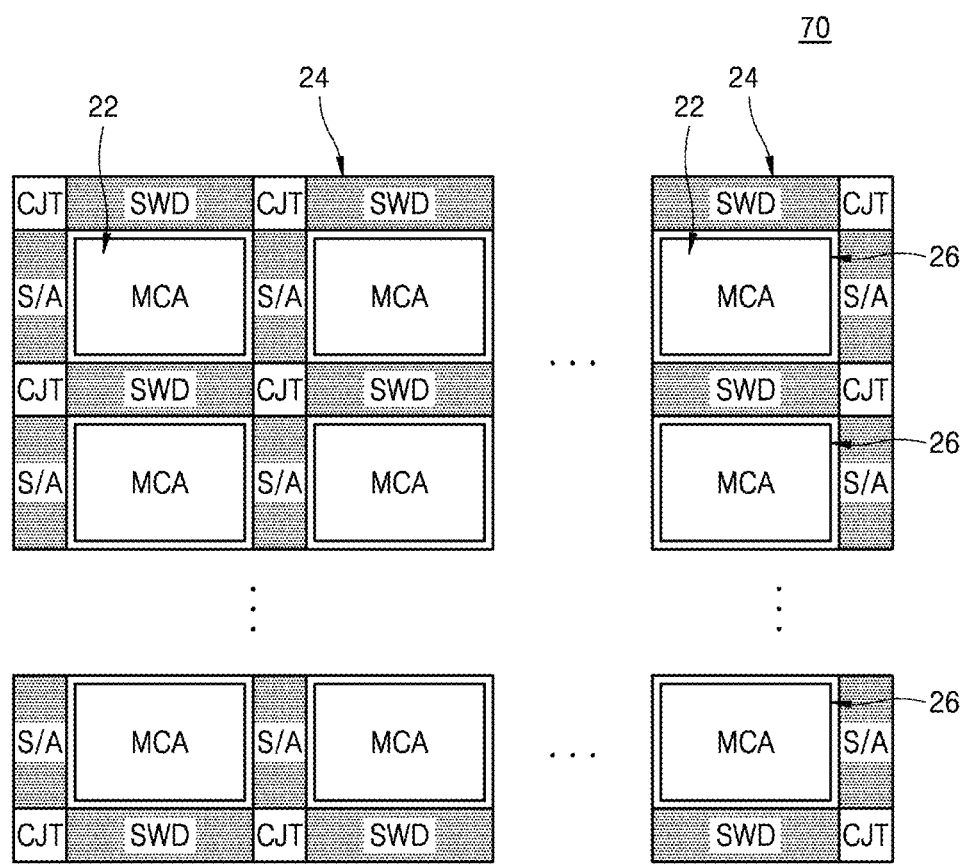
FIG. 2 is a plan view illustrating a schematic configuration of an integrated circuit device, according to embodiments of the inventive concept.

FIG. 2 is a plan view illustrating a schematic configuration of an integrated circuit device, according to embodiments of the inventive concept.

Referring to FIG. 2, an integrated circuit device 70 includes a plurality of first areas 22. Each of the plurality of first areas 22 may be surrounded by a second area 24, with an interface area 26 being therebetween. In the integrated circuit device 70, each of the plurality of first areas 22 may be a memory cell array area MCA of a DRAM device, and the second area 24 may be a peripheral circuit area of the DRAM device. In the plurality of first areas 22, the memory cell array area MCA may include the memory cell array 22A described with reference to FIG. 1.

The second area 24 may include a sub-word line driver block SWD, a sense amplifier block S/A, and a conjunction block CJT. A plurality of bit line sense amplifiers may be arranged in the sense amplifier block S/A. The conjunction block CJT may be arranged at an intersection point between the sub-word line driver block SWD and the sense amplifier block S/A. Power supply drivers and ground drivers for driving the bit line sense amplifiers may be alternately arranged in the conjunction block CJT. A peripheral circuit, such as an inverter chain, an input/output circuit, or the like, may be further formed in the second area 24.

Figure 3:
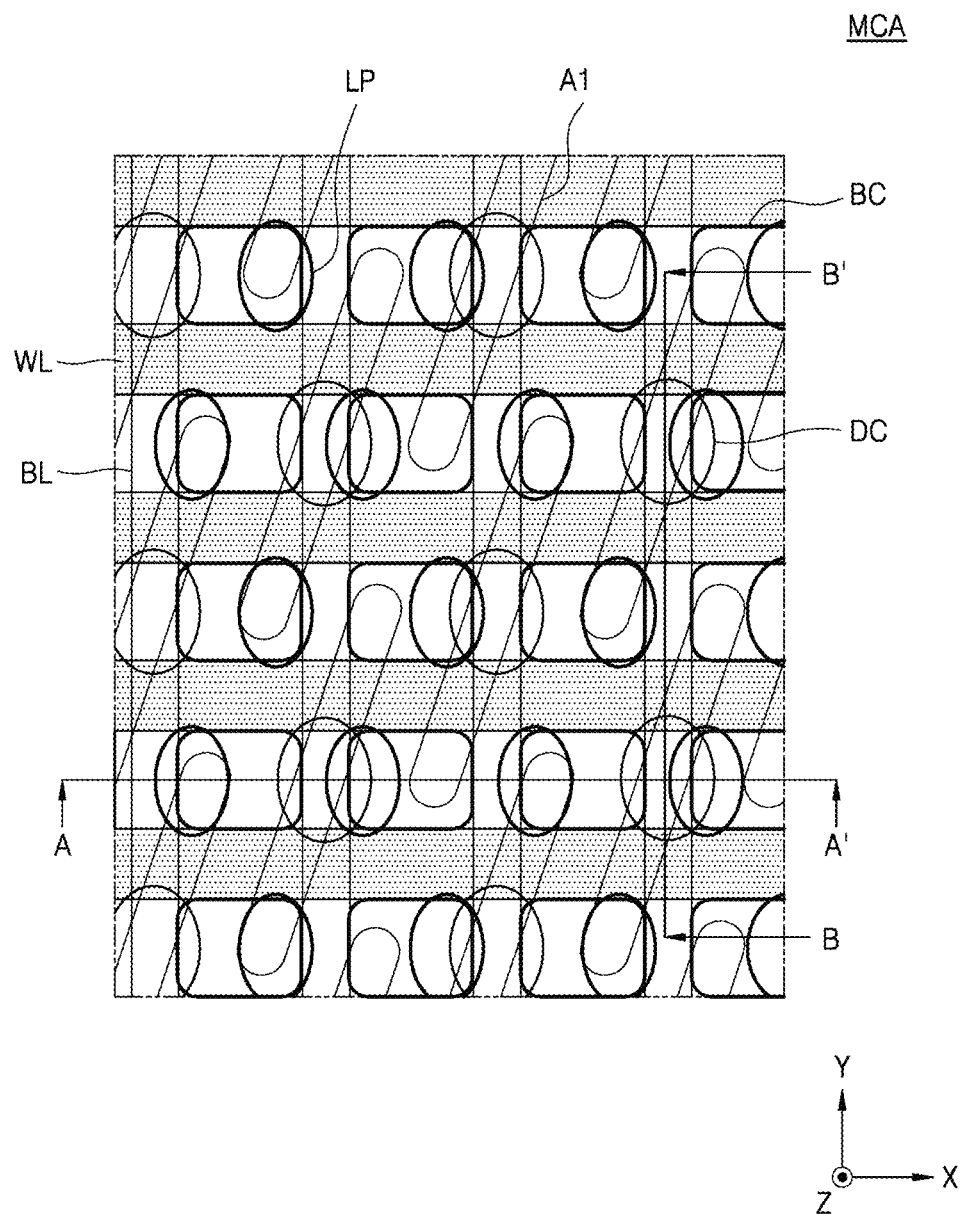
FIG. 3 is a schematic planar layout illustrating main components of a memory cell array area shown in FIG. 2.

FIG. 3 is a schematic planar layout illustrating main components of the memory cell array area MCA shown in FIG. 2.

Referring to FIG. 3, the memory cell array area MCA may include a plurality of cell active regions A1. Each of the plurality of cell active regions A1 may be arranged to have a long axis in an oblique direction with respect to an X direction and a Y direction where the X and Y directions are perpendicular to each other.

A plurality of word lines WL may extend parallel to each other in the X direction across the plurality of cell active regions A1. A plurality of bit lines BL may extend, over the plurality of word lines WL, parallel to each other in the Y direction. The plurality of bit lines BL may be connected to the plurality of cell active regions A1 via direct contacts DC.

A plurality of buried contacts BC may be formed between two bit lines BL adjacent to each other among the plurality of bit lines BL. The plurality of buried contacts BC may be arranged in a line in the X direction and the Y direction. A plurality of landing pads LP may be respectively formed on the plurality of buried contacts BC. The plurality of buried contacts BC and the plurality of landing pads LP may connect bottom electrodes (not shown) of capacitors formed over the plurality of bit lines BL to the cell active regions A1. Each of the plurality of landing pads LP may partially overlap a buried contact BC.

Figure 4:
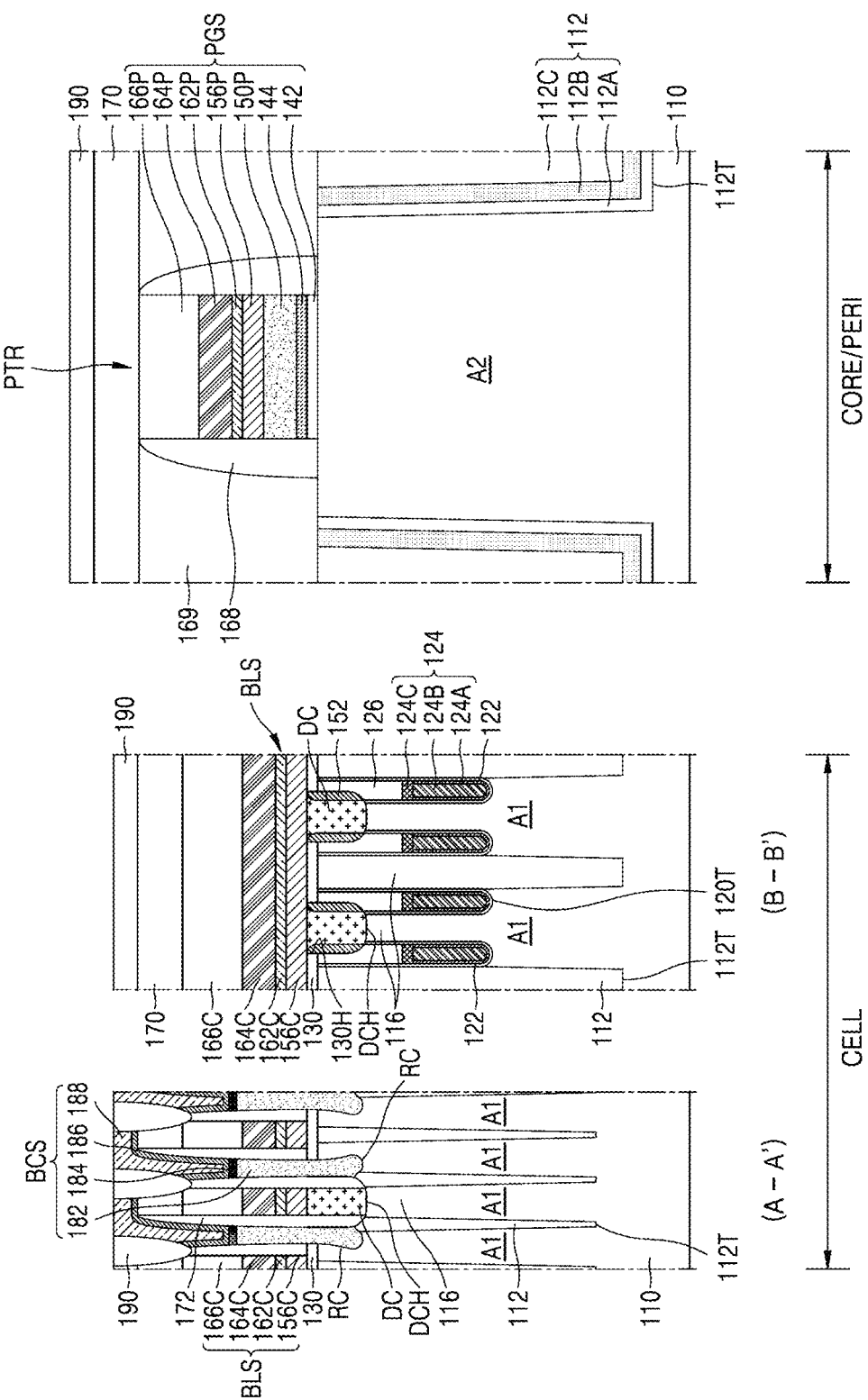
FIGS. 4 to 7 are cross-sectional views each illustrating a main portion of an integrated circuit device, according to embodiments of the inventive concept.

FIG. 4 is a cross-sectional view illustrating a main portion of an integrated circuit device 100, according to embodiments of the inventive concept. FIG. 4 illustrates cross-sectional configurations of a cell array area CELL and a peripheral circuit area CORE/PERI. The cell array area CELL may be a portion of the first area 22 described with reference to FIGS. 1 and 2. The peripheral circuit area CORE/PERI may be a portion of the second area 24 described with reference to FIGS. 1 and 2. In the cell array area CELL of FIG. 4, cross-sectional configurations of some regions, which are taken along a line A-A' and a line B-B' of FIG. 3, are illustrated.

Referring to FIG. 4, the integrated circuit device 100 includes a substrate 110 having the cell array area CELL and the peripheral circuit area CORE/PERI. The semiconductor substrate 110 may be formed of a crystalline semiconductor material and may include a silicon substrate, a silicon-germanium substrate, a germanium substrate, or a single-crystalline epitaxial layer grown on a single-crystalline silicon substrate. For example, the substrate 110 may include a semiconductor element such as Si, Ge, or the like, or at least one compound semiconductor selected from among SiGe, SiC, GaAs, InAs, and InP. The substrate 110 may include a conductive region, for example, an impurity-doped (e.g., doped with charge carrier impurities having either N-type or P-type impurities) well.

In the cell array area CELL and the peripheral circuit area CORE/PERI, a plurality of device isolation trenches 112T are formed in the substrate 110, and a plurality of device isolation films 112 may respectively fill the plurality of device isolation trenches 112T. By the plurality of device isolation films 112, a plurality of cell active regions A1 may be defined in the cell array area CELL of the substrate 110, and a peripheral circuit active region A2 may be defined in the peripheral circuit area CORE/PERI of the substrate 110.

A width of a device isolation film 112 in a direction parallel to a top surface of the substrate 110 arranged in the cell array area CELL may be less than a width of a device isolation film 112 in the direction parallel to the top surface of the substrate 110 arranged in the peripheral circuit area CORE/PERI. The device isolation film 112 may include a silicon oxide film, a silicon nitride film, or combinations thereof. The device isolation film 112 may include a single layer including one insulating film, a double layer including two insulating films, or multiple layers including combinations of at least three insulating films. In the peripheral circuit area CORE/PERI, the device isolation film 112 may include a first insulating liner 112A and a second insulating liner 112B, which are formed on an inner wall of a device isolation trench 112T in this stated order, and a filling insulating film 112C, which is on the second insulating liner 112B and fills the device isolation trench 112T. Thus, according to this exemplary embodiment, the second insulating liner 112B is formed between the first insulating liner 112A and the filling insulating film 112C. In some embodiments, the first insulating liner 112A may include an oxide film, the second insulating liner 112B may include a nitride film, and the filling insulating film 112C may include an oxide film. The oxide film constituting the first insulating liner 112A may include a medium temperature oxidation (MTO) film, a high density plasma (HDP) oxide film, a thermal oxide film, a tetraethyl orthosilicate (TEOS) film, or an undoped silicate glass (USG) film. The second insulating liner 112B may include a silicon nitride film. The oxide film constituting the filling insulating film 112C may include tonen silazene (TOSZ), an HDP oxide film, a USG oxide film, silicate, siloxane, methyl silsesquioxane (MSQ), hydrogen silsesquioxane (HSQ), polysilazane, or combinations thereof.

In the cell array area CELL, a plurality of word line trenches 120T may be formed in the substrate 110, the plurality of word line trenches 120T extending parallel to each other. A gate dielectric film 122, a word line 124, and a buried insulating film 126 may be formed inside each of the plurality of word line trenches 120T. A plurality of word lines 124 may extend parallel to each other in a direction crossing the plurality of cell active regions A1 (in the X direction in FIG. 3).

The gate dielectric film 122 may include a silicon oxide film, a silicon nitride film, a silicon oxynitride film, an oxide/nitride/oxide (ONO) film, or a high-k dielectric film having a higher dielectric constant than a silicon oxide film. The high-k dielectric film may have a dielectric constant of about 10 to about 25, and may include, for example, $HfO_2$, $Al_2O_3$, $HfAlO_3$, $Ta_2O_3$, or $TiO_2$. Terms such as "substantially," "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The word line 124 may include a gate liner 124A, a lower gate line 124B, and an upper gate line 124C. The gate liner 124A may contact the gate dielectric film 122, and the lower gate line 124B may be surrounded by the gate liner 124A and the upper gate line 124C and apart from the gate dielectric film 122. In some embodiments, the gate liner 124A may include TiN, the lower gate line 124B may include W, and the upper gate line 124C may include doped polysilicon. The word line 124 may constitute the plurality of word lines WL shown in FIG. 3. It will be understood that when an element is referred to as contacting another element, there are no intervening elements present at the point of contact.

The buried insulating film 126 may include a silicon oxide film, a silicon nitride film, a silicon oxynitride film, or combinations thereof.

A plurality of source/drain regions 116 may be formed in portions of the plurality of cell active regions A1 near a top surface of the substrate 110.

In the cell array area CELL, a buffer insulating film 130 may be formed on the substrate 110. The buffer insulating film 130 may include a single insulating film or multiple insulating films. In some embodiments, the buffer insulating film 130 may include an oxide film, a nitride film, a metal-containing insulating film, or combinations thereof. In some embodiments, the metal-containing insulating film may constitute an uppermost portion of the buffer insulating film 130. For example, the metal-containing insulating film may include an Hf oxide film, an Al oxide film, or an Al nitride film, without being limited thereto.

In the cell array area CELL, a plurality of bit line structures BLS may extend parallel to each other over the substrate 110 in a direction intersecting the word line 124 (in the Y direction in FIG. 3). Each of the plurality of bit line structures BLS may be connected to corresponding one of the plurality of cell active regions A1 via direct contacts DC.

A peripheral circuit transistor PTR may be formed in the peripheral circuit area CORE/PERI. The peripheral circuit transistor PTR may include a peripheral circuit gate structure PGS formed on the peripheral circuit active region A2. The peripheral circuit gate structure PGS may include a dielectric layer 142, a metal-containing work function adjusting layer 144, a first gate semiconductor layer 150P, a second gate semiconductor layer 156P, a first conductive layer 162P, a second conductive layer 164P, and an insulating capping layer 166P, which are stacked on the substrate 110 in this stated order. For example, a top surface of the dielectric layer 142 and a bottom surface of the metal-containing work function adjusting layer 144 contact each other, a top surface of the metal-containing work function adjusting layer 144 and a bottom surface of the first gate semiconductor layer 150P contact each other, a top surface of the first gate semiconductor layer 150P and a bottom surface of the second gate semiconductor layer 156P contact each other, a top surface of the second gate semiconductor layer 156P and a bottom surface of the first conductive layer 162P contact each other, a top surface of the first conductive layer 162P and a bottom surface of the second conductive layer 164P contact each other, and a top surface of the second conductive layer 164P and a bottom surface of the insulating capping layer 166P contact each other. In the peripheral circuit gate structure PGS, the first gate semiconductor layer 150P and the second gate semiconductor layer 156P may have different doping concentrations from each other. The first gate semiconductor layer 150P and the second gate semiconductor layer 156P may be used to control a work function of the peripheral circuit transistor PTR.

In some embodiments, the peripheral circuit transistor PTR may be formed only in the peripheral circuit area CORE/PERI, but not in the cell array area CELL and the direct contacts DC may be formed only in the cell array area CELL, but not in the peripheral circuit area CORE/PERI.

The dielectric layer 142 may include a single dielectric layer or multiple dielectric layers. The dielectric layer 142 may include a silicon oxide film, a silicon nitride film, a silicon oxynitride film, an oxide/nitride/oxide (ONO) film, a high-k dielectric film, or combinations thereof. The high-k dielectric film is a film having a higher dielectric constant than a silicon oxide film, and may include, for example, $HfO_2$, $Al_2O_3$, $HfAlO_3$, $Ta_2O_3$, or $TiO_2$.

The metal-containing work function adjusting layer 144 may include a metal, a conductive metal nitride, a conductive metal carbide, a conductor including a metal atom, or combinations thereof. The metal-containing work function adjusting layer 144 may have a single layer structure or a multilayer structure. The metal-containing work function adjusting layer 144 may include at least one material selected from among Ti, Ta, Al, Ni, Co, La, Pd, Nb, Mo, Hf, Ir, Ru, Pt, Yb, Dy, Er, Pd, TiAl, HfSiMo, TiN, WN, TaN, RuN, MoN, TiAlN, TaC, TiC, and TaC. In some embodiments, the metal-containing work function adjusting layer 144 may include at least one stack structure selected from among TiN/TaN, $Al_2O_3$/TiN, Al/TiN, TiN/Al/TiN, TiN/TiON, Ta/TiN, TaN/TiN, La/TiN, Mg/TiN, and Sr/TiN. Here, TiN may be substituted with TaN, TaCN, TiCN, CoN, or CoCN, and La may be substituted with LaO or LaON. In some embodiments, the metal-containing work function adjusting layer 144 may be omitted.

In some embodiments, each of the first gate semiconductor layer 150P and the second gate semiconductor layer 156P may include polysilicon doped with a P-type dopant (e.g., charge carrier impurities) or an N-type dopant (e.g., charge carrier impurities). The P-type dopant may include B, In, or combinations thereof. The N-type dopant may include P, As, Sb, or combinations thereof. The first gate semiconductor layer 150P and the second gate semiconductor layer 156P may be doped with a dopant of the same conductivity type. A doping concentration of the second gate semiconductor layer 156P may be equal to or different from a doping concentration of the first gate semiconductor layer 150P. In some embodiments, the doping concentration of the second gate semiconductor layer 156P may be lower than the doping concentration of the first gate semiconductor layer 150P. In some other embodiments, the doping concentration of the second gate semiconductor layer 156P may be higher than the doping concentration of the first gate semiconductor layer 150P. For example, the first gate semiconductor layer 150P may include a polysilicon layer doped at a doping concentration selected from a range of about $1 \times 10^{21}$ cm$^{-3}$ to about $9 \times 10^{21}$ cm$^{-3}$. The second gate semiconductor layer 156P may include a polysilicon layer doped at a doping concentration selected from a range of about $2 \times 10^{20}$ cm$^{-3}$ to about $9 \times 10^{21}$ cm$^{-3}$.

In the peripheral circuit gate structure PGS, each of the first conductive layer 162P and the second conductive layer 164P may include TiSiN, TiN, TaN, CoN, a metal, a metal silicide, or combinations thereof. The metal and the metal silicide may include W, Mo, Au, Cu, Al, Ni, or Co. For example, the first conductive layer 162P may include TiSiN, and the second conductive layer 164P may include W. The insulating capping layer 166P may include a silicon nitride film.

The integrated circuit device 100 may include an insulating spacer 168 covering both sidewalls of the peripheral circuit gate structure PGS, and an interlayer dielectric 169 that is around the peripheral circuit gate structure PGS and covers the substrate 110. The peripheral circuit gate structure PGS, the insulating spacer 168, and the interlayer dielectric 169 may be covered with an insulating film 190. In some embodiments, the insulating spacer 168 may include an oxide film, a nitride film, or combinations thereof. The insulating spacer 168 may include a single layer or multiple layers. The interlayer dielectric 169 may include an HDP oxide film or a silicon oxide film formed by chemical vapor deposition (CVD), e.g., flowable CVD (FCVD). The insulating film 190 may include an oxide film.

In the cell array area CELL, a direct contact DC may include a contact semiconductor layer having a doping concentration that is lower than the doping concentration of at least one of the first gate semiconductor layer 150P and the second gate semiconductor layer 156P, which constitute the peripheral circuit gate structure PGS. In some embodiments, the contact semiconductor layer may include polysilicon doped with a P-type dopant or an N-type dopant. In some embodiments, the direct contact DC may be doped with a dopant having the same conductivity type as dopants doped into the first gate semiconductor layer 150P and the second gate semiconductor layer 156P. For example, the direct contact DC may include a polysilicon layer doped at a doping concentration selected from a range of about $1 \times 10^{20}$ cm$^{-3}$ to about $9 \times 10^{20}$ cm$^{-3}$. In some embodiments, each of the direct contact DC, the first gate semiconductor layer 150P, and the second gate semiconductor layer 156P may include doped polysilicon, and the doping concentration of the direct contact DC may be lower than the doping concentration of the first gate semiconductor layer 150P and lower than the doping concentration of the second gate semiconductor layer 156P.

The integrated circuit device 100 may further include a direct contact spacer 152 covering sidewalls of the direct contact DC in the cell array area CELL. The direct contact spacer 152 may include undoped polysilicon.

The direct contact spacer 152 may cover only some of the sidewalls of the direct contact DC. As shown in a cross-sectional region taken along the line B-B' in FIG. 4, the direct contact spacer 152 may cover both sidewalls of the direct contact DC opposite to each other in a direction parallel to an extension direction of the bit line structures BLS, and may not cover both sidewalls of the direct contact DC opposite to each other in a direction orthogonal to the extension direction of the bit line structures BLS.

In the cell array area CELL, the buffer insulating film 130 may have a hole 130H penetrated by the direct contact DC and the direct contact spacer 152. Each of the direct contact DC and the direct contact spacer 152 may include a portion extending into the substrate 110 through the buffer insulating film 130 and thus buried in the substrate 110. Thus, not the entirety of the direct contact DC, but only a portion of the direct contact DC that extends in to the substrate 110 through the buffer insulating film 130 is buried in the substrate 110 and not the entirety of the direct contact spacer 152, but only a portion of the direct contact spacer 152 that extends in to the substrate 110 through the buffer insulating film 130 is buried in the substrate 110.

The plurality of bit line structures BLS may be apart from the substrate 110 with the buffer insulating film 130 therebetween. Each of the plurality of bit line structures BLS may include a bit line semiconductor layer 156C, a first conductive layer 162C, a second conductive layer 164C, and an insulating capping layer 166C, which are stacked on the buffer insulating film 130 in this stated order. For example, a top surface of the buffer insulating film 130 and a bottom surface of the bit line semiconductor layer 156C contact each other, top surface of the bit line semiconductor layer 156C and a bottom surface of the first conductive layer 162C contact each other, a top surface of the first conductive layer 162C and a bottom surface of the second conductive layer 164C contact each other, and a top surface of the second conductive layer 164C and a bottom surface of the insulating capping layer 166C contact each other. The bit line semiconductor layer 156C, the first conductive layer 162C, and the second conductive layer 164C may constitute a bit line BL shown in FIG. 3. The plurality of bit line structures BLS may be connected to the direct contacts DC.

The bit line semiconductor layer 156C may contact a top surface of the direct contact DC. The bit line semiconductor layer 156C may have a doping concentration that is higher than the doping concentration of the contact semiconductor layer constituting the direct contact DC. In some embodiments, the bit line semiconductor layer 156C may include polysilicon doped with a P-type dopant or an N-type dopant. The bit line semiconductor layer 156C may be doped with a dopant having the same conductivity type as the dopant included in the direct contact DC. The bit line semiconductor layer 156C may be doped with a dopant having the same conductivity type as the dopants doped into the first gate semiconductor layer 150P and the second gate semiconductor layer 156P, which are formed in the peripheral circuit area CORE/PERI. For example, the bit line semiconductor layer 156C may include a polysilicon layer doped at a doping concentration selected from a range of about $2\times10^{20}$ $cm^{-3}$ to about $9\times10^{21}$ $cm^{-3}$. In some embodiments, the bit line semiconductor layer 156C may include a material that is the same as a constituent material of the second gate semiconductor layer 156P constituting the peripheral circuit gate structure PGS. For example, the bit line semiconductor layer 156C and the second gate semiconductor layer 156P may respectively include doped polysilicon layers having an equal doping concentration selected from a range of about $2\times10^{20}$ $cm^{-3}$ to about $9\times10^{21}$ $cm^{-3}$.

In a bit line structure BLS, each of the first conductive layer 162C and the second conductive layer 164C may include TiSiN, TiN, TaN, CoN, a metal, a metal silicide, or combinations thereof. The metal and the metal silicide may include W, Mo, Au, Cu, A1, Ni, or Co. For example, the first conductive layer 162C may include TiSiN, and the second conductive layer 164C may include W. The insulating capping layer 166C may include a silicon nitride film.

In FIG. 4, although each of the plurality of bit line structures BLS is illustrated as including three conductive layers, that is, the bit line semiconductor layer 156C, the first conductive layer 162C, and the second conductive layer 164C, the inventive concept is not limited thereto. For example, the bit line structure BLS may include a single conductive layer, a double conductive layer, or a stack structure of four or more conductive layers.

Each of the plurality of bit line structures BLS may be covered with an insulating pattern 170. The insulating pattern 170 may include a silicon nitride film. Both sidewalls of each of the bit line structure BLS and the insulating pattern 170 may be covered with an insulating spacer 172. The insulating spacer 172 may include an oxide film, a nitride film, an air spacer, or combinations thereof. The air spacer may include air, or other gases that may be present during a fabrication process of the integrated circuit device 100.

In the cell array area CELL, a plurality of buried contact structures BCS may be arranged between the plurality of bit line structures BLS. Each of the plurality of buried contact structures BCS may include a filling conductive layer 182, a metal silicide film 184, a conductive barrier film 186, and a conductive layer 188, which are stacked on a cell active region A1 in this stated order while filling each of a plurality of recesses RC. For example, a top surface of the filling conductive layer 182 and a bottom surface of the metal silicide film 184 contact each other, a top surface of the metal silicide film 184 and a bottom surface of the conductive barrier film 186 may contact each other, and a top surface of the conductive barrier film 186 and a bottom surface of the conductive layer 188 contact each other. The filling conductive layer 182, the metal silicide film 184, the conductive barrier film 186, and a lower portion of the conductive layer 188 may constitute the buried contact BC shown in FIG. 3. In addition, an upper portion of the conductive layer 188 (e.g., a portion of the conductive layer 188 extending above a top surface of the bit line structure BLS) may constitute each landing pad LP described with reference to FIG. 3. The filling conductive layer 182 may include an impurity-doped semiconductor material, a metal, a conductive metal nitride, a metal silicide, or combinations thereof. The metal silicide film 184 may include cobalt silicide, nickel silicide, or manganese silicide. In some embodiments, the metal silicide film 184 may be omitted. The conductive barrier film 186 may include a Ti/TiN stack structure. The conductive layer 188 may include doped polysilicon, a metal, a metal silicide, a conductive metal nitride, or combinations thereof. For example, the conductive layer 188 may include tungsten (W). The plurality of buried contact structures BCS may be electrically insulated from each other by the insulating film 190.

In the cell array area CELL, each of the plurality of direct contacts DC may have a sidewall portion covered with the insulating spacer 172. As shown in a cross-sectional region taken along the line A-A' in FIG. 4, the insulating spacer 172 may cover a sidewall portion of the direct contact DC, which faces the filling conductive layer 182 of the buried contact structure BCS. Each of the plurality of direct contacts DC may include a sidewall portion contacting the direct contact spacer 152, as shown in the cross-sectional region taken along the line B-B' in FIG. 4, and may include a sidewall portion contacting the insulating spacer 172, as shown in the cross-sectional region taken along the line A-A' in FIG. 4.

In the cell array area CELL, a plurality of capacitor bottom electrodes, which may be electrically connected to a plurality of conductive layers 188, may be formed on the insulating film 190.

Figure 5:
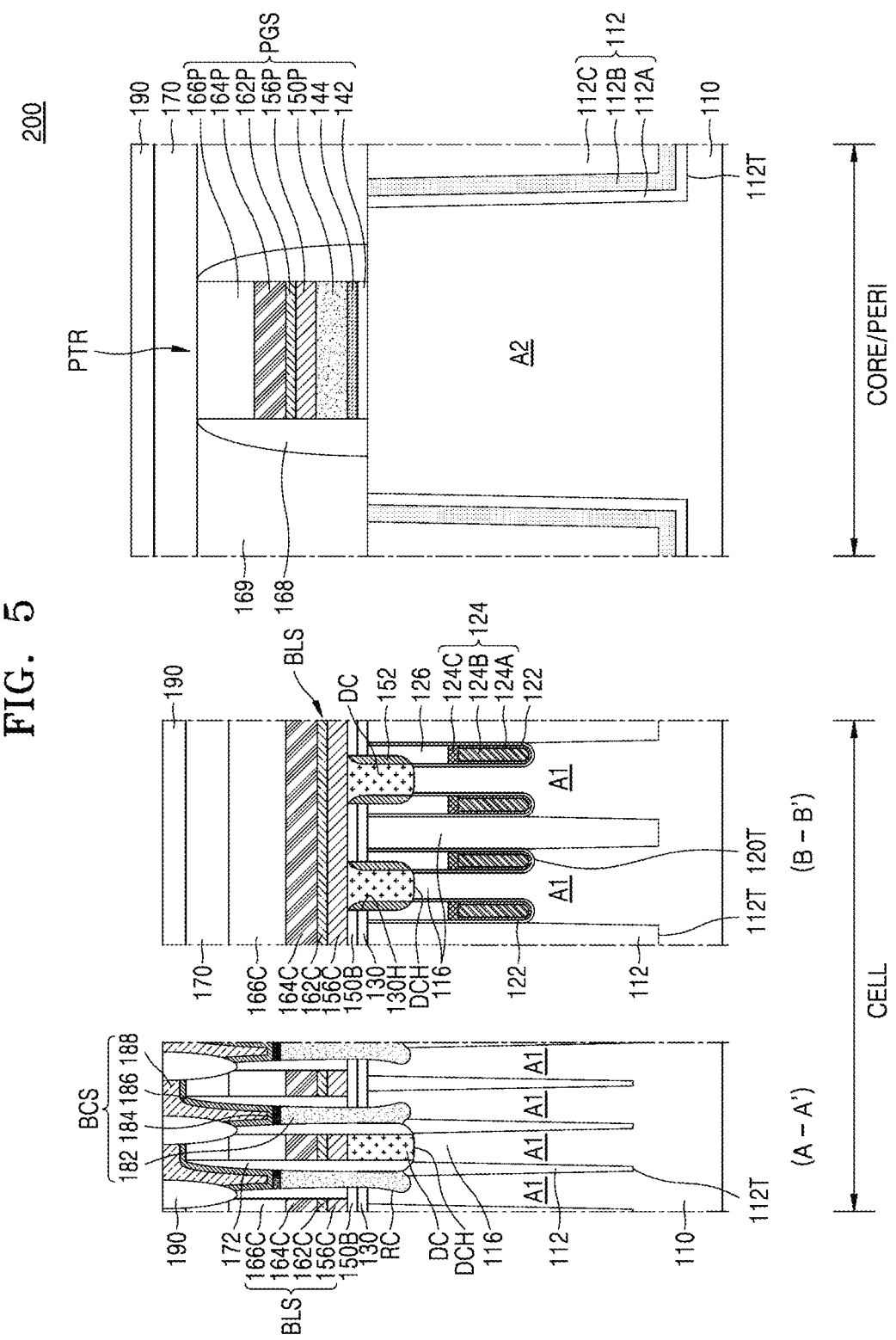

FIG. 5 is a cross-sectional view illustrating a main portion of an integrated circuit device 200, according to other embodiments of the inventive concept. In FIG. 5, the same reference numerals as in FIG. 4 respectively denote the same members, and repeated descriptions thereof will be omitted.

Referring to FIG. 5, the integrated circuit device 200 has a substantially identical configuration to the integrated circuit device 100 shown in FIG. 4. However, the integrated circuit device 200 further includes a semiconductor oxide film 150B between the buffer insulating film 130 and the bit line structure BLS in the cell array area CELL.

In the cell array area CELL, each of the direct contact DC, the direct contact spacer 152, and the insulating spacer 172 may include a portion extending into the substrate 110 through the semiconductor oxide film 150B and the buffer insulating film 130 and thus buried in the substrate 110. Thus, not the entirety of each of the direct contact DC, the direct contact spacer 152, and the insulating spacer 172 in the cell array area CELL, but only a portion of each of the direct contact DC, the direct contact spacer 152, and the insulating spacer 172 that extends in to the substrate 110 through the semiconductor oxide film 150B and the buffer insulating film 130 is buried in the substrate 110.

The semiconductor oxide film 150B may include a doped silicon oxide film. In some embodiments, the semiconductor oxide film 150B may include a silicon oxide film including a dopant that includes B, In, or combinations thereof corresponding to a P-type dopant. In some other embodiments, the semiconductor oxide film 150B may include a silicon oxide film including a dopant that includes P, As, Sb, or combinations thereof corresponding to an N-type dopant.

As shown in a cross-sectional region taken along the line B-B' in FIG. 5, an entrance portion of each of a plurality of direct contact holes DCH may be defined by the buffer insulating film 130 and the semiconductor oxide film 150B, and each of a plurality of direct contact spacers 152 may cover a sidewall of the buffer insulating film 130 and a sidewall of the semiconductor oxide film 150B. In the cell array area CELL, the plurality of bit line structures BLS may be formed on the semiconductor oxide film 150B. Thus, a structure, in which the semiconductor oxide film 150B is between the buffer insulating film 130 and the plurality of bit line structures BLS, may be obtained. The bit line semiconductor layer 156C of each of the plurality of bit line structures BLS may contact the semiconductor oxide film 150B.

Figure 6:
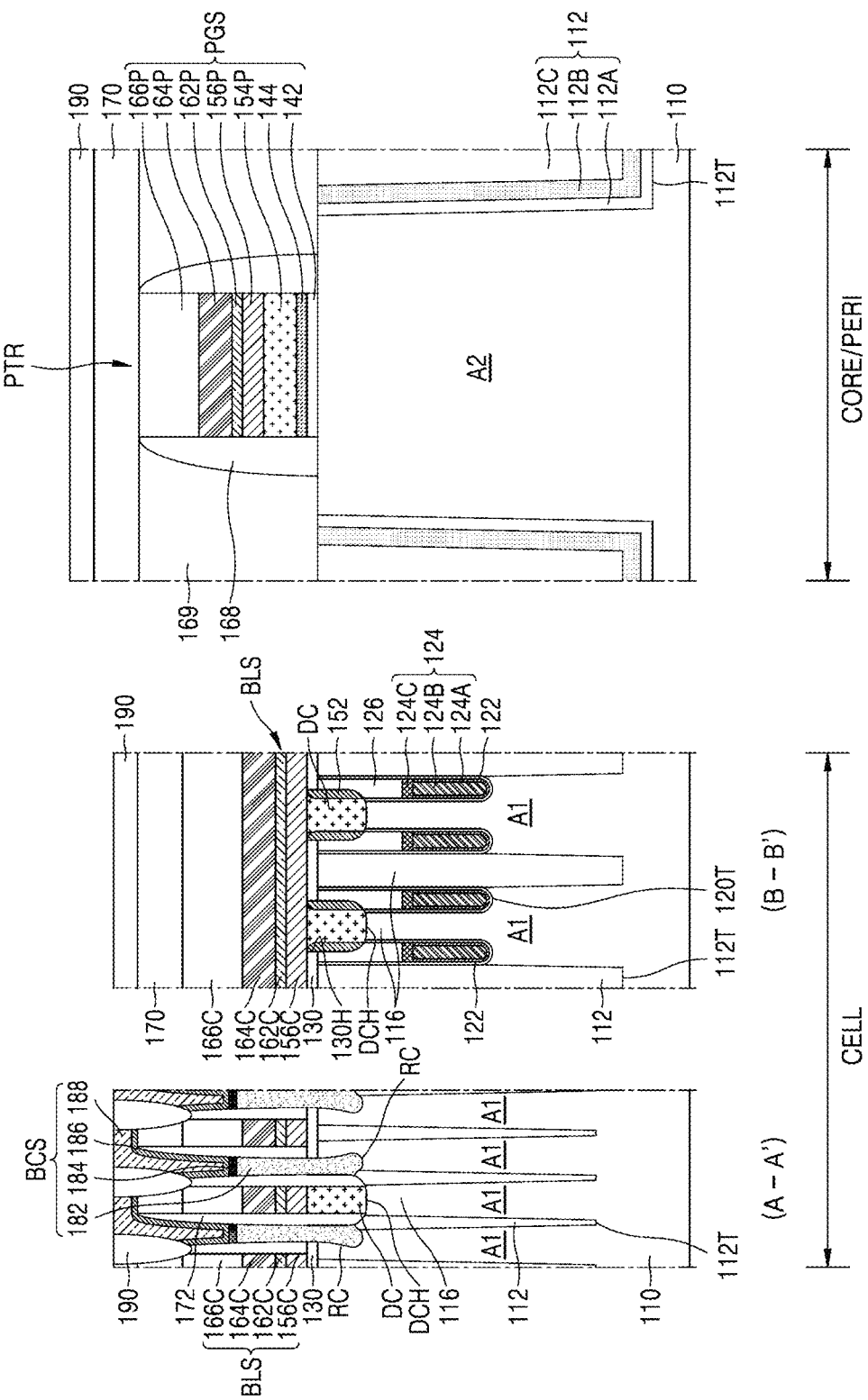

FIG. 6 is a cross-sectional view illustrating a main portion of an integrated circuit device 300, according to yet other embodiments of the inventive concept. In FIG. 6, the same reference numerals as in FIG. 4 respectively denote the same members, and repeated descriptions thereof will be omitted.

Referring to FIG. 6, the integrated circuit device 300 has a substantially identical configuration to the integrated circuit device 100 shown in FIG. 4. However, in the peripheral circuit area CORE/PERI of the integrated circuit device 300, the peripheral circuit gate structure PGS constituting the peripheral circuit transistor PTR may include the dielectric layer 142, the metal-containing work function adjusting layer 144, a first gate semiconductor layer 154P, the second gate semiconductor layer 156P, the first conductive layer 162P, the second conductive layer 164P, and the insulating capping layer 166P, which are stacked on the substrate 110 in this stated order.

In the peripheral circuit gate structure PGS, the first gate semiconductor layer 154P and the second gate semiconductor layer 156P may be used to control the work function of the peripheral circuit transistor PTR. The first gate semiconductor layer 154P may have a doping concentration that is equal to the doping concentration of the contact semiconductor layer constituting the plurality of direct contacts DC in the cell array area CELL. In some embodiments, the plurality of direct contacts DC and the first gate semiconductor layer 154P may each include a polysilicon layer doped at a doping concentration selected from a range of about $1 \times 10^{20}$ cm$^{-3}$ to about $9 \times 10^{20}$ cm$^{-3}$.

Figure 7:
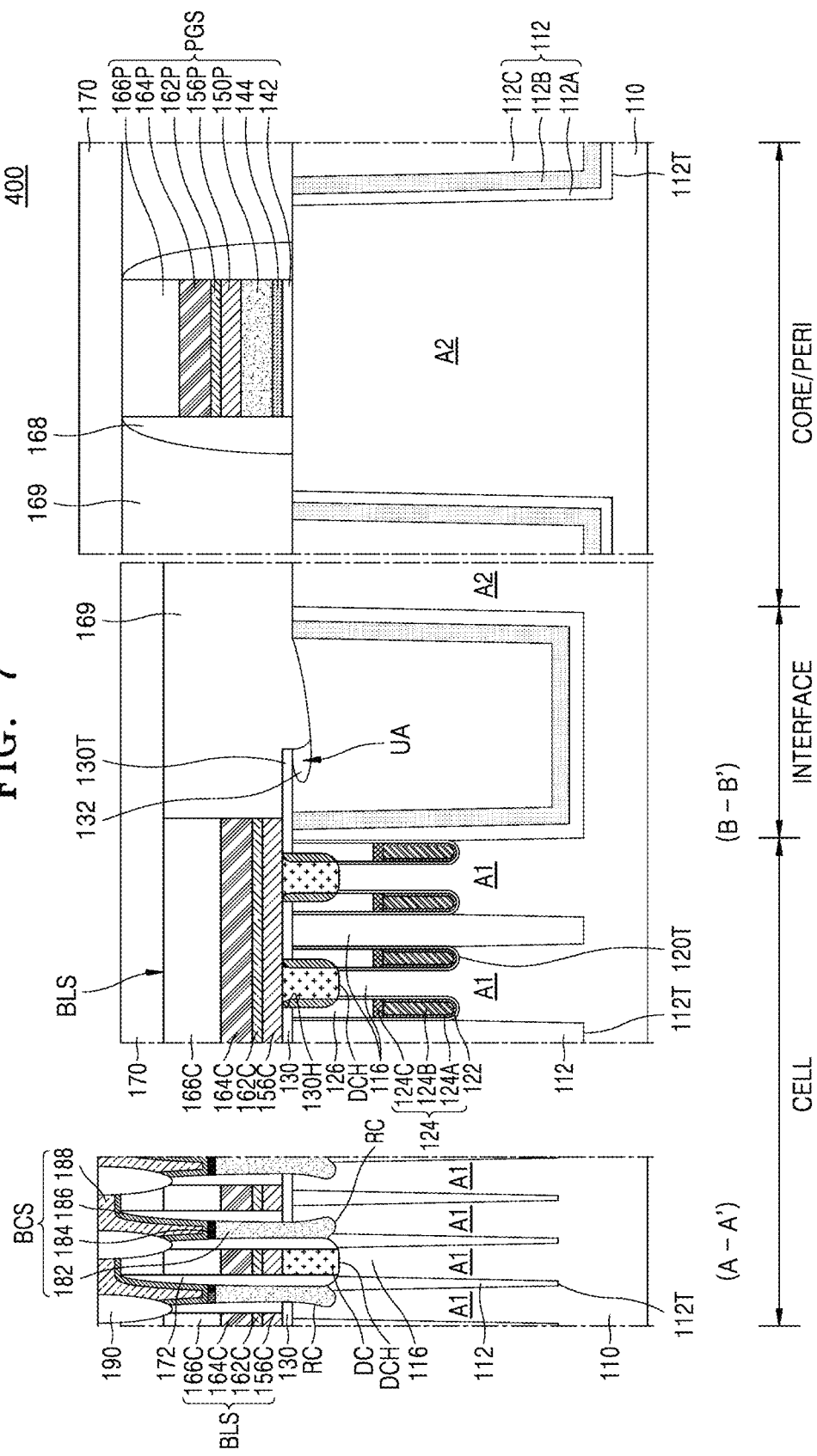

FIG. 7 is a cross-sectional view illustrating a main portion of an integrated circuit device 400, according to yet other embodiments of the inventive concept. In FIG. 7, the same reference numerals as in FIG. 4 respectively denote the same members, and repeated descriptions thereof will be omitted.

Referring to FIG. 7, the integrated circuit device 400 has a substantially identical configuration to the integrated circuit device 100 shown in FIG. 4. However, in the integrated circuit device 400, the substrate 110 further includes an interface area INTERFACE between the cell array area CELL and the peripheral circuit area CORE/PERI. The buffer insulating film 130 extends, on the substrate 110, from the cell array area CELL to the interface area INTERFACE. An end portion 130T of the buffer insulating film 130 in the interface area INTERFACE may cover a top surface of the device isolation film 112 to define an undercut region UA over the top surface of the device isolation film 112. The undercut region UA may be filled with a filling insulating pattern 132. In the interface area INTERFACE, the end portion 130T of the buffer insulating film 130 and the filling insulating pattern 132 may be covered with the interlayer dielectric 169.

According to the integrated circuit device 100, 200, 300, or 400 described with reference to FIGS. 4 to 7, to prevent formation of seams in the direct contact hole DCH when doped polysilicon is deposited for forming the direct contacts DC in the cell array area CELL, an aspect ratio of a structure including the direct contact hole DCH exposed during the deposition of the polysilicon is reduced compared to conventional process of forming the direct contacts DC, and a doping concentration of the polysilicon is reduced, compared to conventional process, to control step coverage properties. Thus, according to the integrated circuit device 100, 200, 300, or 400 described with reference to FIGS. 4 to 7, the direct contact DC having a seamless and stable structure may be provided in the cell array area CELL, and the bit line structure BLS, which may include the bit line semiconductor layer 156C having a reduced thickness and thus suppress parasitic capacitance, may be provided. In addition, according to the integrated circuit device 100, 200, 300, or 400 described with reference to FIGS. 4 to 7, in performing a process of forming a direct contact DC and a bit line structure BLS in the cell array area CELL simultaneously with a process of forming a peripheral circuit transistor PTR in a peripheral circuit area CORE/PERI, since a seam-free process is applied to form the direct contact DC, the peripheral circuit transistor PTR in the peripheral circuit area CORE/PERI may have a stack structure including two polysilicon layers that have different doping concentrations from each other. For example, the peripheral circuit gate structure PGS arranged in the peripheral circuit area CORE/PERI includes two gate semiconductor layers, e.g., the first gate semiconductor layer 150P and the second gate semiconductor layer 156P, or the first gate semiconductor layer 154P and the second gate semiconductor layer 156P, which may be controlled to desired doping concentrations, and each doping concentration thereof is independently controlled, thereby effectively controlling the work function of the peripheral circuit transistor PTR. Thus, the reliability of the integrated circuit device 100, 200, 300, or 400 may be improved. Detail processes of forming of the seam-free direct contacts DC will be described below.

Figure 8A:
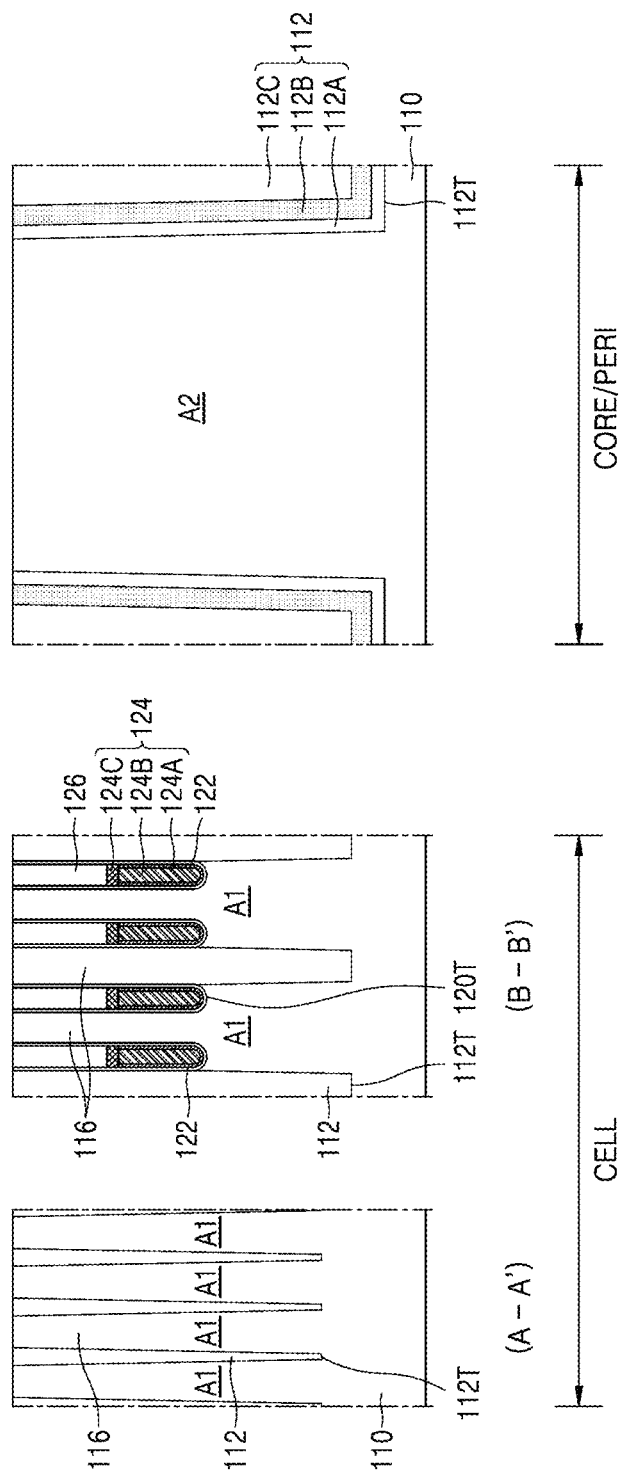
FIGS. 8A to 8P are cross-sectional views illustrating sequential processes of a method of fabricating an integrated circuit device, according to embodiments of the inventive concept.

FIGS. 8A to 8P are cross-sectional views illustrating sequential processes of a method of fabricating an integrated circuit device, according to embodiments of the inventive concept. An example of a method of fabricating the integrated circuit device 100 shown in FIG. 4 will be described with reference to FIGS. 8A to 8P. In FIGS. 8A to 8P, the same reference numerals as in FIG. 4 respectively denote the same members, and repeated descriptions thereof will be omitted.

Referring to FIG. 8A, the plurality of device isolation trenches 112T, and the plurality of device isolation films 112, which respectively fill the plurality of device isolation trenches 112T, are formed in the substrate 110, thereby defining the plurality of cell active regions A1 in the cell array area CELL and defining the peripheral circuit active region A2 in the peripheral circuit area CORE/PERI.

In the cell array area CELL, the plurality of word line trenches 120T, which extend parallel to each other, are formed in the substrate 110, followed by forming the gate dielectric film 122, the word line 124, and the buried insulating film 126 inside each of the plurality of word line trenches 120T in this stated order.

Impurity ions (e.g., charge carrier impurities) are implanted into portions of the plurality of cell active regions A1 on both sides of the plurality of word lines 124, thereby forming the plurality of source/drain regions 116 in upper portions of the plurality of cell active regions A1. In some embodiments, the plurality of source/drain regions 116 may be formed before forming the plurality of word lines 124.

Referring to FIG. 8B, the buffer insulating film 130 is formed on the substrate 110 in the cell array area CELL, and the dielectric layer 142 and the metal-containing work function adjusting layer 144 are formed on the substrate 110 in the peripheral circuit area CORE/PERI in this stated order. In some embodiments, a process of forming the metal-containing work function adjusting layer 144 may be omitted. Each of the buffer insulating film 130, the dielectric layer 142, and the metal-containing work function adjusting layer 144 may be formed by a CVD or an atomic layer deposition (ALD) process, and a formation order thereof is not particularly limited.

Figure 8C:
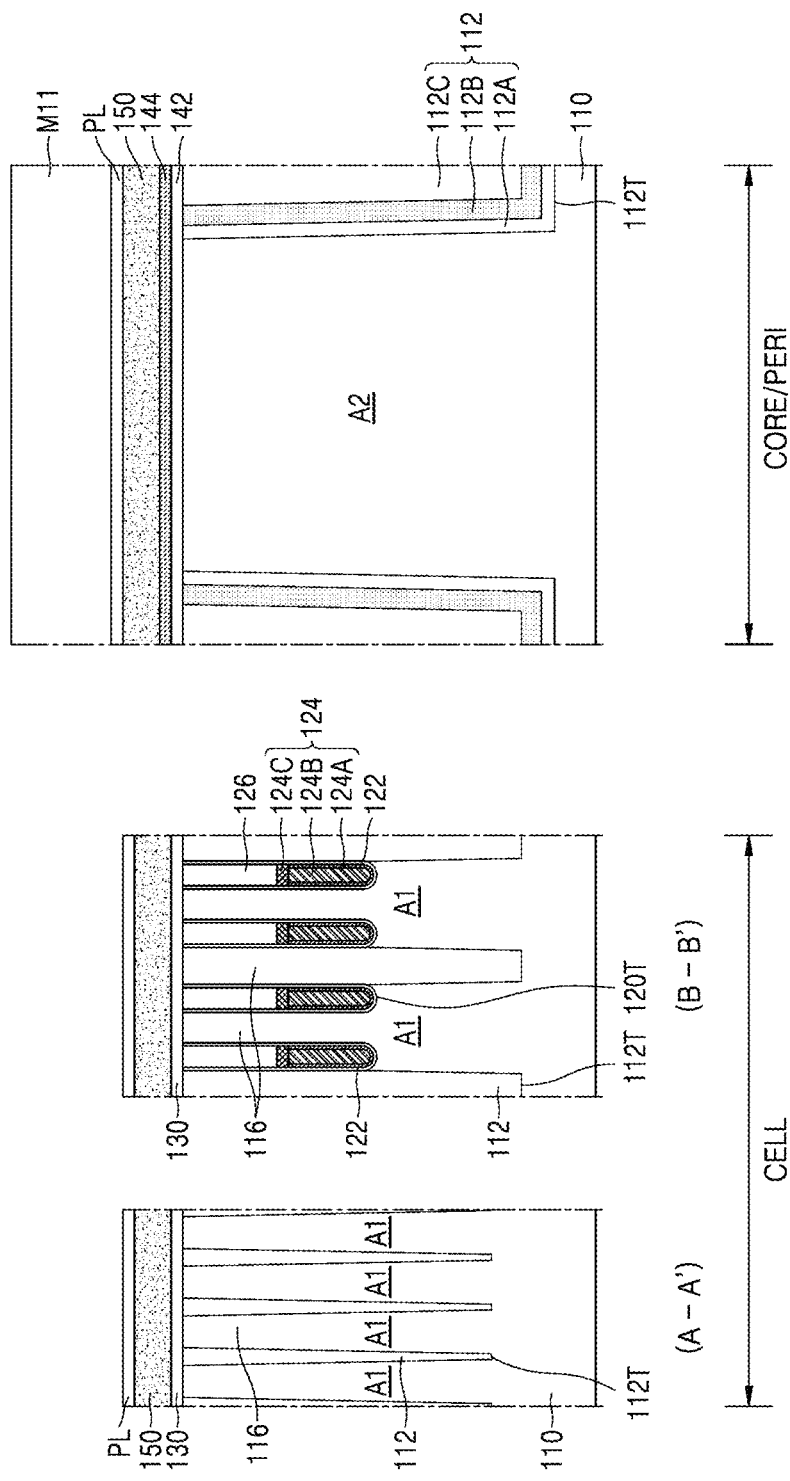

Referring to FIG. 8C, a first doped semiconductor layer 150 and a protective layer PL are formed over the substrate 110 in the cell array area CELL and the peripheral circuit area CORE/PERI in this stated order, followed by forming a first mask pattern M11, which covers the protective layer PL in the peripheral circuit area CORE/PERI. In the cell array area CELL, the protective layer PL may be exposed.

The first doped semiconductor layer 150 may include polysilicon doped with a P-type dopant or an N-type dopant. The P-type dopant may include B, In, or combinations thereof. The N-type dopant may include P, As, Sb, or combinations thereof. For example, the first doped semiconductor layer 150 may be doped at a first doping concentration of about $1 \times 10^{21}$ cm$^{-3}$ to about $9 \times 10^{11}$ cm$^{-3}$.

The protective layer PL may protect a portion of the first doped semiconductor layer 150 in the peripheral circuit area CORE/PERI. The protective layer PL may include an oxide film, a nitride film, or combinations thereof, without being limited thereto. The first mask pattern M11 may include a photoresist pattern.

Figure 8D:
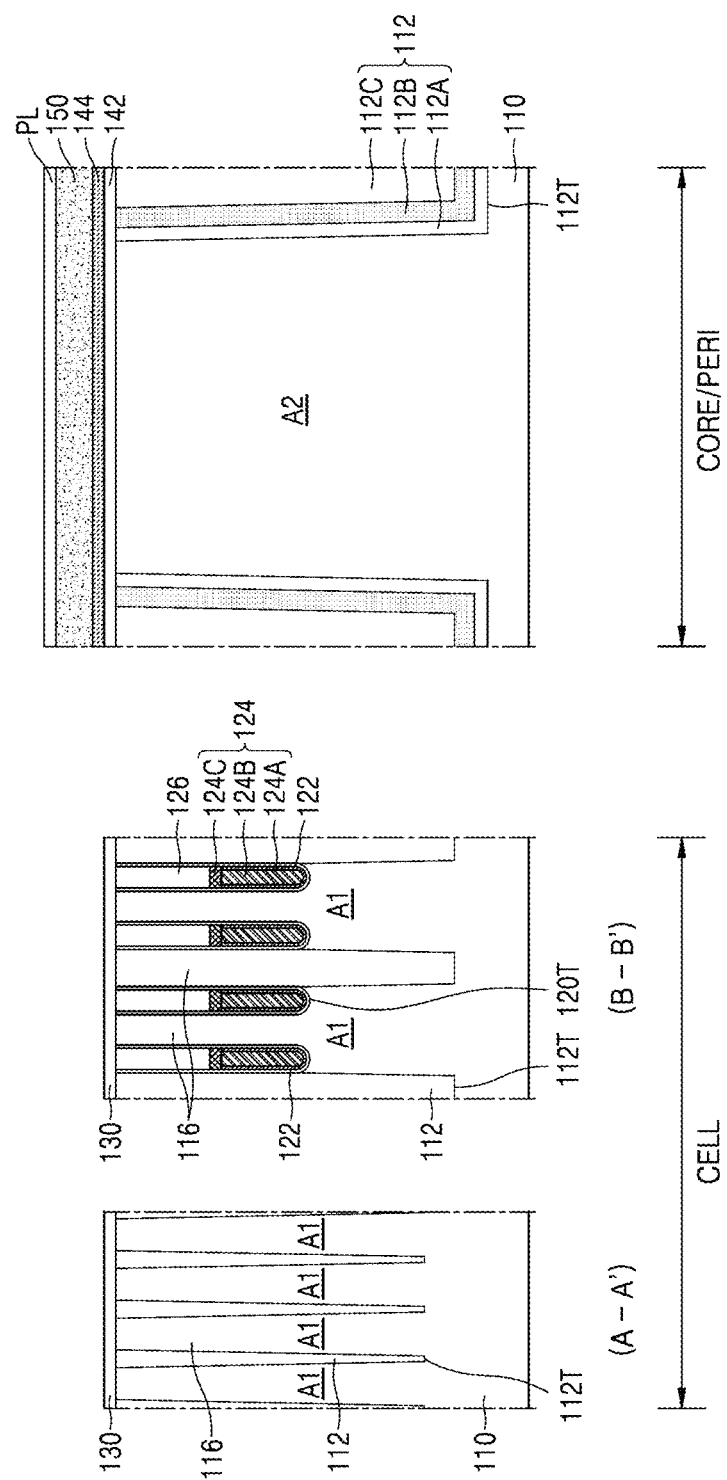

Referring to FIG. 8D, the protective layer PL and the first doped semiconductor layer 150 are removed from the cell array area CELL by anisotropic etching by using the first mask pattern M11 as an etch mask, thereby exposing the buffer insulating film 130 in the cell array area CELL.

Next, the first mask pattern M11 remaining on the protective layer PL is removed from the peripheral circuit area CORE/PERI. To remove the first mask pattern M11, ashing and strip processes may be used, but the disclosure is not limited thereto.

Figure 8E:
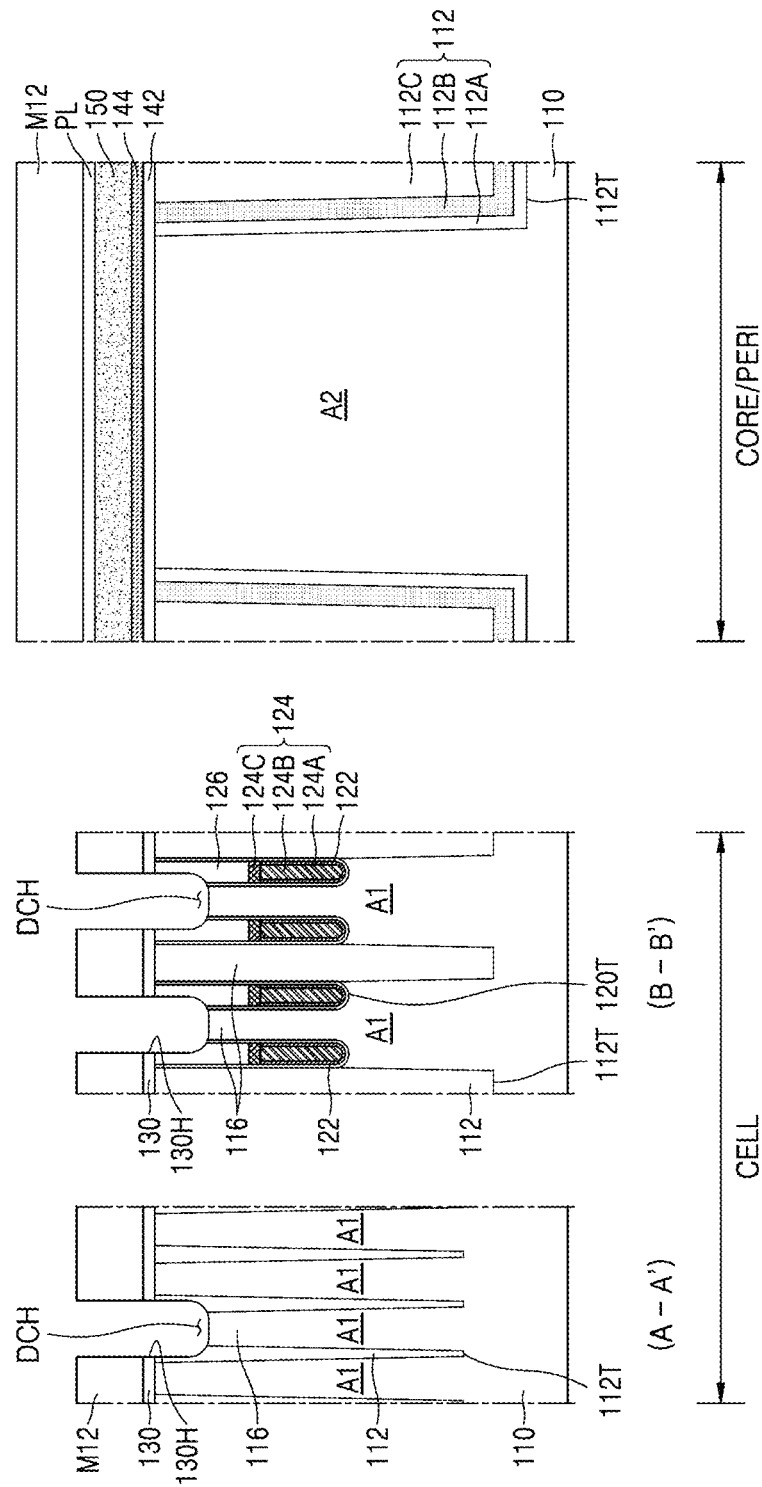

Referring to FIG. 8E, the plurality of direct contact holes DCH are formed to expose the cell active regions A1 in the cell array area CELL.

In some embodiments, to form the plurality of direct contact holes DCH, a second mask pattern M12 may be formed over the substrate 110 in the cell array area CELL and the peripheral circuit area CORE/PERI, followed by forming a plurality of holes 130H, which penetrate the buffer insulating film 130, by partially etching the buffer insulating film 130 in the cell array area CELL by using the second mask pattern M12 as an etch mask, and then, a portion of the substrate 110 and a portion of the device isolation film 112 may be etched through the plurality of holes 130H. In some embodiments, the second mask pattern M12 may include an amorphous carbon layer (ACL).

Figure 8F:
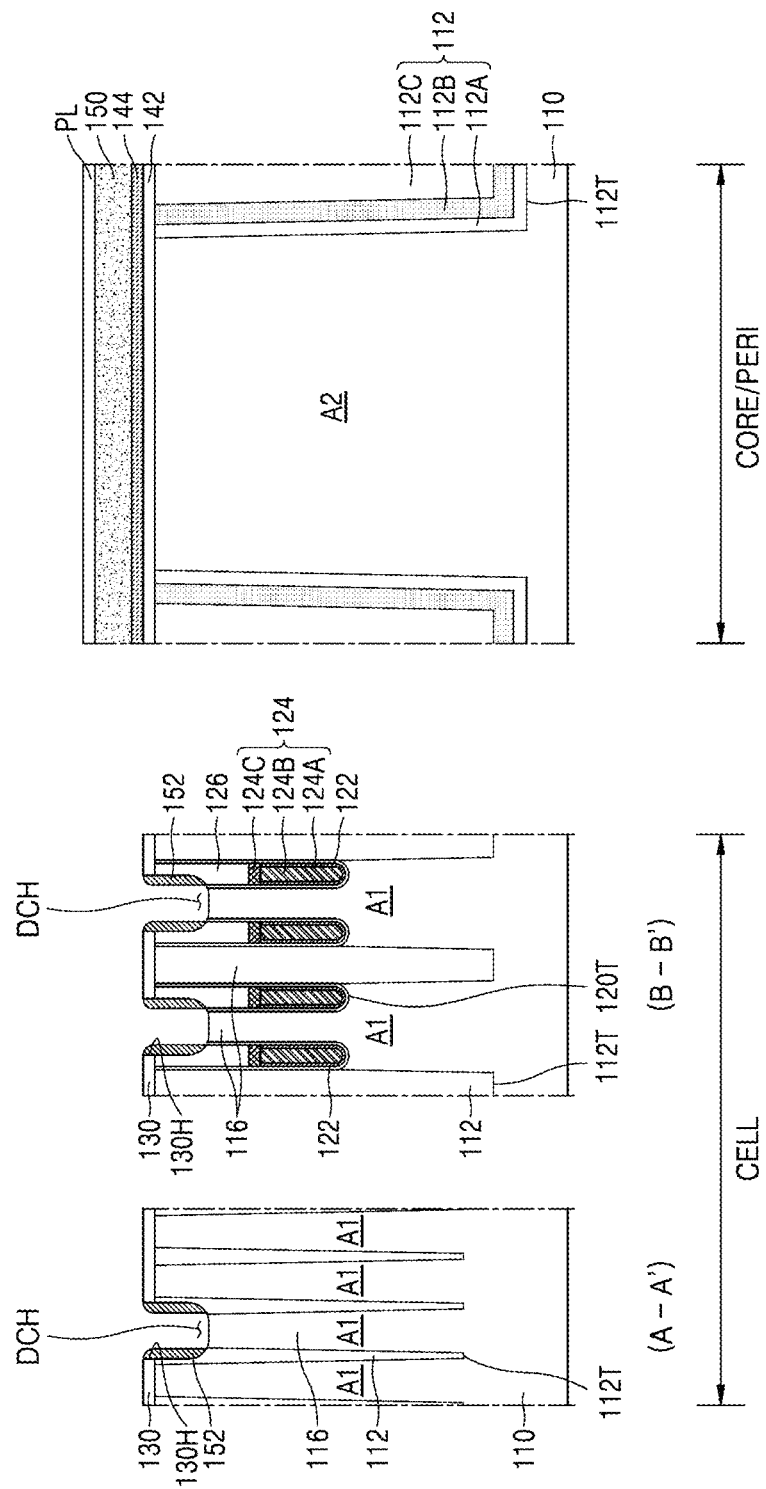

Referring to FIG. 8F, a top surface of the buffer insulating film 130 in the cell array area CELL and the protective layer PL in the peripheral circuit area CORE/PERI are exposed by removing the second mask pattern M12 from a result product of FIG. 8E, followed by forming the plurality of direct contact spacers 152 to cover inner sidewalls of the plurality of holes 130H and inner sidewalls of the plurality of direct contact holes DCH in the cell array area CELL, the plurality of holes 130H being formed in the buffer insulating film 130. To remove the second mask pattern M12, ashing and strip processes may be used, but the disclosure is not limited thereto.

Each direct contact spacer 152 may include undoped polysilicon. To form the direct contact spacers 152, an undoped polysilicon liner may be formed to cover the inner sidewalls of the plurality of holes 130H, which are formed in the buffer insulating film 130, and the inner sidewalls of the plurality of direct contact holes DCH, followed by performing etch-back on the undoped polysilicon liner, thereby leaving only portions of the undoped polysilicon liner, which cover the inner sidewalls of the plurality of holes 130H and the inner sidewalls of the plurality of direct contact holes DCH. After the plurality of direct contact spacers 152 are formed, the cell active regions A1 may be exposed by the plurality of direct contact holes DCH in the cell array area CELL. In some embodiments, a process of forming the direct contact spacers 152, which has been described with reference to FIG. 8F, may be omitted.

During the formation of the plurality of direct contact spacers 152, the protective layer PL may prevent damage to the first doped semiconductor layer 150 in the peripheral circuit area CORE/PERI.

Figure 8G:
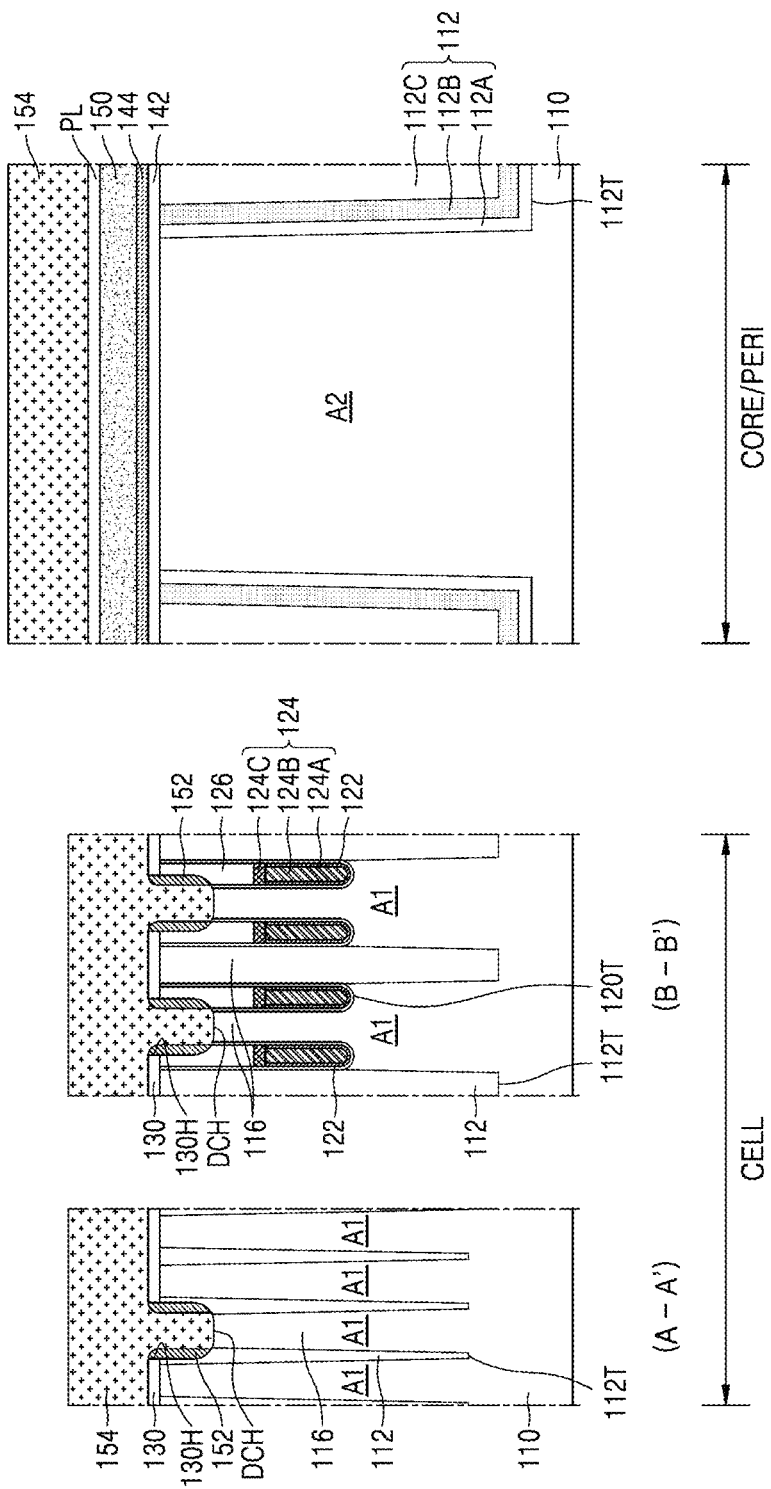

Referring to FIG. 8G, while the protective layer PL covers the first doped semiconductor layer 150 in the peripheral circuit area CORE/PERI, a second doped semiconductor layer 154 is formed over the substrate 110 in the cell array area CELL and the peripheral circuit area CORE/PERI. The second doped semiconductor layer 154 may have a thickness sufficient to fill the plurality of direct contact holes DCH in the cell array area CELL.

The second doped semiconductor layer 154 may include polysilicon doped with a P-type dopant or an N-type dopant. In some embodiments, the second doped semiconductor layer 154 may be doped with a dopant having the same conductivity type as the first doped semiconductor layer 150. In some other embodiments, the second doped semiconductor layer 154 may be doped with a dopant having a different conductivity type from the first doped semiconductor layer 150.

The second doped semiconductor layer 154 may include a semiconductor doped at a doping concentration lower than that of the first doped semiconductor layer 150. For example, the second doped semiconductor layer 154 may be doped at a second doping concentration selected from a range of about $1 \times 10^{20}$ cm$^{-3}$ to about $9 \times 10^{20}$ cm$^{-3}$.

As a comparative example, when the doping concentration of the second doped semiconductor layer 154 is equal to or higher than the doping concentration of the first doped semiconductor layer 150 formed in the peripheral circuit area CORE/PERI, although a resistance of each of the plurality of direct contacts DC (see FIG. 8H) formed in a subsequent process may be reduced due to the relatively high doping concentration of the second doped semiconductor layer 154, a tendency for the second doped semiconductor layer 154 to be conformally deposited on the substrate 110 may be increased in a deposition process for forming the second doped semiconductor layer 154 due to the relatively high doping concentration of the second doped semiconductor layer 154. As a result, in a deposition resulting product obtained after forming the second doped semiconductor layer 154 to fill narrow spaces such as the plurality of direct contact holes DCH, seams may remain in the plurality of direct contact holes DCH. When the plurality of direct contacts DC (see FIG. 8H) are formed while seams remain in the plurality of direct contact holes DCH, electrical properties of the plurality of direct contacts DC may be deteriorated.

However, according to the inventive concept, the second doped semiconductor layer 154 having a relatively low doping concentration is formed in the plurality of direct contact holes DCH, whereby the second doped semiconductor layer 154 may fill the direct contact holes DCH without seams of the second doped semiconductor layer 154 remaining in the direct contact holes DCH that are relatively narrow spaces.

Figure 8H:
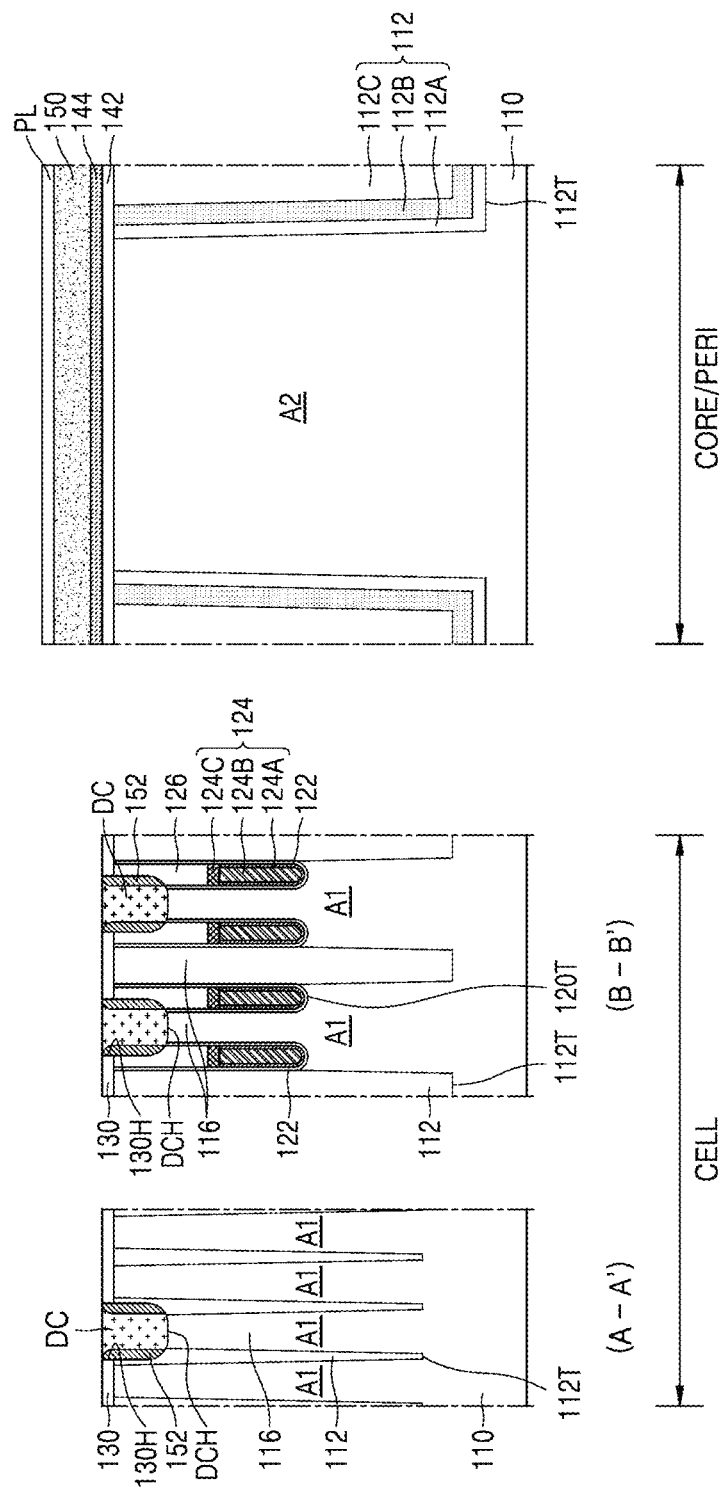

Referring to FIG. 8H, in the cell array area CELL and the peripheral circuit area CORE/PERI, the second doped semiconductor layer 154 (see FIG. 8G) is etched back such that the top surface of the buffer insulating film 130 is exposed, thereby forming the plurality of direct contacts DC.

During the etch-back of the second doped semiconductor layer 154, the protective layer PL may prevent damage to the first doped semiconductor layer 150.

Figure 8I:
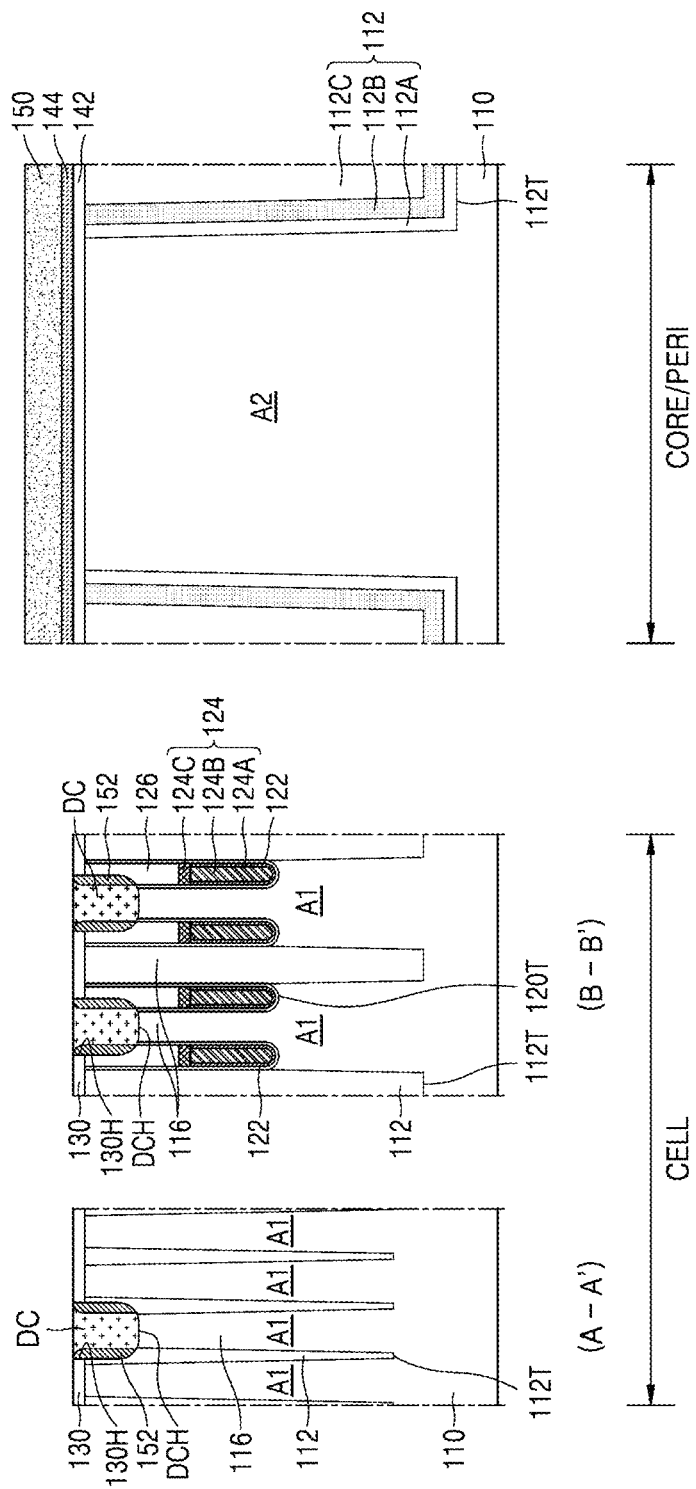

Referring to FIG. 8I, the protective layer PL is removed from a result product of FIG. 8H, thereby exposing the first doped semiconductor layer 150 in the peripheral circuit area CORE/PERI. To remove the protective layer PL, a wet etching process may be used.

Figure 8J:
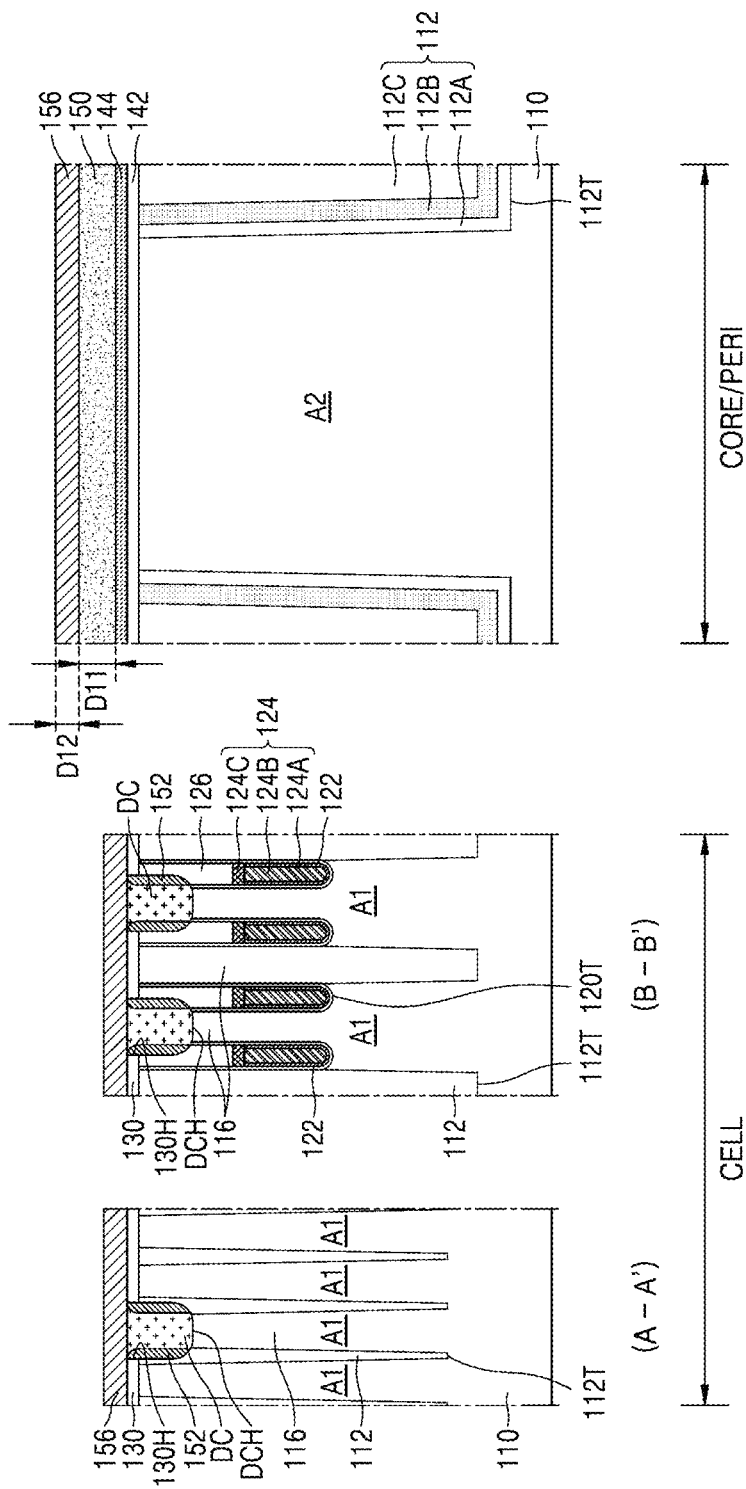

Referring to FIG. 8J, in the cell array area CELL and the peripheral circuit area CORE/PERI, a third doped semiconductor layer 156 is formed over the substrate 110.

The third doped semiconductor layer 156 may include polysilicon doped with a P-type dopant or an N-type dopant. The P-type dopant may include B, In, or combinations thereof. The N-type dopant may include P, As, Sb, or combinations thereof. In some embodiments, the third doped semiconductor layer 156 may include a semiconductor doped at a doping concentration that is higher than the doping concentration of the second doped semiconductor layer 154 constituting the plurality of direct contacts DC. In some embodiments, the third doped semiconductor layer 156 may be doped at a third doping concentration selected from a range of, for example, about $2 \times 10^{20}$ cm$^{-3}$ to about $9 \times 10^{21}$ cm$^{-3}$. The third doping concentration may be equal to or different from the first doping concentration of the first doped semiconductor layer 150. In some embodiments, the third doping concentration may be lower than the first doping concentration. In some other embodiments, the third doping concentration may be higher than the first doping concentration.

In the peripheral circuit area CORE/PERI, a thickness D12 of the third doped semiconductor layer 156 in a direction perpendicular to a top surface of the substrate 110 may be less than a thickness D11 of the first doped semiconductor layer 150 in the direction perpendicular to the top surface of the substrate 110, without being limited thereto. In the first doped semiconductor layer 150 and the third doped semiconductor layer 156, the thickness D12 of the third doped semiconductor layer 156 remaining in the peripheral circuit area CORE/PERI and the cell array area CELL is less than the thickness D11 of the first doped semiconductor layer 150 remaining only in the peripheral circuit area CORE/PERI, whereby, when the plurality of bit line structures BLS (see FIG. 4) each including the third doped semiconductor layer 156 are formed in the cell array area CELL in a subsequent process, thicknesses of conductive layers of the plurality of bit line structures BLS may be reduced. As a result, unwanted parasitic capacitance, which may be generated between the plurality of bit line structures BLS, may be suppressed.

In the cell array area CELL, the third doped semiconductor layer 156 may contact the buffer insulating film 130 and the plurality of direct contacts DC. In the peripheral circuit area CORE/PERI, the third doped semiconductor layer 156 may contact the first doped semiconductor layer 150.

Figure 8K:
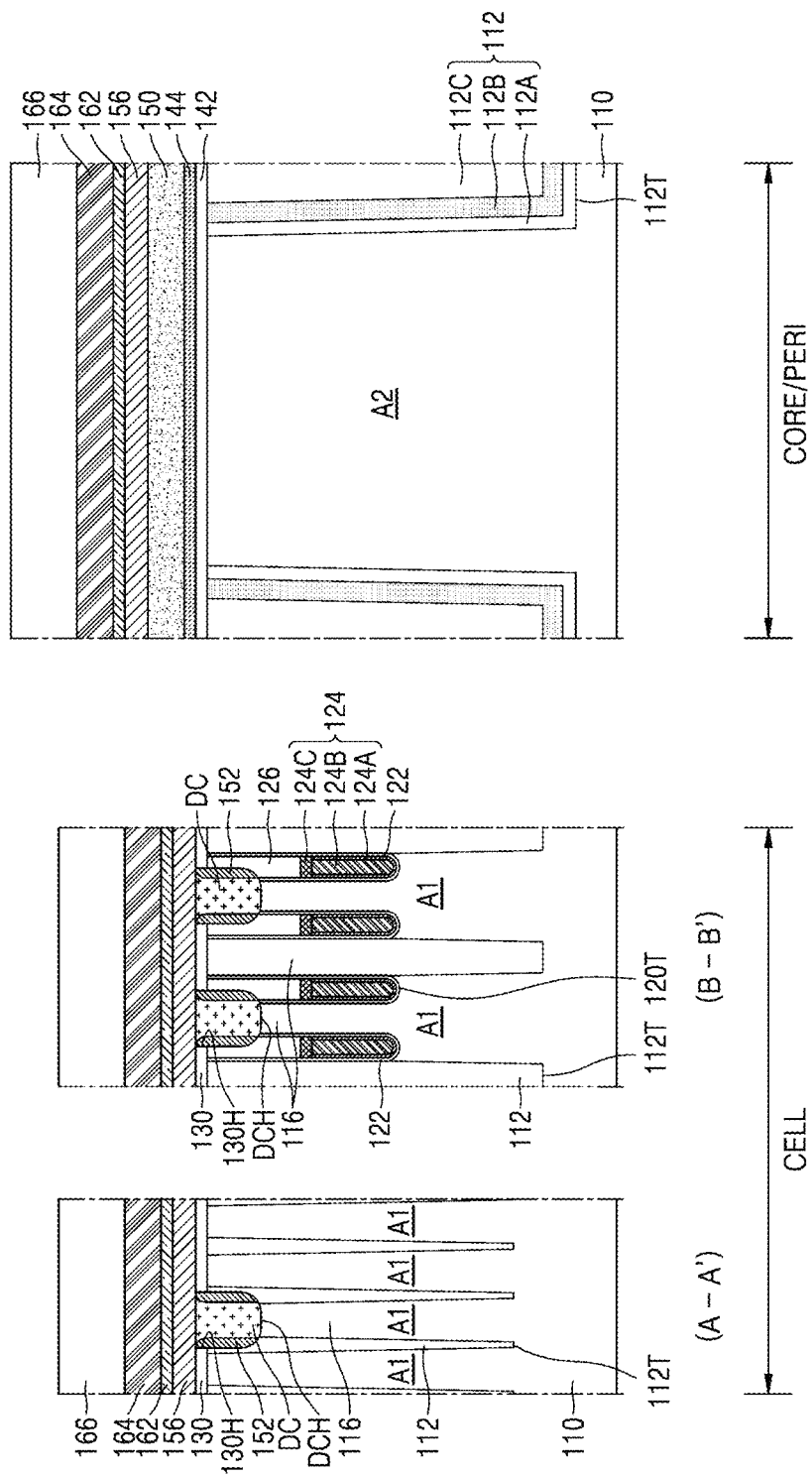

Referring to FIG. 8K, in the cell array area CELL and the peripheral circuit area CORE/PERI, a first conductive layer 162, a second conductive layer 164, and an insulating capping layer 166 are formed on the third doped semiconductor layer 156 in this stated order.

In some embodiments, each of the first conductive layer 162 and the second conductive layer 164 may include TiSiN, TiN, TaN, CoN, a metal, a metal silicide, or combinations thereof. Each of the metal and the metal silicide may include W, Mo, Au, Cu, Al, Ni, or Co. For example, the first conductive layer 162 may include TiSiN, and the second conductive layer 164 may include W. The insulating capping layer 166 may include a silicon nitride film.

Figure 8L:
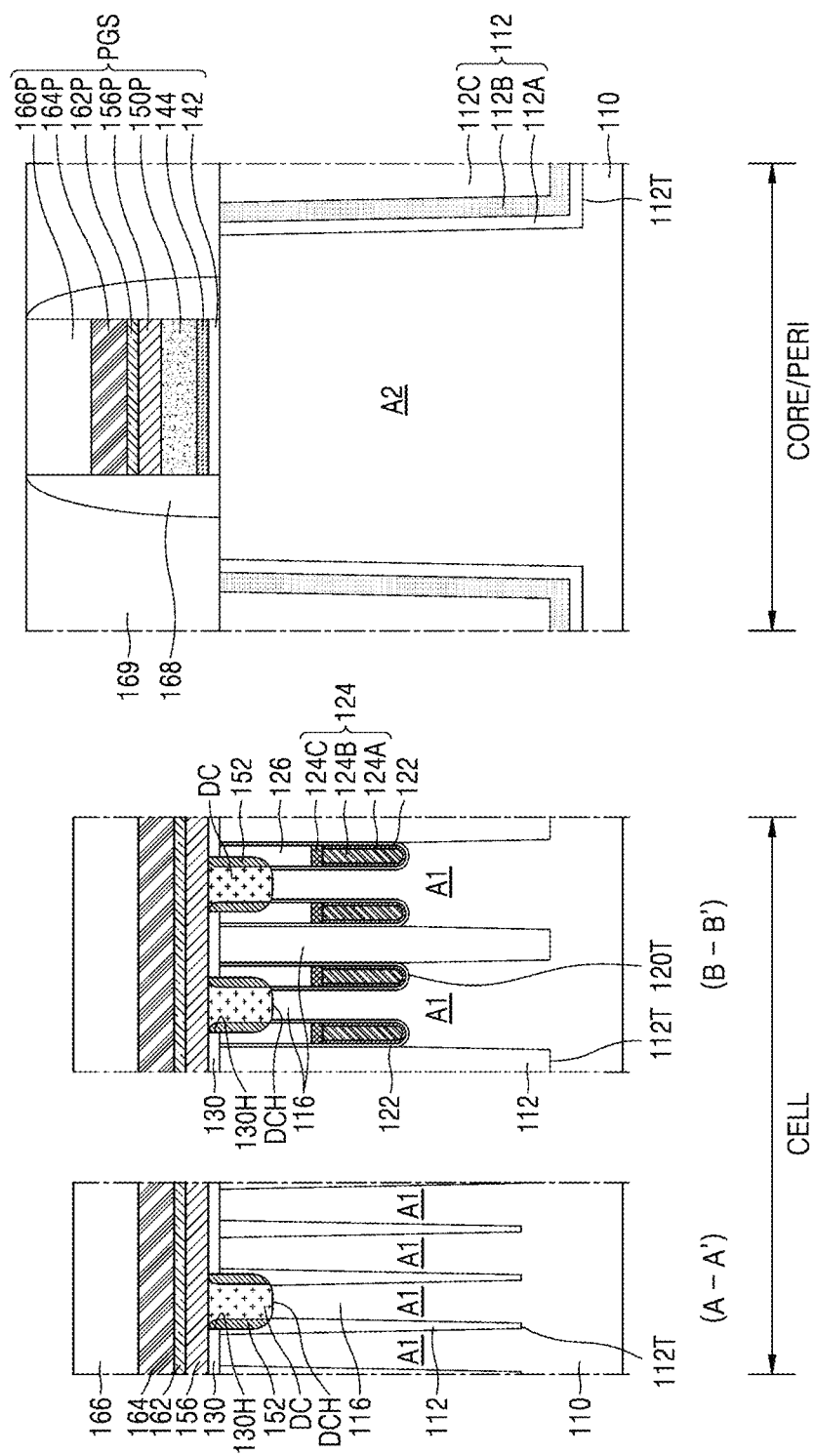

Referring to FIG. 8L, while the cell array area CELL is protected by a mask pattern (not shown), the peripheral circuit gate structure PGS is formed in the peripheral circuit area CORE/PERI by etching a peripheral circuit stack structure in the peripheral circuit area CORE/PERI, the peripheral circuit stack structure including the dielectric layer 142, the metal-containing work function adjusting layer 144, the first doped semiconductor layer 150, the third doped semiconductor layer 156, the first conductive layer 162, the second conductive layer 164, and the insulating capping layer 166. A portion of the first doped semiconductor layer 150 remaining in the peripheral circuit gate structure PGS may be referred to as the first gate semiconductor layer 150P, and a portion of the third doped semiconductor layer 156 remaining in the peripheral circuit gate structure PGS may be referred to as the second gate semiconductor layer 156P. Portions of the first conductive layer 162, the second conductive layer 164, and the insulating capping layer 166, which remain in the peripheral circuit gate structure PGS, may be respectively referred to as the first conductive layer 162P, the second conductive layer 164P, and the insulating capping layer 166P.

The insulating spacer 168 may be formed to cover both sidewalls of the peripheral circuit gate structure PGS, followed by forming the interlayer dielectric 169.

Figure 8M:
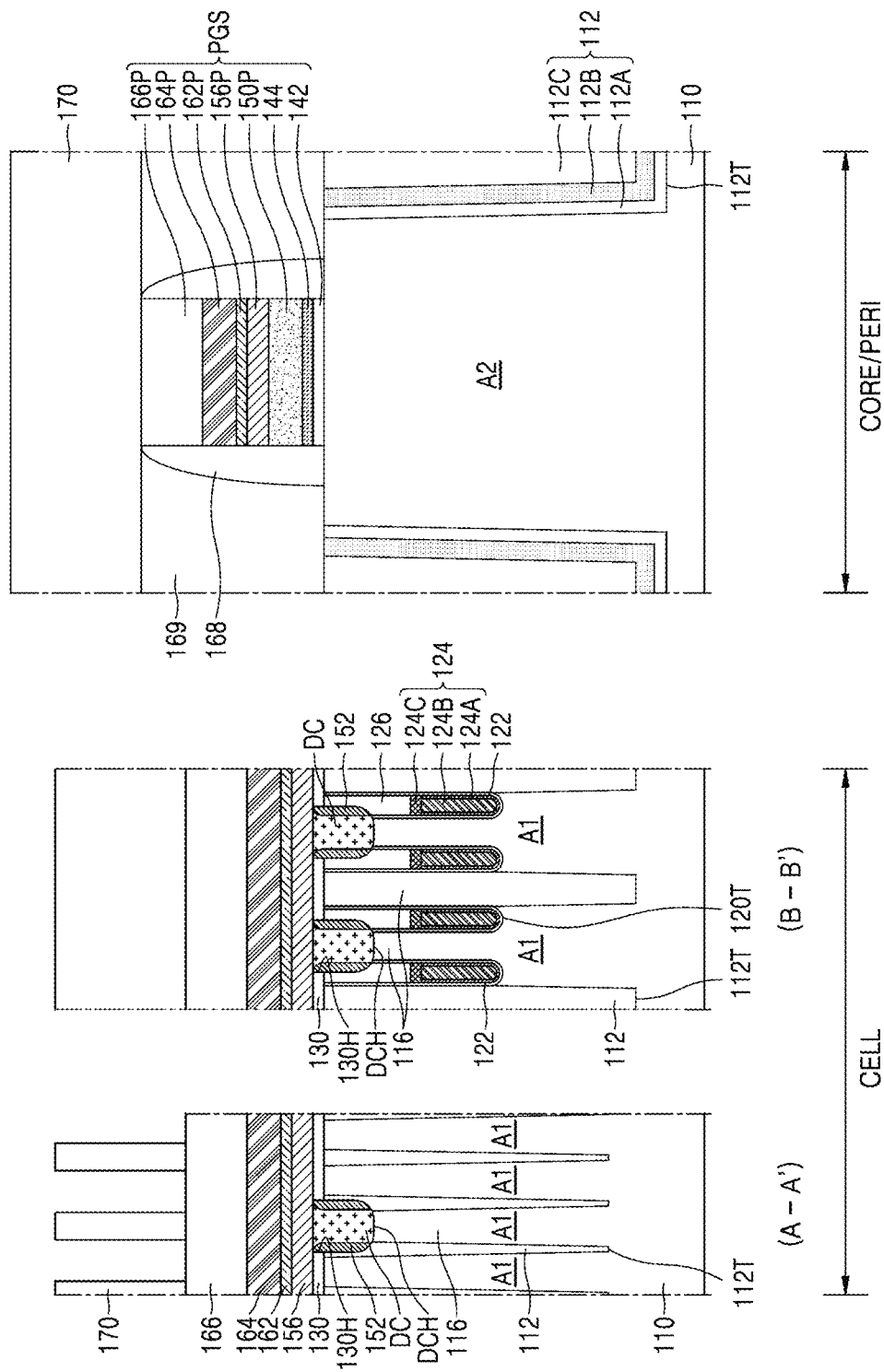

Referring to FIG. 8M, the insulating pattern 170 is formed over the substrate 110. In the peripheral circuit area CORE/PERI, the peripheral circuit gate structure PGS may be protected by the insulating pattern 170. In the cell array area CELL, a top surface of the insulating capping layer 166 may be partially exposed by the insulating pattern 170. The insulating pattern 170 may include a silicon nitride film.

Figure 8N:
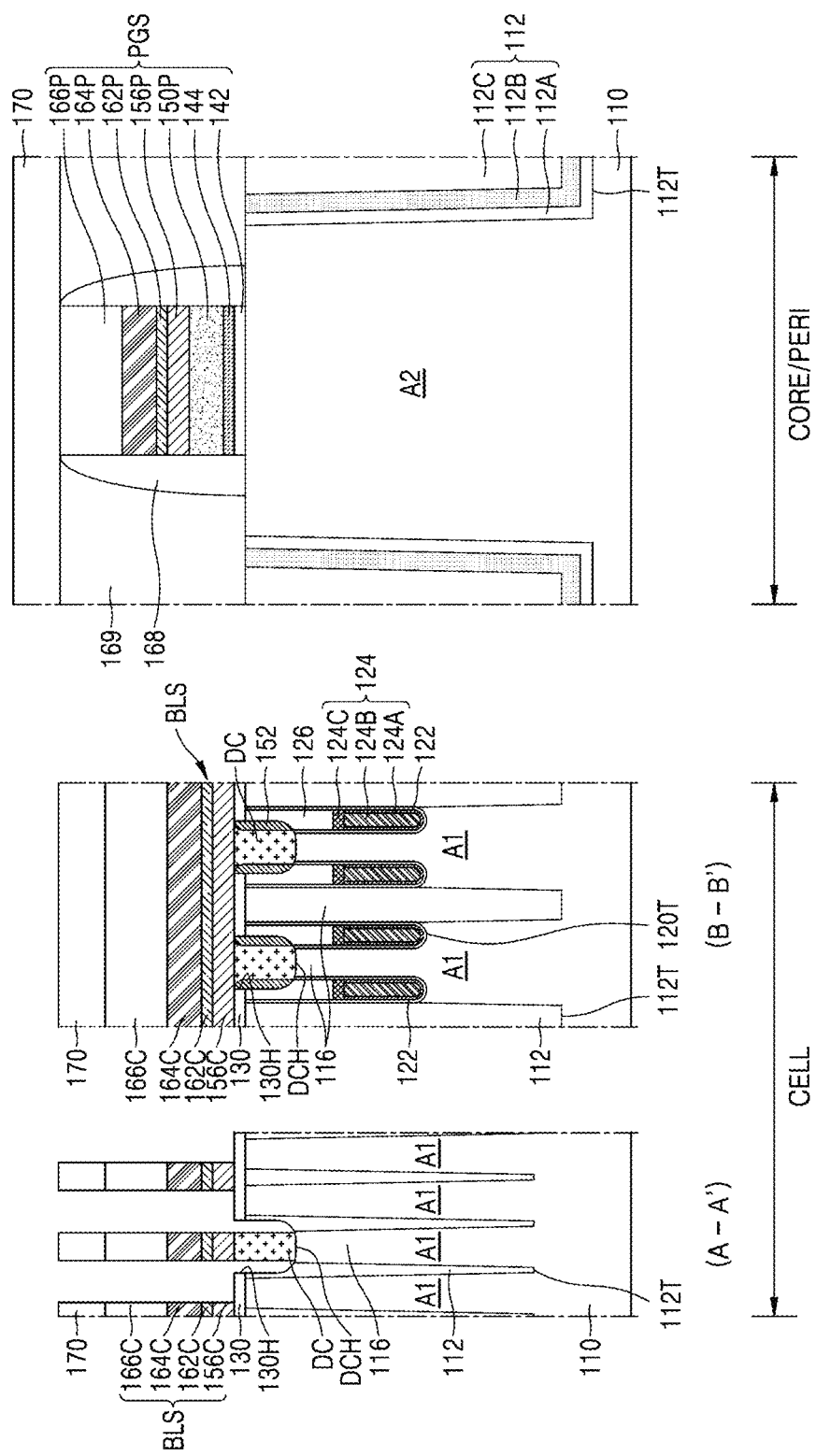

Referring to FIG. 8N, a cell stack structure including the direct contact spacer 152, the direct contact DC, the third doped semiconductor layer 156, the first conductive layer 162, the second conductive layer 164, and the insulating capping layer 166 in the cell array area CELL is etched by using the insulating pattern 170 as an etch mask, thereby forming the plurality of bit line structures BLS, which extend parallel to each other, in the cell array area CELL. A portion of the third doped semiconductor layer 156 remaining in each of the plurality of bit line structures BLS may be referred to as the bit line semiconductor layer 156C. Portions of the first conductive layer 162, the second conductive layer 164, and the insulating capping layer 166, which remain in each of the plurality of bit line structures BLS, may be respectively referred to as the first conductive layer 162C, the second conductive layer 164C, and the insulating capping layer 166C.

While the cell stack structure is etched for forming the plurality of bit line structures BLS, the insulating pattern 170 may be partially removed and thus have a reduced height.

Figure 8O:
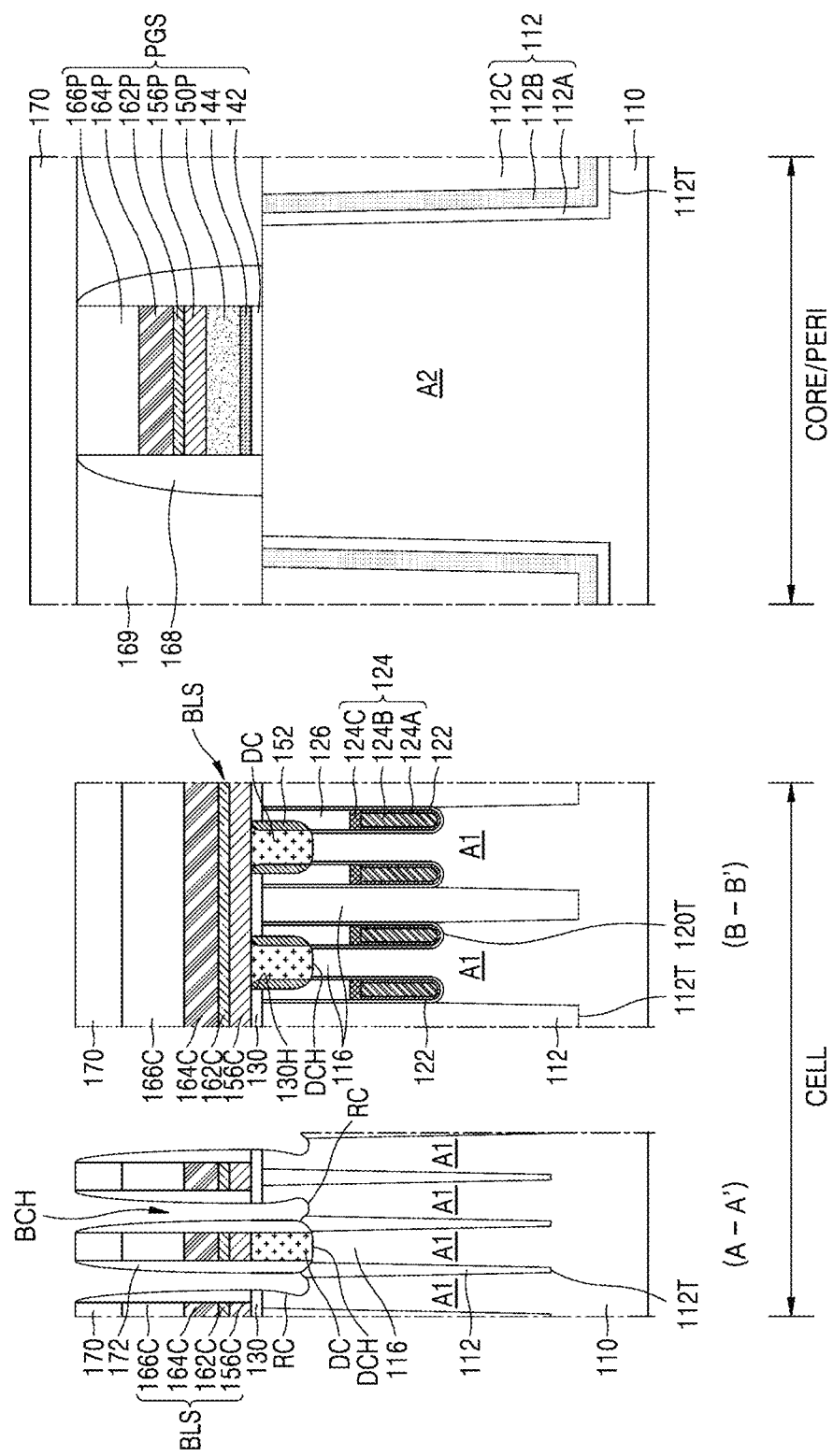

Referring to FIG. 8O, in the cell array area CELL, a plurality of insulating spacers 172 are formed to cover both sidewalls of each of the plurality of bit line structures BLS, and a portion of the substrate 110 and a portion of the device isolation film 112, which are exposed by the plurality of insulating spacers 172, are etched, thereby forming the plurality of recesses RC, which expose the plurality of cell active regions A1. Each of the plurality of recesses RC communicates with a buried contact hole BCH between two adjacent bit line structures BLS, the buried contact hole BCH having a width defined by a pair of insulating spacers 172.

In some embodiments, a spacer insulating film may be formed to cover the plurality of bit line structures BLS, the plurality of insulating spacers 172 may be formed by performing etch-back on the spacer insulating film, and the plurality of recesses RC may be formed by etching a portion of the substrate 110 and a portion of the device isolation film 112 by using the insulating pattern 170 and the plurality of insulating spacers 172 as an etch mask.

Referring to FIG. 8P, the filling conductive layer 182 is formed to fill the plurality of recesses RC between the plurality of bit line structures BLS and partially fill a plurality of buried contact holes BCH between the plurality of bit line structures BLS, and the buried contact structure BCS is formed, the buried contact structure BCS including the metal silicide film 184, the conductive barrier film 186, and the conductive layer 188, which are stacked on the buried contact structure BCS in this stated order. The plurality of buried contact structures BCS may be electrically insulated from each other by forming the insulating film 190 around the conductive barrier film 186 and the conductive layer 188.

During the formation of a plurality of conductive barrier films 186 and the plurality of conductive layers 188 in the cell array area CELL, contact plugs (not shown), which may be electrically connected to the peripheral circuit active region A2, may also be formed in the peripheral circuit area CORE/PERI.

In the cell array area CELL, a plurality of capacitor bottom electrodes, which may be electrically connected to the plurality of conductive layers 188, may be formed on the insulating film 190. As used herein, and unless indicated otherwise, items described as being "electrically connected" are configured such that an electrical signal can be passed from one item to the other. FIGS. 9A to 9E are cross-sectional views illustrating sequential processes of a method of fabricating an integrated circuit device, according to other embodiments of the inventive concept. Another example of a method of fabricating the integrated circuit device 100 shown in FIG. 4 will be described with reference to FIGS. 9A to 9E. In FIGS. 9A to 9E, the same reference numerals as in FIGS. 8A to 8P respectively denote the same members, and repeated descriptions thereof will be omitted.

Figure 9A:
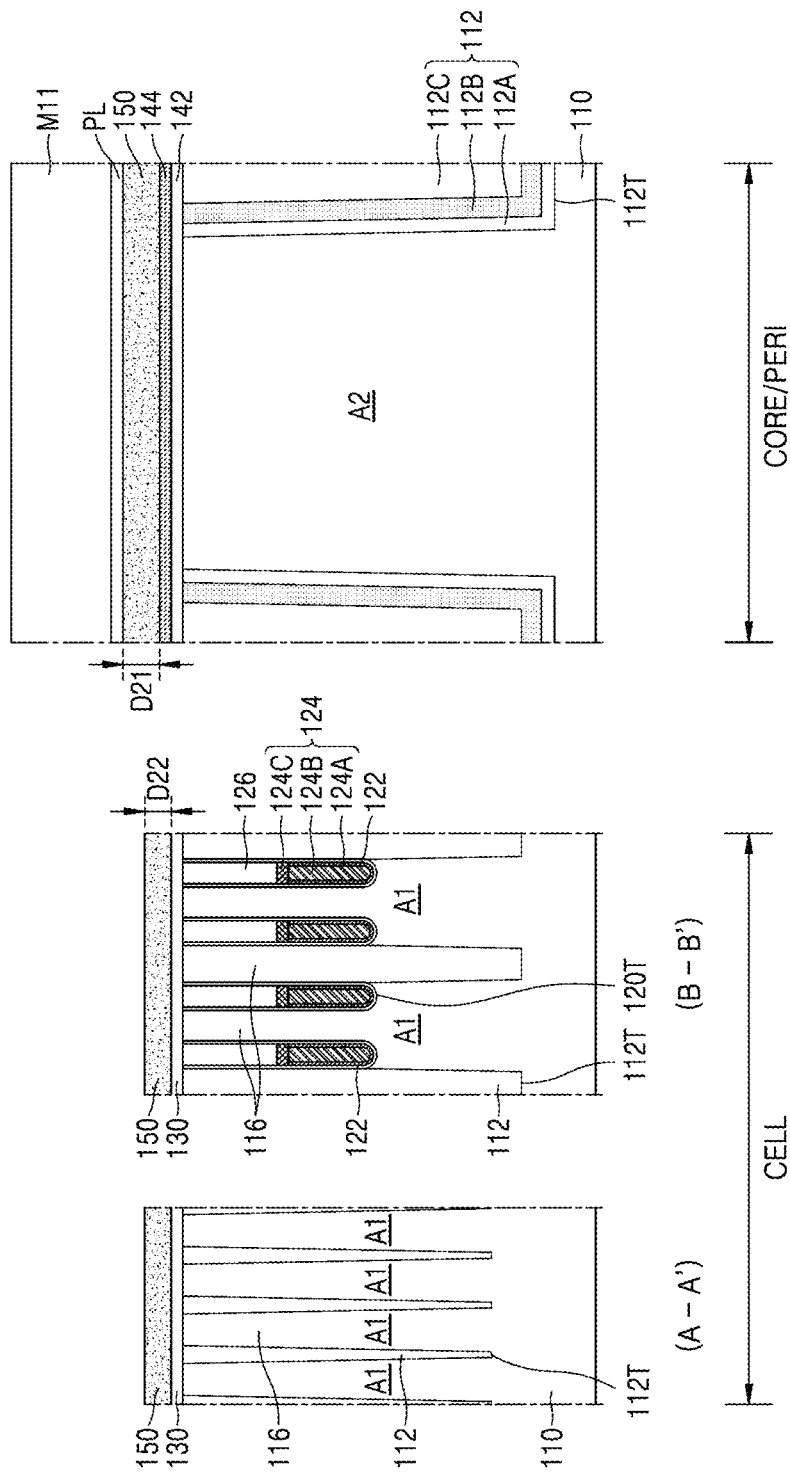

Referring to FIG. 9A, in the same manner as described with reference to FIGS. 8A to 8C, the first doped semiconductor layer 150 and the protective layer PL are formed over the substrate 110 in the cell array area CELL and the peripheral circuit area CORE/PERI, and the first mask pattern M11 is formed to cover the protective layer PL in the peripheral circuit area CORE/PERI. Next, in a similar manner to that described with reference to FIG. 8D, the protective layer PL is removed from the cell array area CELL by using the first mask pattern M11 as an etch mask, thereby exposing the first doped semiconductor layer 150. During the removal of the protective layer PL, the first doped semiconductor layer 150 in the cell array area CELL may be partially etched due to over-etch. As a result, a thickness D22 of the first doped semiconductor layer 150 in the cell array area CELL may be less than a thickness D21 of the first doped semiconductor layer 150 in the peripheral circuit area CORE/PERI.

Referring to FIG. 9B, the first mask pattern M11 (see FIG. 9A) remaining on the protective layer PL is removed from the peripheral circuit area CORE/PERI, followed by forming the plurality of direct contact holes DCH in the cell array area CELL in a similar manner to that described with reference to FIG. 8E, the plurality of direct contact holes DCH exposing the cell active regions A1.

To form the plurality of direct contact holes DCH, the second mask pattern M12 may be formed to cover the first doped semiconductor layer 150 in the cell array area CELL and the protective layer PL in the peripheral circuit area CORE/PERI, and each of the first doped semiconductor layer 150, the buffer insulating film 130, the substrate 110, and the device isolation film 112 in the cell array area CELL may be partially etched by using the second mask pattern M12 as an etch mask.

Figure 9C:
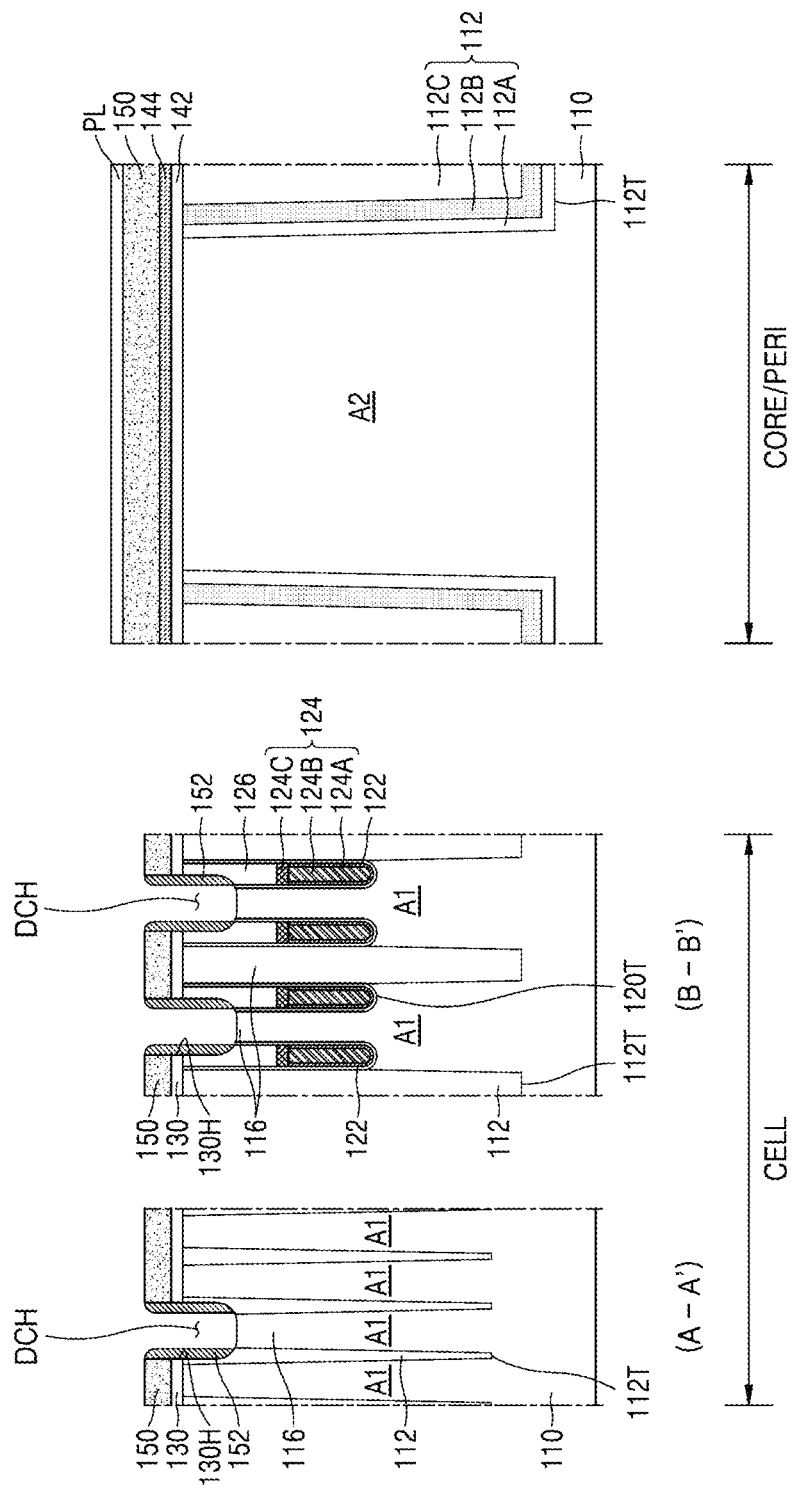

Referring to FIG. 9C, the second mask pattern M12 is removed in a similar manner to that described with reference to FIG. 8F, followed by forming the plurality of direct contact spacers 152 in the cell array area CELL. The plurality of direct contact spacers 152 may cover the inner sidewalls of the plurality of direct contact holes DCH, the inner sidewalls of the plurality of holes 130H formed in the buffer insulating film 130, and a sidewall of the first doped semiconductor layer 150 remaining in the cell array area CELL.

Figure 9D:
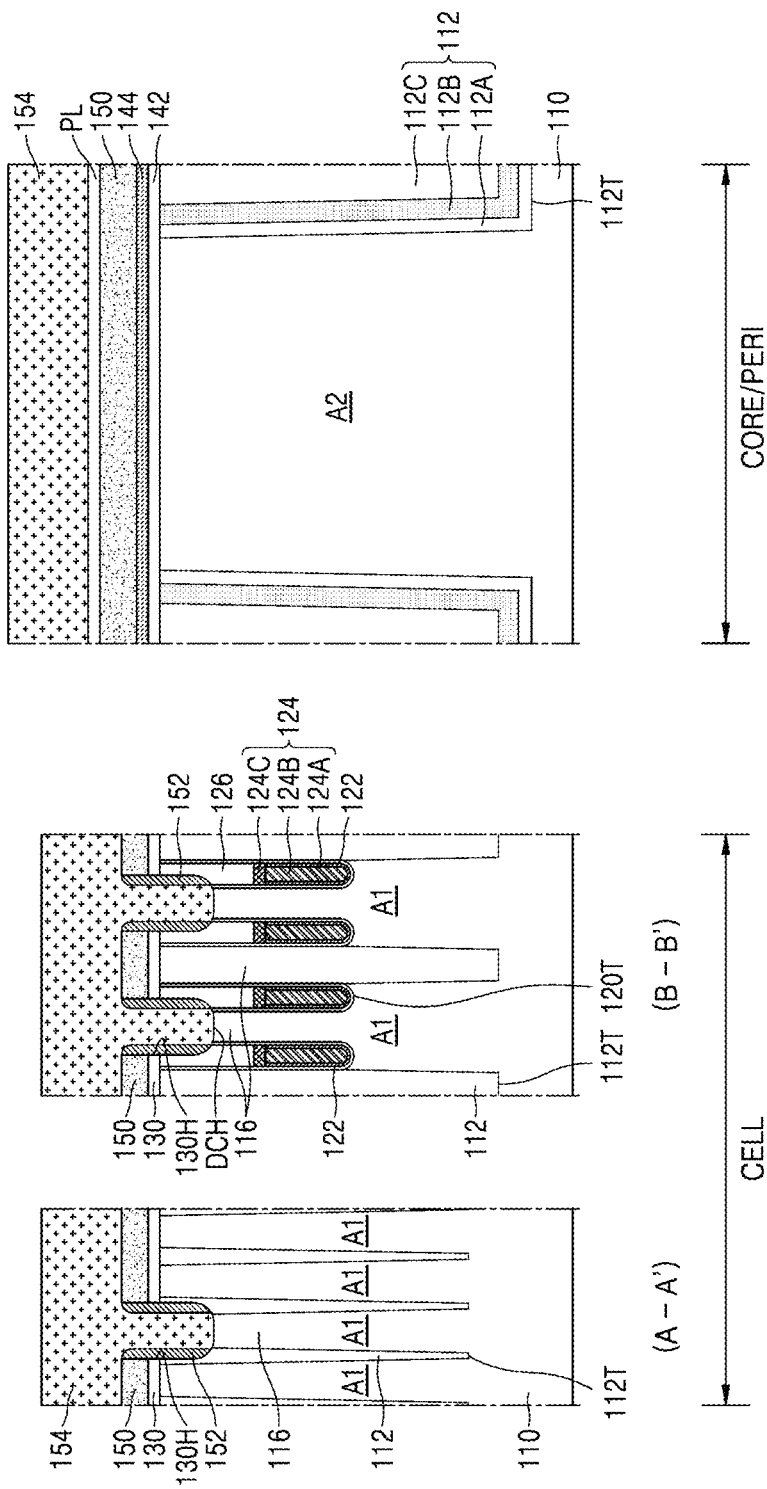

Referring to FIG. 9D, in a similar manner to that described with reference to FIG. 8G, while the protective layer PL covers the first doped semiconductor layer 150 in the peripheral circuit area CORE/PERI, the second doped semiconductor layer 154 is formed in the cell array area CELL.

Figure 9E:
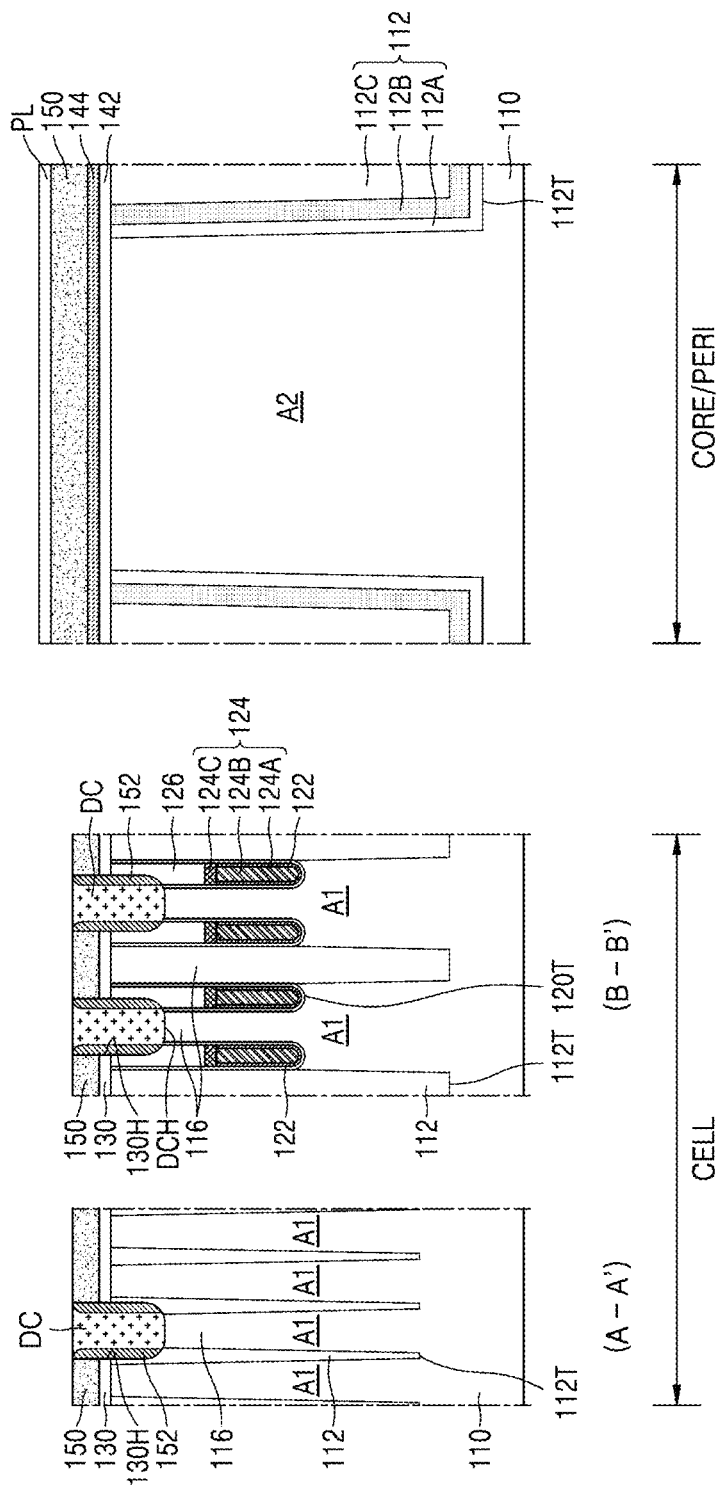

Referring to FIG. 9E, in a similar manner to that described with reference to FIG. 8H, the second doped semiconductor layer 154 in the cell array area CELL and the peripheral circuit area CORE/PERI is etched back, thereby forming the plurality of direct contacts DC. However, during the etch-back of the second doped semiconductor layer 154, the first doped semiconductor layer 150 remaining in the cell array area CELL is also removed, thereby exposing the top surface of the buffer insulating film 130.

Next, the processes described with reference to FIGS. 8I to 8P may be performed, thereby fabricating the integrated circuit device 100.

Although examples of methods of fabricating the integrated circuit device 100 shown in FIG. 4 have been described with reference to FIGS. 8A to 8P and FIGS. 9A to 9E, various changes may be made to the method described with reference to FIGS. 8A to 8P and the method described with reference to FIGS. 9A to 9E without departing from the spirit and scope of the inventive concept.

In some embodiments, in the process described with reference to FIG. 8C, the process of forming the protective layer PL may be omitted. In this exemplary embodiment, in the peripheral circuit area CORE/PERI, the first mask pattern M11 shown in FIGS. 8C and 9A may be formed on the first doped semiconductor layer 150 so that a bottom surface of the first mask pattern M11 contacts a top surface of the first doped semiconductor layer 150 and the second mask pattern M12 shown in FIGS. 8E and 9B may be formed directly on the first doped semiconductor layer 150 so that a bottom surface of the second mask pattern M12 contacts a top surface of the first doped semiconductor layer 150. In addition, the processes described with reference to FIGS. 8F to 8H and the processes described with reference to FIGS. 9C to 9E may be performed without the protective layer PL.

Figure 10B:
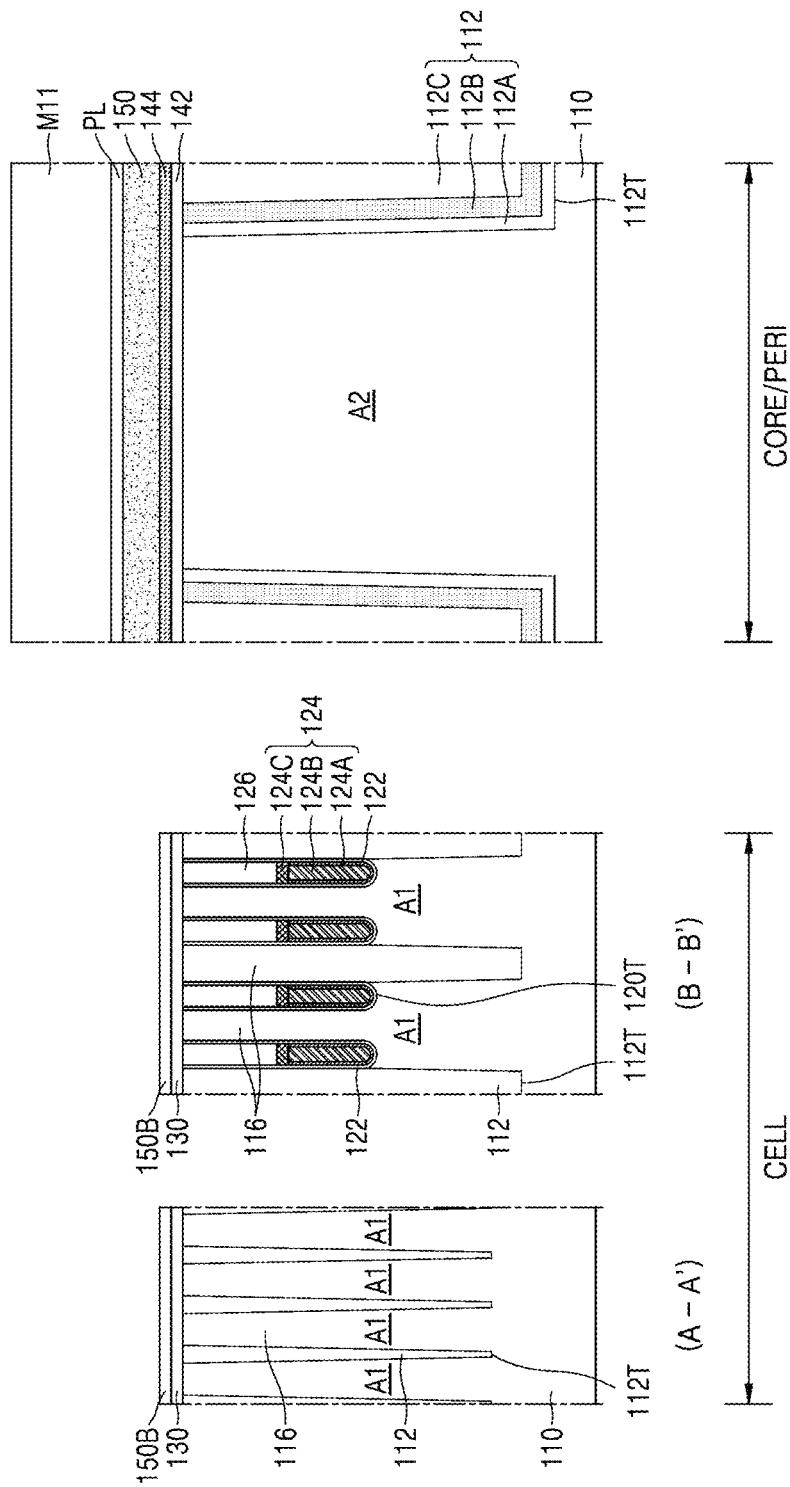
Figure 10C:
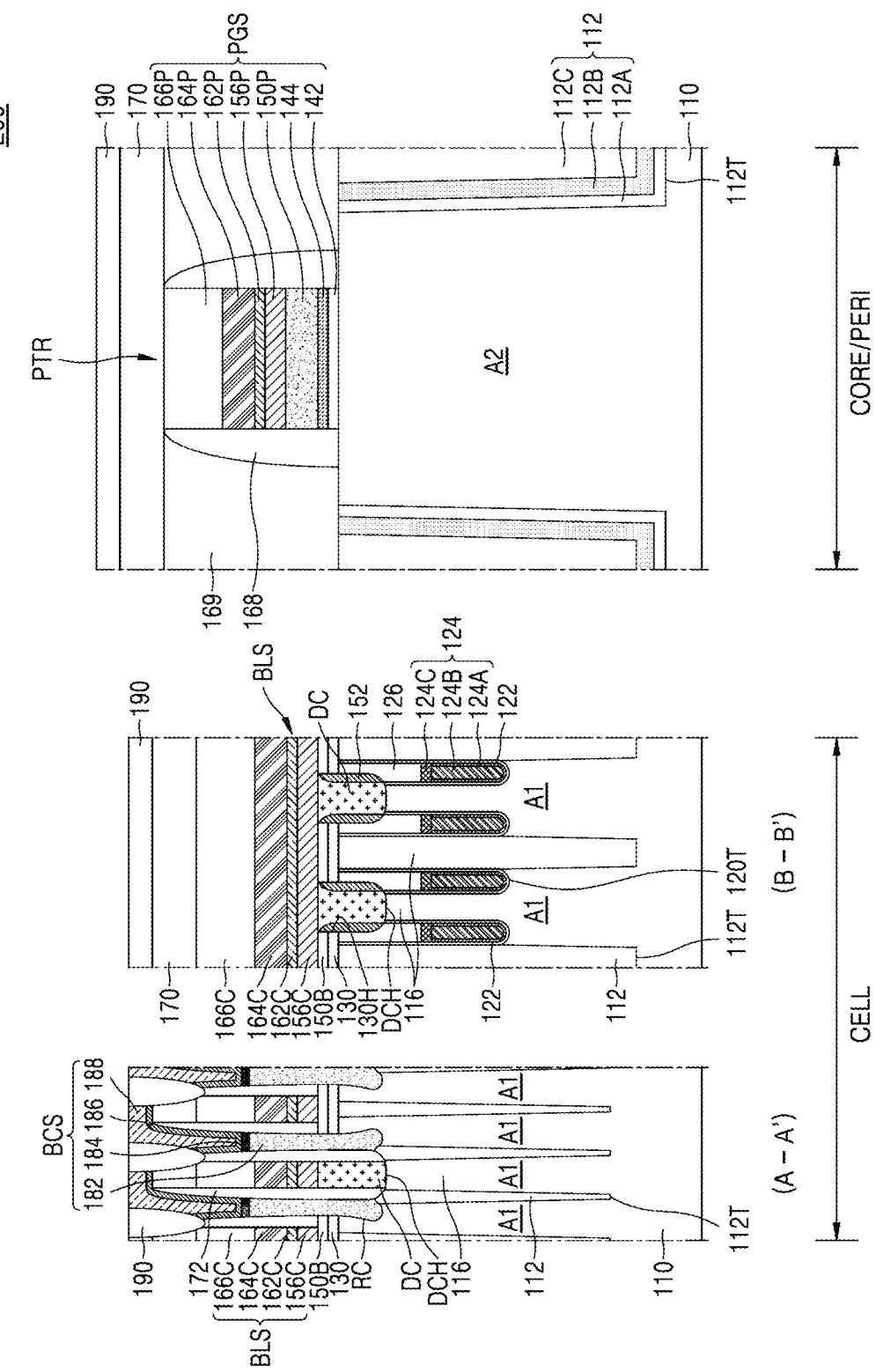

FIGS. 10A to 10C are cross-sectional views illustrating sequential processes of a method of fabricating an integrated circuit device, according to yet other embodiments of the inventive concept. An example of a method of fabricating the integrated circuit device 200 shown in FIG. 5 will be described with reference to FIGS. 10A to 10C. In FIGS. 10A to 10C, the same reference numerals as in FIGS. 8A to 8P respectively denote the same members, and repeated descriptions thereof will be omitted.

Referring to FIG. 10A, in the same manner as described with reference to FIGS. 8A to 8C, the first doped semiconductor layer 150 and the protective layer PL, which extend over the substrate 110 in the cell array area CELL and the peripheral circuit area CORE/PERI, and the first mask pattern M11, which covers the protective layer PL in the peripheral circuit area CORE/PERI, are formed, followed by anisotropically etching the protective layer PL and the first doped semiconductor layer 150 in the cell array area CELL by using the first mask pattern M11 as an etch mask, in a similar manner to that described with reference to FIG. 8D. However, in the present example, the first doped semiconductor layer 150 is removed only as much as a certain thickness rather than completely removed from the cell array area CELL, thereby leaving a first doped semiconductor residual film 150A on the buffer insulating film 130, the first doped semiconductor residual film 150A being a residual portion of the first doped semiconductor layer 150. Although FIG. 10A illustrates an example in which the first doped semiconductor residual film 150A completely covers the top surface of the buffer insulating film 130, the inventive concept is not limited to the example shown in FIG. 10A. For example, the first doped semiconductor residual film 150A may expose a portion of the top surface of the buffer insulating film 130 instead of completely covering the top surface of the buffer insulating film 130. The first doped semiconductor residual film 150A may include doped polysilicon.

Referring to FIG. 10B, while, in the peripheral circuit area CORE/PERI, the protective layer PL is covered with the first mask pattern M11, the first doped semiconductor residual film 150A (see FIG. 10A) in the cell array area CELL is oxidized, thereby forming a semiconductor oxide film 150B.

In some embodiments, to form the semiconductor oxide film 150B, a plasma oxidation process or a thermal oxidation process may be used.

Referring to FIG. 10C, the first mask pattern M11 remaining on the protective layer PL is removed from a result product of FIG. 10B, followed by performing the processes described with reference to FIGS. 8E to 8P, thereby fabricating the integrated circuit device 200.

FIGS. 11A to 11E are cross-sectional views illustrating sequential processes of a method of fabricating an integrated circuit device, according to yet other embodiments of the inventive concept. An example of a method of fabricating the integrated circuit device 300 shown in FIG. 6 will be described with reference to FIGS. 11A to 11E. In FIGS. 11A to 11E, the same reference numerals as in FIGS. 8A to 8P respectively denote the same members, and repeated descriptions thereof will be omitted.

Figure 11A:
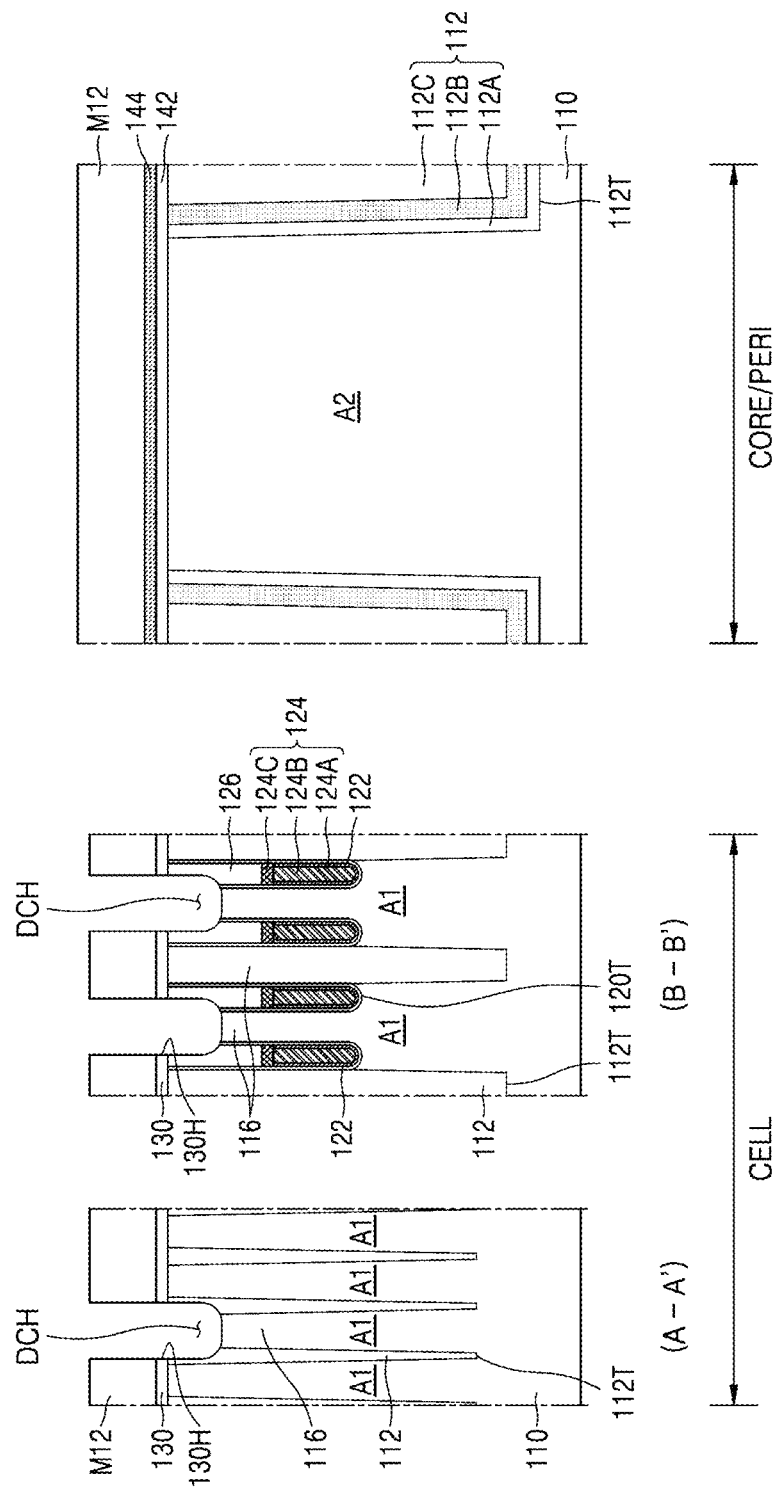
FIGS. 11A to 11E are cross-sectional views illustrating sequential processes of a method of fabricating an integrated circuit device, according to yet other embodiments of the inventive concept.

Referring to FIG. 11A, in the same manner as described with reference to FIGS. 8A and 8B, the buffer insulating film 130 is formed on the substrate 110 in the cell array area CELL, and the dielectric layer 142 and the metal-containing work function adjusting layer 144 are formed on the substrate 110 in the peripheral circuit area CORE/PERI in this stated order, followed by forming the plurality of direct contact holes DCH in a similar manner to that described with reference to FIG. 8E by using the second mask pattern M12, the plurality of direct contact holes DCH exposing the cell active regions A1.

In the peripheral circuit area CORE/PERI, the second mask pattern M12 may be formed directly on the metal-containing work function adjusting layer 144 so that a bottom surface of the second mask pattern M12 contacts a top surface of the metal-containing work function adjusting layer 144. In some embodiments, the metal-containing work function adjusting layer 144 may be omitted. In this case, in the peripheral circuit area CORE/PERI, the second mask pattern M12 may be formed directly on the dielectric layer 142 so that a bottom surface of the second mask pattern M12 contacts a top surface of the dielectric layer 142.

Figure 11B:
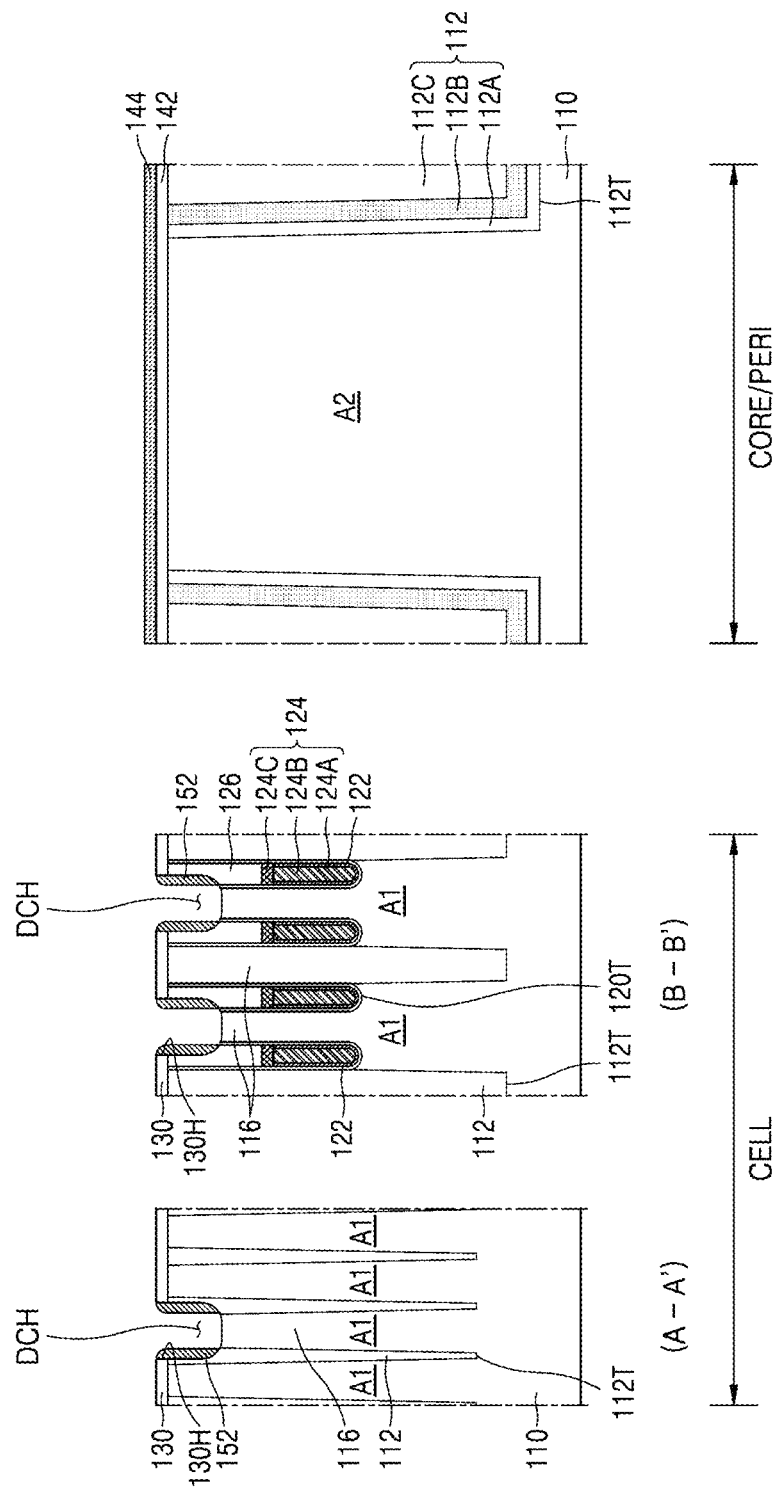

Referring to FIG. 11B, the buffer insulating film 130 in the cell array area CELL and the metal-containing work function adjusting layer 144 in the peripheral circuit area CORE/PERI are exposed by removing the second mask pattern M12 from a result product of FIG. 11A, followed by forming the plurality of direct contact spacers 152 in the cell array area CELL in a similar manner to that described with reference to FIG. 8F. In some embodiments, the process of forming the direct contact spacers 152, which has been described with reference to FIG. 11B, may be omitted.

Figure 11C:
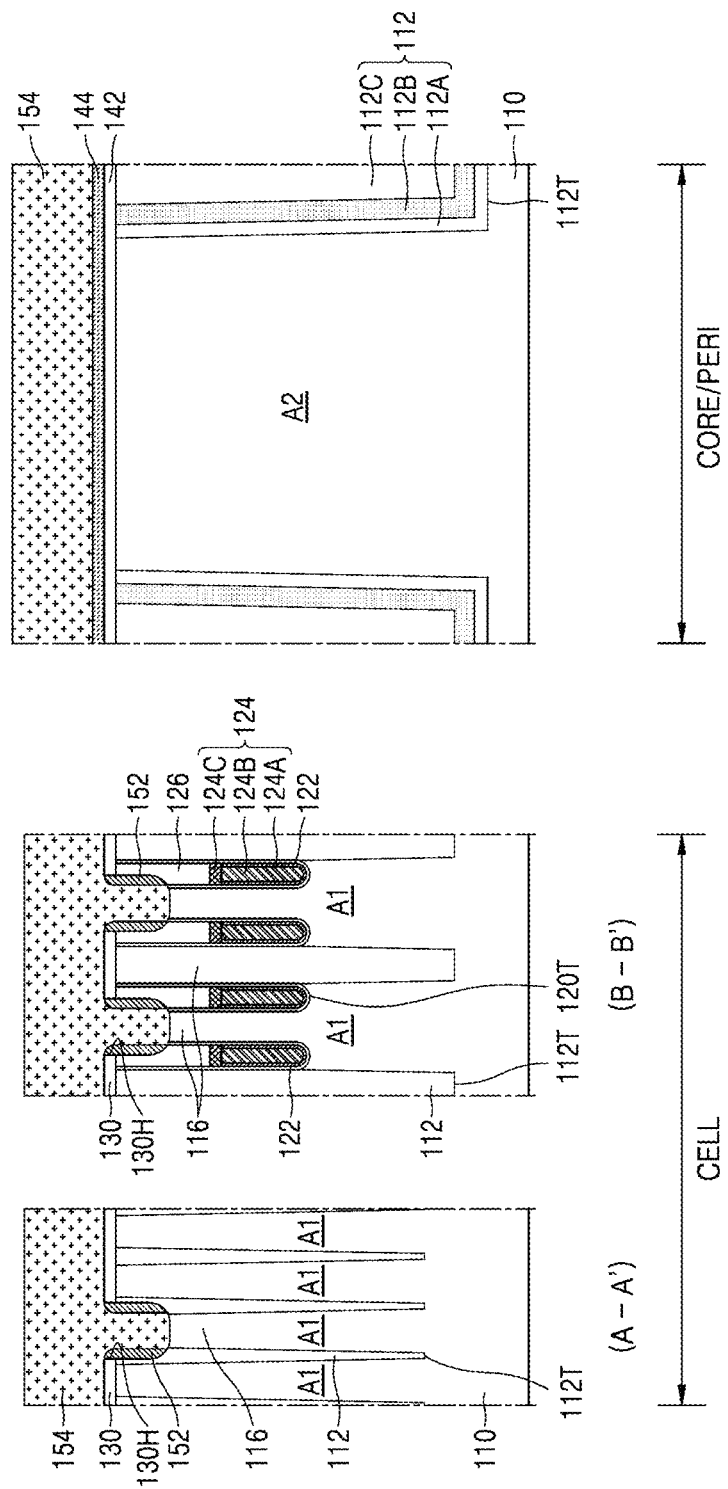

Referring to FIG. 11C, in a similar manner to that described with reference to FIG. 8G, the second doped semiconductor layer 154 is formed on a result product of FIG. 11B.

In the peripheral circuit area CORE/PERI, the second doped semiconductor layer 154 may be formed directly on the metal-containing work function adjusting layer 144 so that a bottom surface of the second doped semiconductor layer 154 contacts a top surface of the metal-containing work function adjusting layer 144. In the case where the metal-containing work function adjusting layer 144 is omitted, the second doped semiconductor layer 154 may be formed directly on the dielectric layer 142 in the peripheral circuit area CORE/PERI so that a bottom surface of the second doped semiconductor layer 154 contacts a top surface of the dielectric layer 142.

Figure 11D:
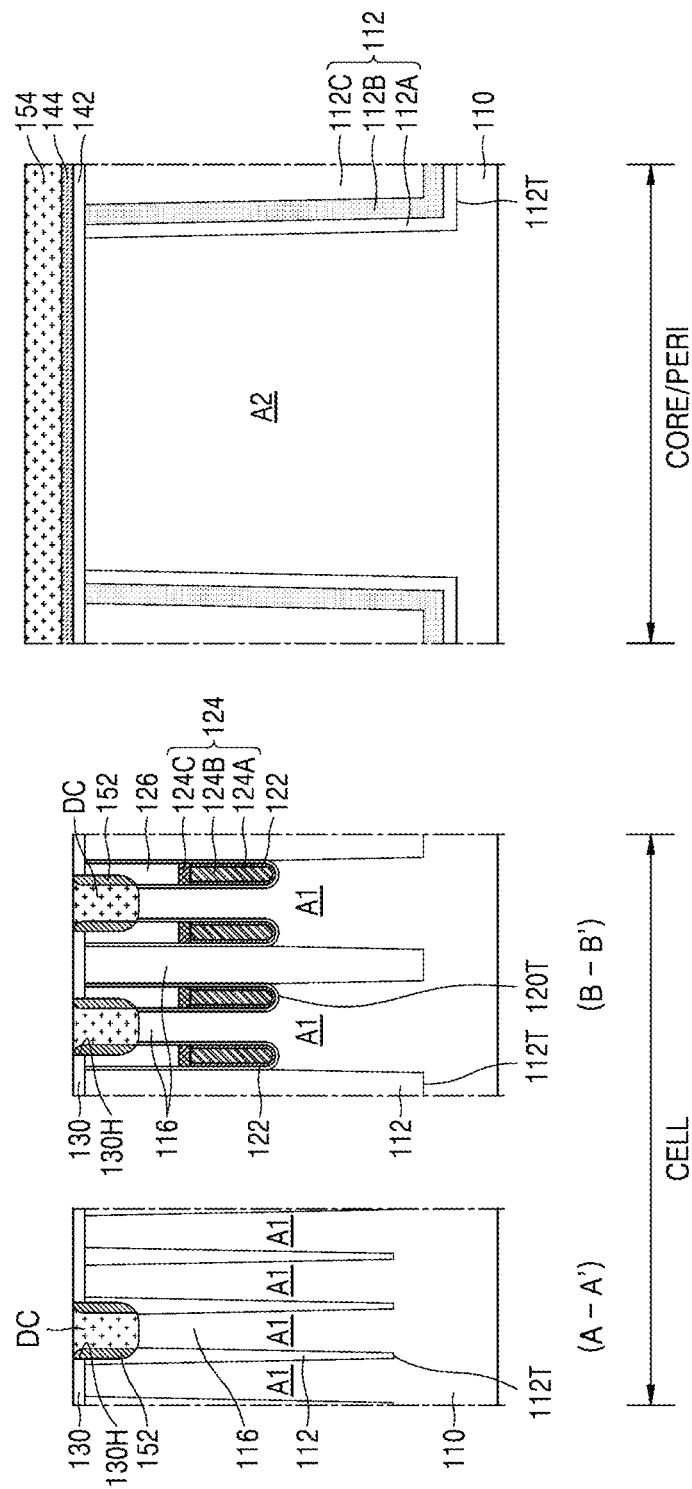

Referring to FIG. 11D, in a similar manner to that described with reference to FIG. 8H, the second doped semiconductor layer 154 in the cell array area CELL and the peripheral circuit area CORE/PERI is etched back. However, in the present example, the direct contacts DC are formed from the second doped semiconductor layer 154 in the cell array area CELL, and a residual portion of the second doped semiconductor layer 154 remains on the metal-containing work function adjusting layer 144 in the peripheral circuit area CORE/PERI. In the case where the metal-containing work function adjusting layer 144 is omitted, the residual portion of the second doped semiconductor layer 154 may remain directly on the dielectric layer 142 in the peripheral circuit area CORE/PERI so that the residual portion of the second doped semiconductor layer 154 contacts a top surface of the dielectric layer 142. In some embodiments, the residual portion of the second doped semiconductor layer 154 may have a thickness of about 100 Å to about 250 Å, without being limited thereto.

Figure 11E:
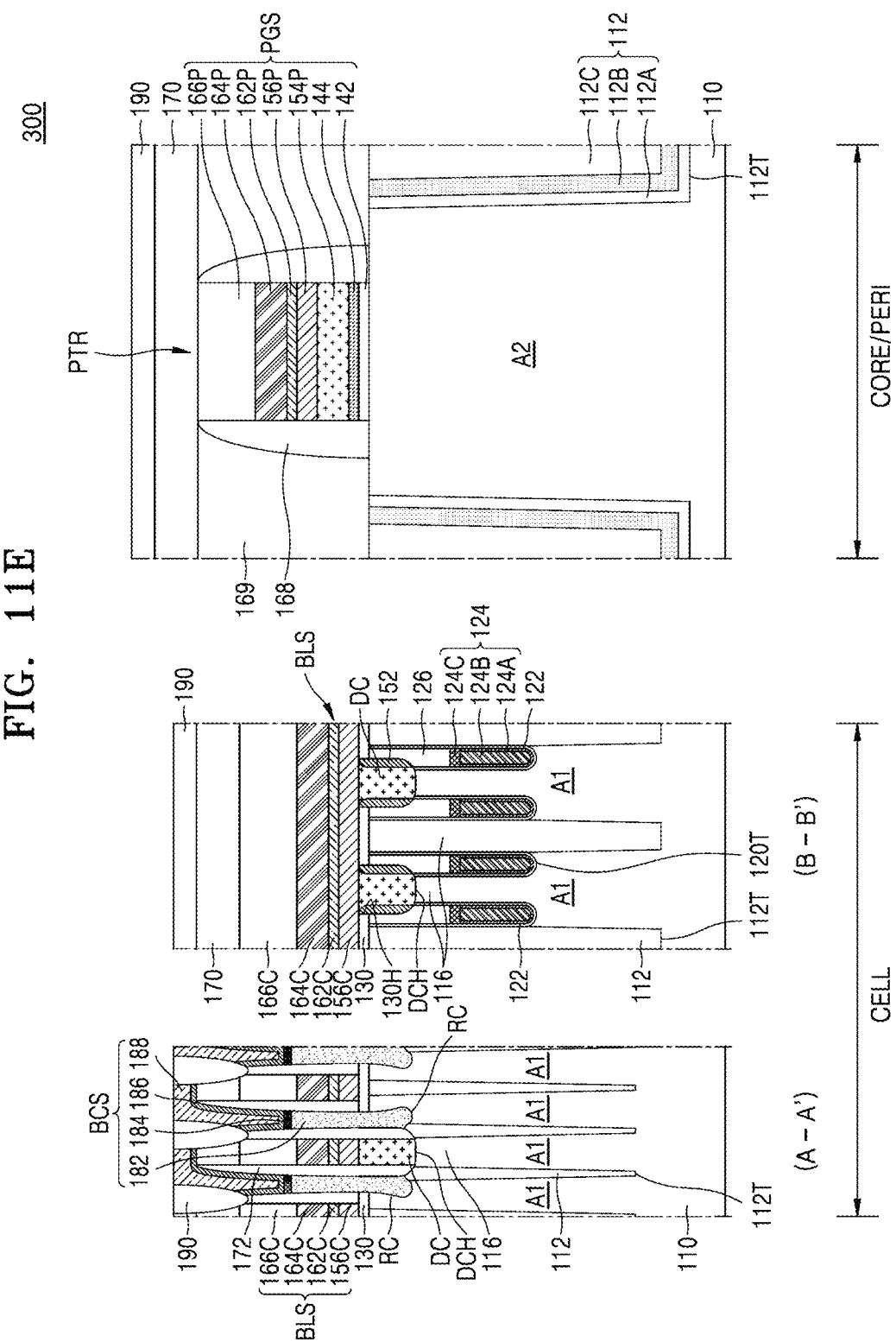

Referring to FIG. 11E, the processes described with reference to FIGS. 8J to 8P may be performed on a result product of FIG. 11D, thereby fabricating the integrated circuit device 300. In the result product of FIG. 11D, the first gate semiconductor layer 154P of the peripheral gate structure PGS may be obtained from the residual portion of the second doped semiconductor layer 154 remaining on the metal-containing work function adjusting layer 144.

FIGS. 12A to 12F are cross-sectional views illustrating sequential processes of a method of fabricating an integrated circuit device, according to yet other embodiments of the inventive concept. An example of a method of fabricating the integrated circuit device 400 shown in FIG. 7 will be described with reference to FIGS. 12A to 12F. In FIGS. 12A to 12F, the cell array area CELL, the peripheral circuit area CORE/PERI, and the interface area INTERFACE adjacent to a cross-sectional region of the cell array area CELL taken along the line B-B' of FIG. 3 are illustrated. The interface area INTERFACE may be a portion of the interface area 26 described with reference to FIG. 2. In FIGS. 12A to 12F, the same reference numerals as in FIGS. 8A to 8P respectively denote the same members, and repeated descriptions thereof will be omitted.

Figure 12A:
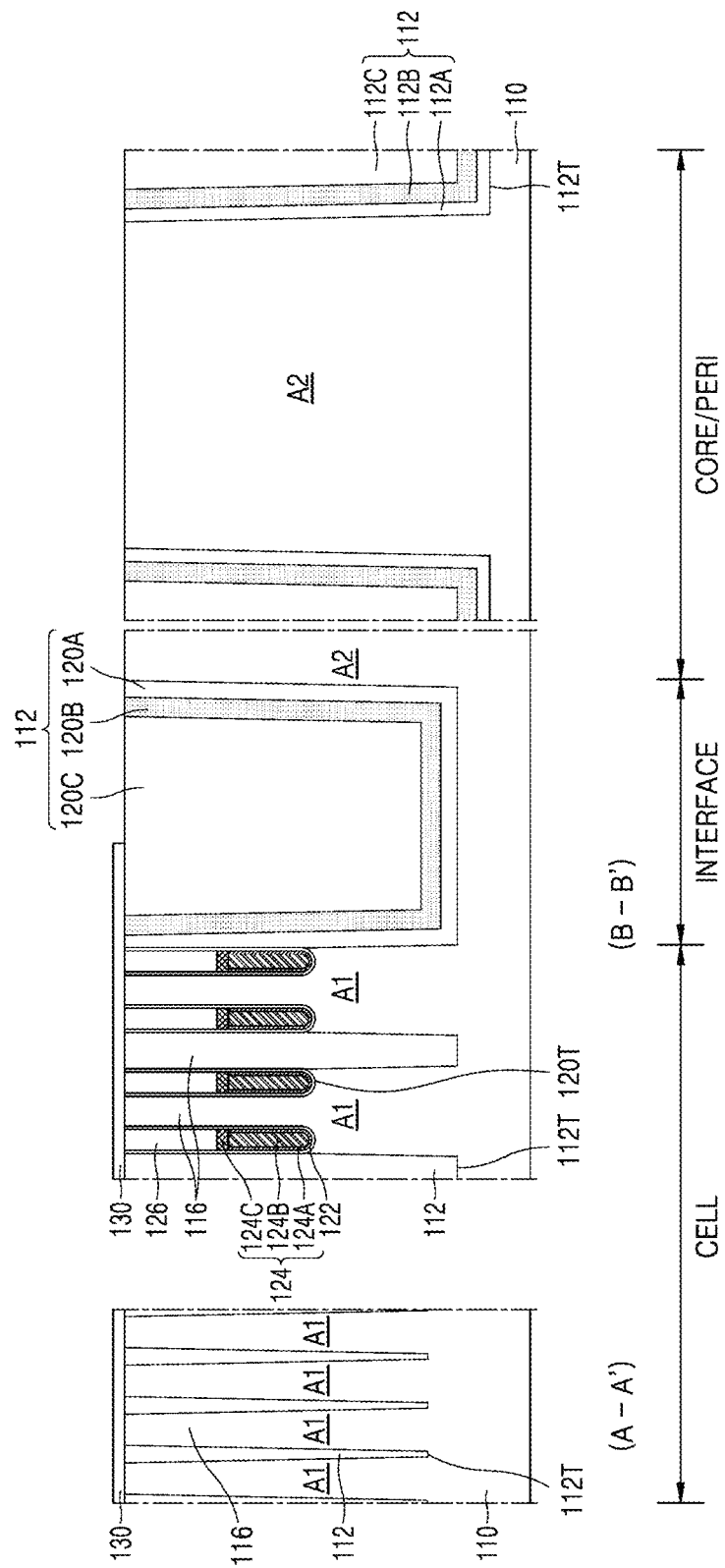
FIGS. 12A to 12F are cross-sectional views illustrating sequential processes of a method of fabricating an integrated circuit device, according to yet other embodiments of the inventive concept.

Referring to FIG. 12A, in a similar manner to that described with reference to FIGS. 8A and 8B, the buffer insulating film 130 is formed on the substrate 110. However, in the present example, the buffer insulating film 130 may extend from the cell array area CELL to the interface area INTERFACE. The buffer insulating film 130 may cover only a portion of the top surface of the device isolation film 112 in the interface area INTERFACE.

In the present example, the buffer insulating film 130 may include a silicon oxide film.

Figure 12B:
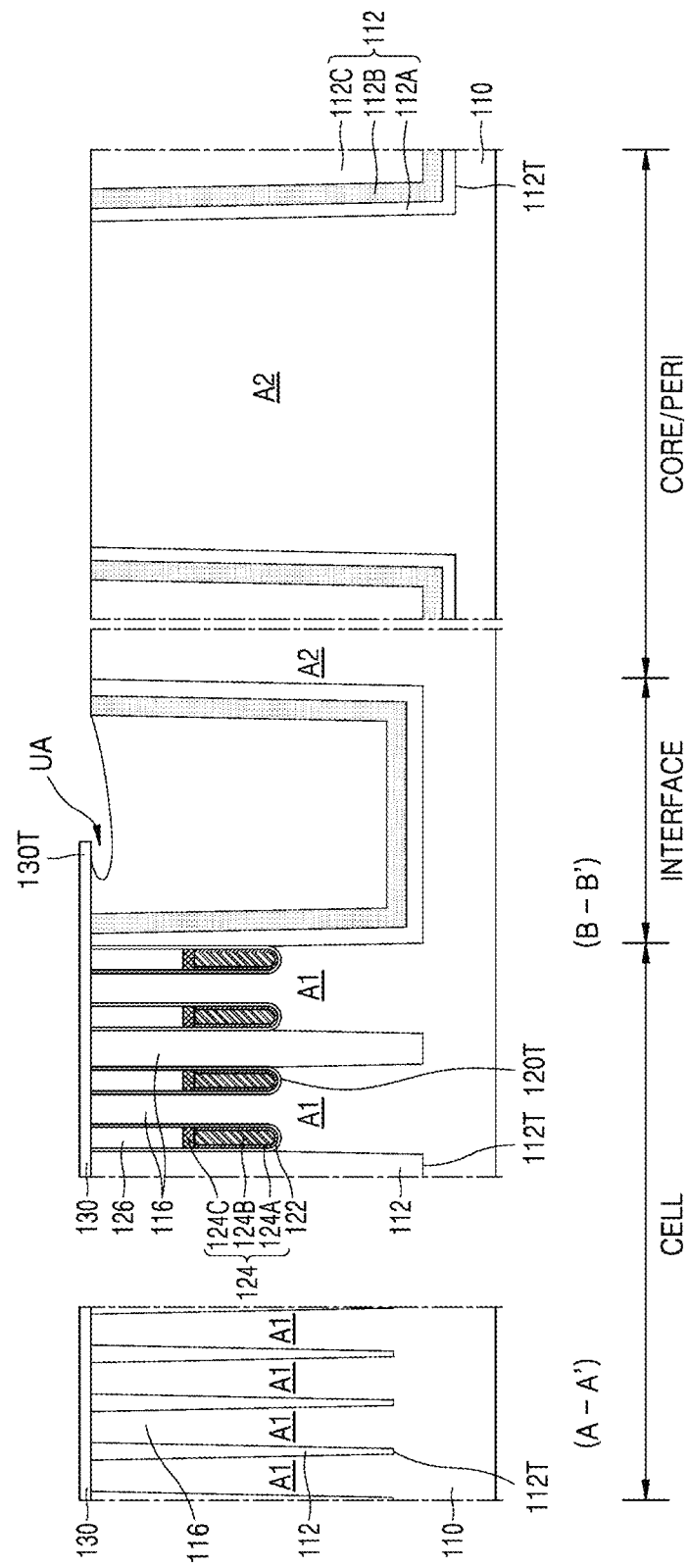

Referring to FIG. 12B, in the peripheral circuit area CORE/PERI, an exposed surface of the peripheral circuit active region A2 is cleaned, thereby removing an unwanted natural oxide film on the peripheral circuit active region A2.

In some embodiments, to clean the exposed surface of the peripheral circuit active region A2, a plasma dry cleaning process or a wet cleaning process may be used. In the plasma dry cleaning process, hydrogen gas may be used as a cleaning gas. The wet cleaning process may be performed by using an HF solution. During the cleaning of the exposed surface of the peripheral circuit active region A2, a portion of the interface area INTERFACE and the peripheral circuit area CORE/PERI may be exposed to a cleaning atmosphere, and as a result, a portion of the device isolation film 112 in the interface area INTERFACE may be removed due to the cleaning atmosphere. In particular, in the interface area INTERFACE, since a cleaning etchant may penetrate into an interface between the buffer insulating film 130 and the filling insulating film 112C which is under the end portion 130T of the buffer insulating film 130 and constitutes the device isolation film 112, a portion of the filling insulating film 112C under the end portion 130T of the buffer insulating film 130 may be removed, and as a result, the undercut region UA may be formed under the end portion 130T of the buffer insulating film 130.

Figure 12C:
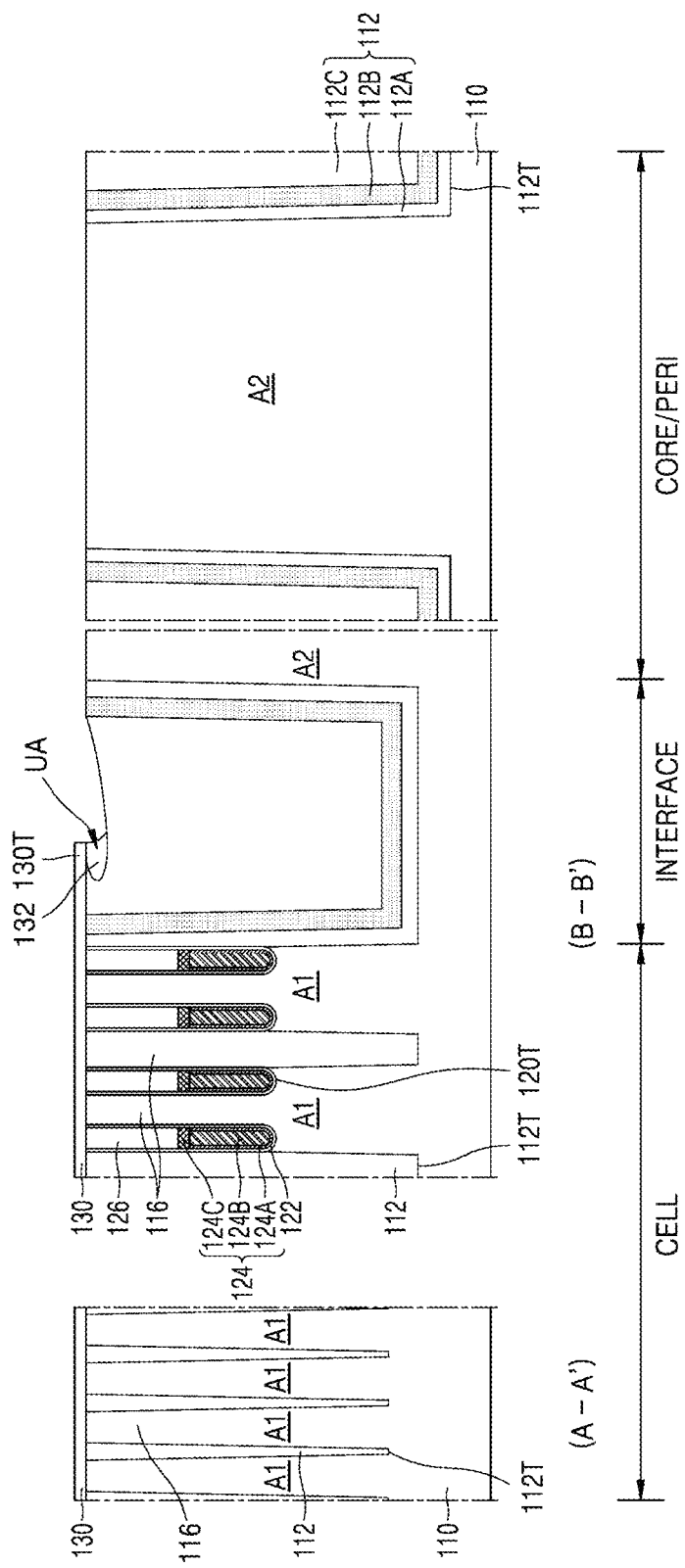

Referring to FIG. 12C, the filling insulating pattern 132 is formed to fill the undercut region UA in a result product of FIG. 12B.

In some embodiments, to form the filling insulating pattern 132, an insulating film may be formed on an entire surface of the result product of FIG. 12B to a thickness sufficient to fill the undercut region UA, followed by performing etch-back on the insulating film such that only a portion of the insulating film filling the undercut region UA remains. The insulating film may include a silicon oxide film.

Figure 12D:
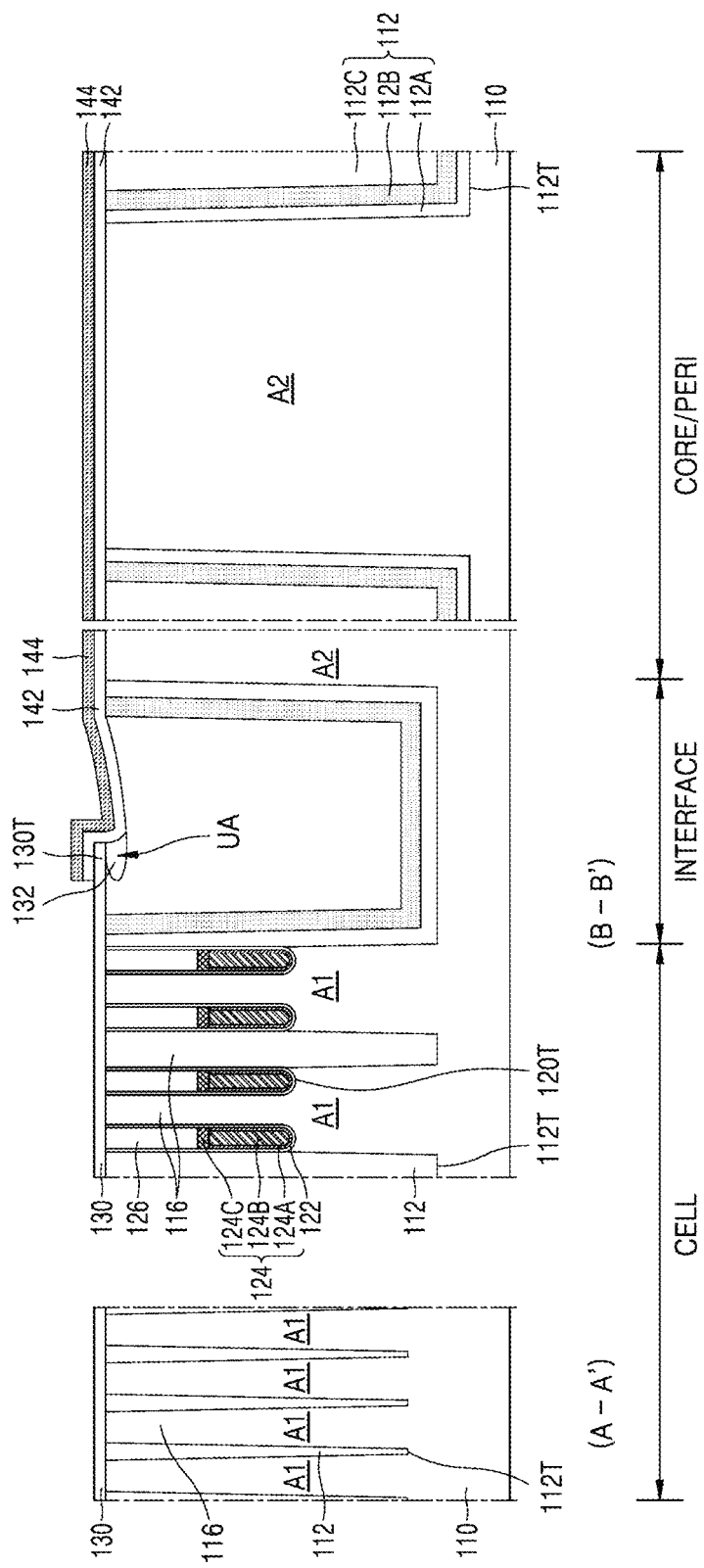

Referring to FIG. 12D, in a similar manner to that described with reference to FIG. 8B, the dielectric layer 142 and the metal-containing work function adjusting layer 144 are formed on the substrate 110 in the peripheral circuit area CORE/PERI. However, in the present example, the dielectric layer 142 and the metal-containing work function adjusting layer 144 may be formed to extend from the peripheral circuit area CORE/PERI to a portion of the interface area INTERFACE.

Figure 12E:
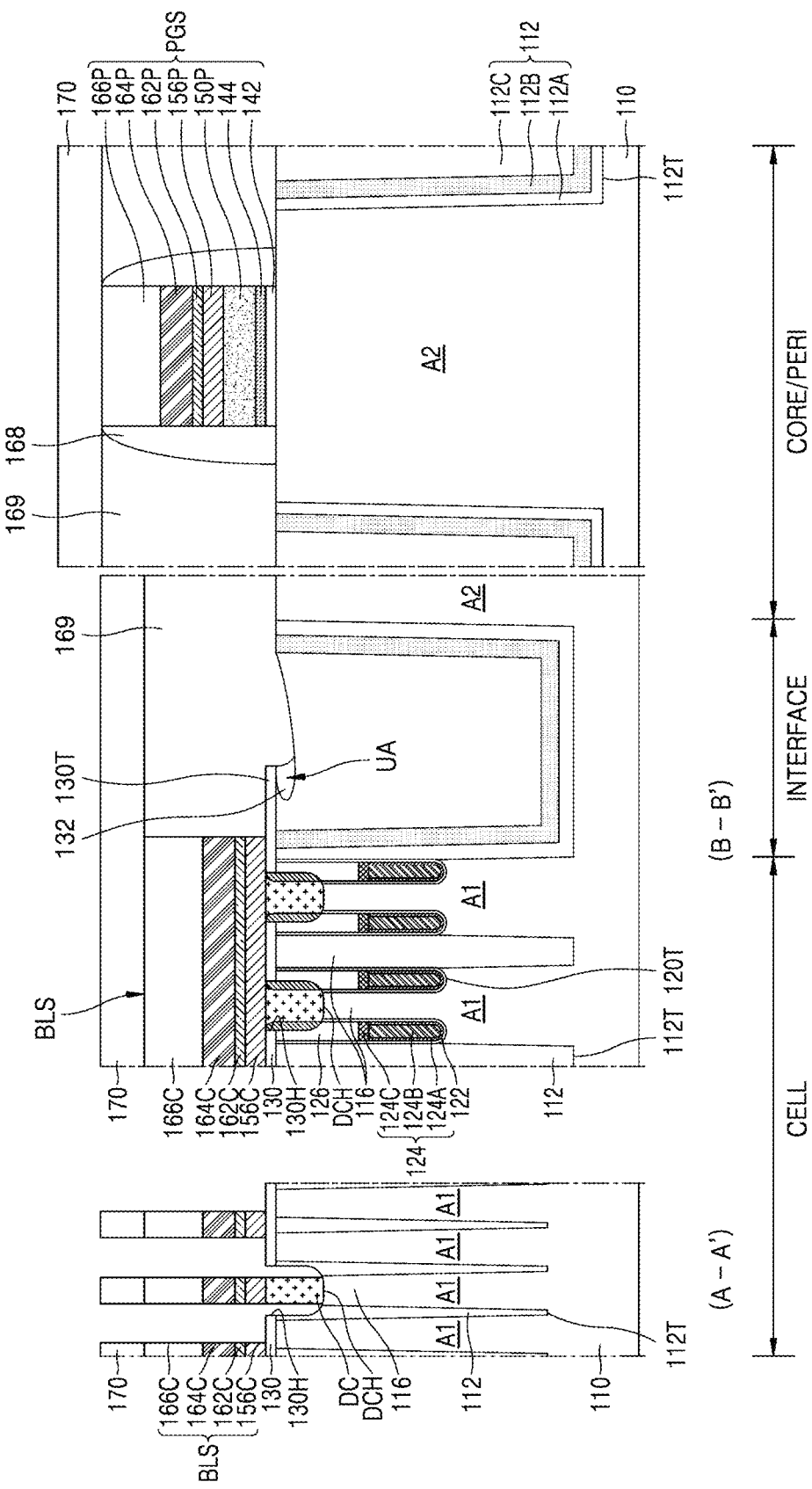

Referring to FIG. 12E, the processes described with reference to FIGS. 8C to 8N are performed on a result product of FIG. 12D, thereby forming the peripheral circuit gate structure PGS in the peripheral circuit area CORE/PERI and forming the plurality of bit line structures BLS in the cell array area CELL.

In a patterning process for forming the peripheral circuit gate structure PGS in the peripheral circuit area CORE/PERI, the dielectric layer 142 and the metal-containing work function adjusting layer 144 in the interface area INTERFACE may be removed. The end portion 130T of the buffer insulating film 130 and the filling insulating pattern 132 in the interface area INTERFACE may be covered with the interlayer dielectric 169.

Figure 12F:
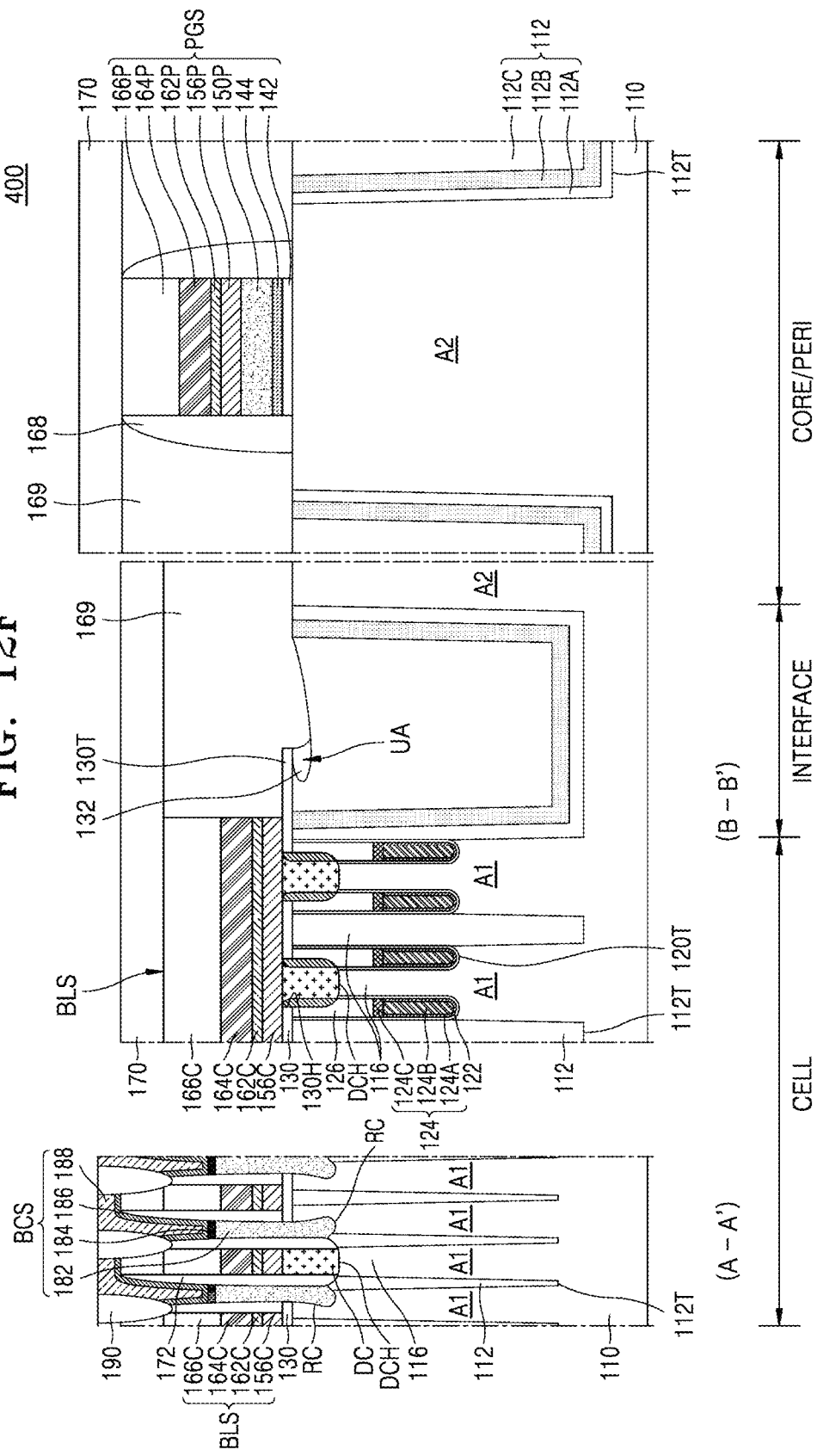

Referring to FIG. 12F, the processes described with reference to FIGS. 8O and 8P may be performed on a result product of FIG. 12E, thereby fabricating the integrated circuit device 400.

According to the integrated circuit device 100, 200, 300, or 400 described with reference to FIGS. 4 to 7, to prevent formation of seams in the direct contact hole DCH when doped polysilicon is deposited for forming the direct contacts DC in the cell array area CELL by utilizing the processes described above with reference to FIGS. 8A to 12F, an aspect ratio of a structure including the direct contact hole DCH exposed during the deposition of the polysilicon is reduced compared to conventional process of forming the direct contacts DC, and a doping concentration of the polysilicon is reduced, compared to conventional process, to control step coverage properties. Thus, according to the processed described above with respect to FIGS. 8A to 12F, the direct contact DC having a seamless and stable structure may be provided in the cell array area CELL, and the bit line structure BLS, which may include the bit line semiconductor layer 156C having a reduced thickness and thus suppress parasitic capacitance, may be provided. In addition, according to the processes described with reference to FIGS. 8A to 12F, in performing a process of forming a direct contact DC and a bit line structure BLS in the cell array area CELL simultaneously with a process of forming a peripheral circuit transistor PTR in a peripheral circuit area CORE/PERI, since a seam-free process is applied to form the direct contact DC, the peripheral circuit transistor PTR in the peripheral circuit area CORE/PERI may have a stack structure including two polysilicon layers that have different doping concentrations from each other. Thus, the reliability of the integrated circuit device 100, 200, 300, or 400 may be improved.

While the inventive concept has been particularly shown and described with reference to embodiments thereof, it will be understood that various changes in form and details may be made therein without departing from the spirit and scope of the following claims.

What is claimed is:

1. An integrated circuit device comprising:
a substrate having a cell array area and a peripheral circuit area, the cell array area comprising a first active region, and the peripheral circuit area comprising a second active region;
a direct contact connected to the first active region in the cell array area;
a bit line structure including a bit line doped semiconductor layer connected to the direct contact in the cell array area; and
a peripheral circuit gate structure on the second active region in the peripheral circuit area,
wherein the peripheral circuit gate structure comprises two doped semiconductor layers each being doped with a charge carrier impurity having different doping concentrations from each other.

2. The integrated circuit device according to claim 1,
wherein the two doped semiconductor layers comprised in the peripheral circuit gate structure comprise a first gate semiconductor layer having a first doping concentration,
wherein the direct contact comprises a contact semiconductor layer having a second doping concentration that is lower than the first doping concentration, and
wherein the bit line doped semiconductor layer has a third doping concentration that is higher than the second doping concentration.

3. The integrated circuit device according to claim 2,
wherein the two doped semiconductor layers comprised in the peripheral circuit gate structure further comprise a second gate semiconductor layer having a doping concentration that is equal to the third doping concentration.

4. The integrated circuit device according to claim 1,
wherein the direct contact comprises a contact semiconductor layer having a doping concentration that is lower than a doping concentration of each of the two doped semiconductor layers comprised in the peripheral circuit gate structure.

5. The integrated circuit device according to claim 1,
wherein the direct contact comprises a contact semiconductor layer comprising a doped semiconductor layer doped with a charge carrier impurity, and
wherein the contact semiconductor layer has a doping concentration that is equal to a doping concentration of one of the two doped semiconductor layers comprised in the peripheral circuit gate structure.

6. The integrated circuit device according to claim 1, further comprising:
a direct contact spacer covering sidewalls of the direct contact,
wherein each of the direct contact and the direct contact spacer comprises a semiconductor layer.

7. The integrated circuit device according to claim 6,
wherein the direct contact spacer comprises undoped polysilicon having no charge carrier impurity doped thereon, and
wherein the direct contact comprises doped polysilicon having a charge carrier impurity doped thereon and having a doping concentration that is lower than a doping concentration of each of the two doped semiconductor layers comprised in the peripheral circuit gate structure.

8. The integrated circuit device according to claim 6,
wherein the bit line structure extends along the substrate in a first direction, and
wherein the direct contact spacer covers both sidewalls of the direct contact on opposite sides to each other in the first direction and does not cover both sidewalls of the direct contact on opposite sides to each other in a second direction that is orthogonal to the first direction.

9. The integrated circuit device according to claim 6,
wherein each of the direct contact and the direct contact spacer comprises a portion buried in the substrate.

10. The integrated circuit device according to claim 1, further comprising:
a buffer insulating film between the substrate and the bit line structure in the cell array area, the buffer insulating film having a hole penetrated by the direct contact; and
a direct contact spacer in the hole, the direct contact spacer being between the direct contact and the buffer insulating film,
wherein the direct contact spacer comprises undoped polysilicon having no charge carrier impurity doped thereon, and
the direct contact comprises doped polysilicon having a charge carrier impurity doped thereon.

11. The integrated circuit device according to claim 10, further comprising:
a semiconductor oxide film between the buffer insulating film and the bit line structure in the cell array area,
wherein the semiconductor oxide film comprises a dopant comprising B, In, P, As, Sb, or combinations thereof.

12. An integrated circuit device comprising:
a substrate having a cell array area and a peripheral circuit area, the cell array area comprising a plurality of first active regions spaced apart from each other, and the peripheral circuit area comprising a second active region;
a plurality of direct contacts each connected to a corresponding one of the plurality of first active regions in the cell array area;
a plurality of bit line structures extending parallel to each other in a first direction in the cell array area, each of the plurality of bit line structures is connected to a corresponding one of the plurality of direct contacts; and
a peripheral circuit gate structure on the second active region in the peripheral circuit area,
wherein the peripheral circuit gate structure comprises two doped semiconductor layers each doped with a charge carrier impurity and having different doping concentrations from each other, and
wherein each of the plurality of direct contacts comprises a contact semiconductor layer having a doping concentration that is lower than a doping concentration of at least one of the two doped semiconductor layers.

13. The integrated circuit device according to claim 12, wherein the peripheral circuit gate structure comprises a first gate semiconductor layer having a first doping concentration, and a second gate semiconductor layer having a second doping concentration and spaced apart from the substrate with the first gate semiconductor layer therebetween, and
wherein the contact semiconductor layer has a doping concentration that is lower than the first doping concentration and lower than the second doping concentration.

14. The integrated circuit device according to claim 12, wherein the peripheral circuit gate structure comprises a first gate semiconductor layer having a first doping concentration, and a second gate semiconductor layer having a second doping concentration and spaced apart from the substrate with the first gate semiconductor layer therebetween, and
wherein the contact semiconductor layer has a doping concentration that is equal to the first doping concentration.

15. The integrated circuit device according to claim 12, further comprising:
a plurality of buried contacts between the plurality of bit line structures;
a plurality of direct contact spacers each contacting corresponding first sidewall portions of sidewalls of each of the plurality of direct contacts, each of the first sidewall portions being in a region between corresponding one of the plurality of bit line structures and the substrate; and
a plurality of insulating spacers each arranged between corresponding one of the plurality of buried contacts and the plurality of direct contacts and each contacting corresponding second sidewall portion of the sidewalls of each of the plurality of direct contacts, each of the second sidewall portion facing the plurality of buried contacts.

16. The integrated circuit device according to claim 12, further comprising:
a buffer insulating film and a semiconductor oxide film, which are between the substrate and the plurality of bit line structures in the cell array area and stacked on the substrate in this stated order;
a plurality of direct contact spacers penetrating the buffer insulating film and the semiconductor oxide film and contacting first sidewall portions of the plurality of direct contacts in the substrate; and
a plurality of insulating spacers penetrating the buffer insulating film and the semiconductor oxide film and contacting second sidewall portions of the plurality of direct contacts in the substrate.

17. The integrated circuit device according to claim 12, further comprising:
a device isolation film in an interface area between the cell array area and the peripheral circuit area in the substrate;
a buffer insulating film extending, on the substrate, from the cell array area to the interface area, the buffer insulating film covering a top surface of the device isolation film to define an undercut region over the top surface of the device isolation film in the interface area; and
a filling insulating pattern filling the undercut region,
wherein each of the buffer insulating film and the filling insulating pattern comprises an oxide film.

18. An integrated circuit device comprising:
a substrate having a cell array area and a peripheral circuit area, the cell array area comprising a first active region, and the peripheral circuit area comprising a second active region;
a direct contact connected to the first active region in the cell array area and comprising a doped contact semiconductor layer doped with a charge carrier impurity that has a first doping concentration;
a bit line structure over the substrate in the cell array area, the bit line structure comprising a bit line semiconductor layer that contacts a top surface of the direct contact and has a doping concentration higher than the first doping concentration;
a direct contact spacer contacting a first sidewall portion of a sidewall of the direct contact and comprising an undoped semiconductor having no charge carrier impurity doped thereon, the first sidewall portion being between the substrate and the bit line structure;
an insulating spacer contacting a second sidewall portion of the sidewall of the direct contact and covering a sidewall of the bit line structure; and
a peripheral circuit gate structure on the second active region in the peripheral circuit area, wherein the peripheral circuit gate structure comprises a first gate semiconductor layer and a second gate semiconductor layer, the first gate semiconductor layer having a doping concentration that is equal to or higher than the first doping concentration, and the second gate semiconductor layer having a doping concentration that is higher than the first doping concentration.

19. The integrated circuit device according to claim 18, wherein the doping concentration of the first gate semiconductor layer is higher than the first doping concentration, and wherein the bit line semiconductor layer and the second gate semiconductor layer have an equal doping concentration.

20. The integrated circuit device according to claim 18,
wherein the doping concentration of the first gate semiconductor layer is equal to the first doping concentration, and
wherein the bit line semiconductor layer and the second gate semiconductor layer have an equal doping concentration.

* * * * *